(12) United States Patent
Niu et al.

(10) Patent No.: US 11,578,088 B2
(45) Date of Patent: Feb. 14, 2023

(54) ORGANIC COMPOUND, AN ELECTRON TRANSPORT MATERIAL AND AN APPLICATION THEREOF

(71) Applicant: Xiamen Tianma Micro-Electronics Co., Ltd., Xiamen (CN)

(72) Inventors: Jinghua Niu, Shanghai (CN); Mingzhi Dai, Shanghai (CN); Wei Gao, Shanghai (CN); Xia Li, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 335 days.

(21) Appl. No.: 15/930,447

(22) Filed: May 13, 2020

(65) Prior Publication Data
US 2020/0270280 A1 Aug. 27, 2020

(30) Foreign Application Priority Data
Dec. 27, 2019 (CN) .......................... 201911380047.4

(51) Int. Cl.
*H01L 51/50* (2006.01)
*C07F 7/08* (2006.01)
*H01L 51/00* (2006.01)

(52) U.S. Cl.
CPC ........ *C07F 7/0812* (2013.01); *H01L 51/0067* (2013.01); *H01L 51/0072* (2013.01); *H01L 51/0094* (2013.01); *H01L 51/508* (2013.01)

(58) Field of Classification Search
None
See application file for complete search history.

(56) References Cited

FOREIGN PATENT DOCUMENTS

| | | | | |
|---|---|---|---|---|
| CN | 105924438 | * | 9/2016 | ............. H01L 51/54 |
| CN | 105924438 A | | 9/2016 | |
| JP | 4048792 B2 | | 2/2008 | |
| KR | 20110114230 A | | 10/2011 | |

* cited by examiner

*Primary Examiner* — Gregory D Clark
(74) *Attorney, Agent, or Firm* — Kilpatrick Townsend & Stockton, LLP

(57) ABSTRACT

The present disclosure provides an organic compound, an electron transport material, and an application thereof. The organic compound has a structure as shown in Formula I. Design of molecular structure and substituents enables it to undergo tridentate coordination or tetradentate coordination with metal, and more stably and firmly combination with metal, so that it has stronger stability and longer working life when used as an electron transport material, which effectively solves a problem of rising drift voltage. The organic compound has greater rigid distortion, which can suppress an increase of intermolecular attraction and prevent it from forming a planar structure to cause excessive intermolecular attraction. The organic compound is used as an electron transport material, and can be applied to an electron transport layer and/or an electron injection layer of an OLED device, which can effectively improve luminous efficiency and working life of the device, and reduce turn-on voltage.

17 Claims, 1 Drawing Sheet

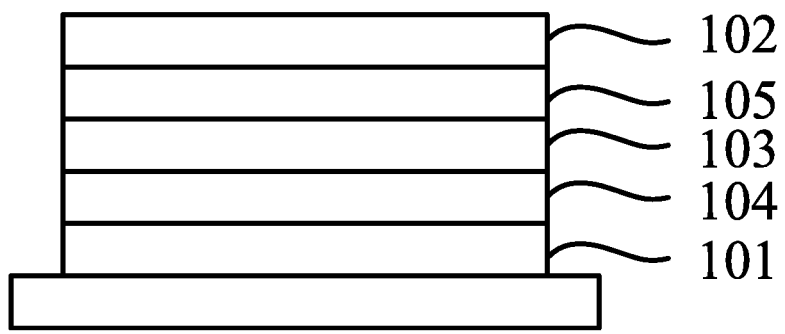

ORGANIC COMPOUND, AN ELECTRON TRANSPORT MATERIAL AND AN APPLICATION THEREOF

CROSS-REFERENCE TO RELATED APPLICATIONS

The application claims the benefit of the earlier filing date of Chinese Patent Application No. 201911380047.4, filed on Dec. 27, 2019 to the China National Intellectual Property Administration, the contents of which are incorporated by reference herein in its entirety.

FIELD

The present disclosure belongs to the field of organic electroluminescent materials, and in particular relates to an organic compound, an electron transport material and an application thereof.

BACKGROUND

Organic electroluminescence technology is an emerging technology in the field of optoelectronics. Organic Light Emitting Diodes (OLEDs) have advantages of self-luminous, wide viewing angles, ultra-thin, fast response, high luminous efficiency, good temperature adaptability, simple production process, low driving voltage, and low energy consumption, compared to traditional inorganic electroluminescent devices, and it has been widely used in industries such as flat panel display, flexible display, solid-state lighting and on-board display. At present, OLEDs have entered industrialization stage. A growing demand for display has driven rapid development of OLED devices and organic optoelectronic materials. Specific manifestation is that compounds and materials with new structures, functional groups and substituents are constantly emerging. At the same time, structure of OLED devices has also been continuously optimized, and has gradually developed from an initial sandwich structure to a complex structure composed of multiple functional layers. Taking a classic organic electroluminescent device as an example, the laminated structure thereof includes a cathode, an anode, and an organic film layer between the cathode and the anode. The organic film layer includes a light emitting layer, an electron transport layer, a hole transport layer, a hole injection layer and an electron injection layer.

Electron transport materials commonly used in electron transport layers of OLEDs have the following characteristics: good film-forming properties, higher electron affinity energy to facilitate electron injection, higher electron mobility to facilitate electron transport, and good thermal stability Most of the electron transport materials are aromatic compounds and organometallic complexes with conjugate planes. They have a good ability to accept electrons, meanwhile, can effectively transfer electrons.

The earliest electron transport material used in OLED devices is 8-hydroxyquinoline aluminum ($Alq_3$), which is a bidentate coordinated chelate with a stable five-membered ring structure. Its thin films can be prepared by vacuum evaporation. Electron mobility of $Alq_3$ is relatively low, which is about $10^{-6}$ $cm^2/Vs$, resulting in unbalanced electron transport and hole transport of the device. With development of OLED devices towards producibility and practicability, $Alq_3$ has been unable to meet performance requirements of electroluminescent device.

Therefore, it is a research focus in this field to develop more kinds of electron transport materials.

SUMMARY

In order to develop more kinds of electron transport materials with higher performance and more stably combining with metals, a first aspect of the present disclosure is to provide an organic compound, which has a structure as shown in Formula I:

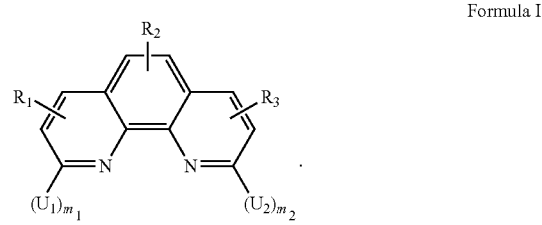

Formula I

In Formula I, $m_1$ and $m_2$ are each independently 0 or 1, and $m_1+m_2 \geq 1$, i.e., $m_1$ and $m_2$ cannot be 0 at the same time.

In Formula I, $U_1$ and $U_2$ are each independently selected from any one of the following groups:

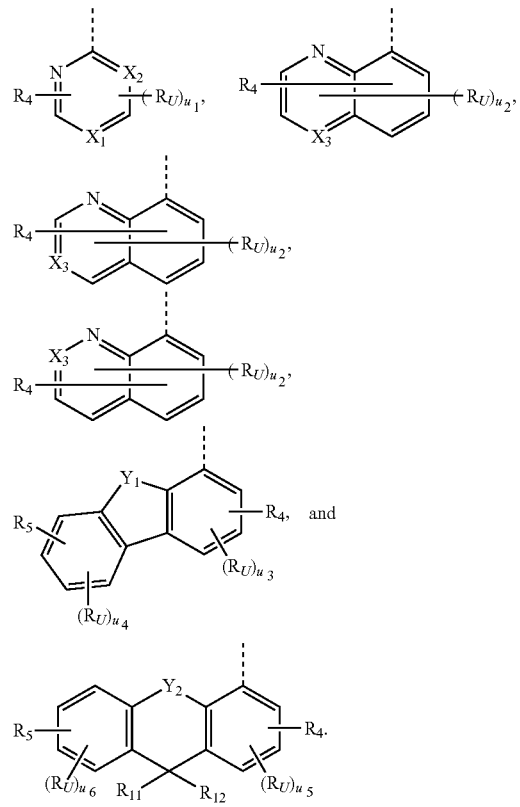

$X_1$, $X_2$ and $X_3$ are each independently selected from N or C—H.

$Y_1$ and $Y_2$ are each independently selected from O, S or N—$R_N$.

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted adamantyl, a substituted or unsubstituted C6-C40 aryl, and a substituted or unsubstituted C3-C40 heteroaryl.

When $U_1$ and $U_2$ are selected from

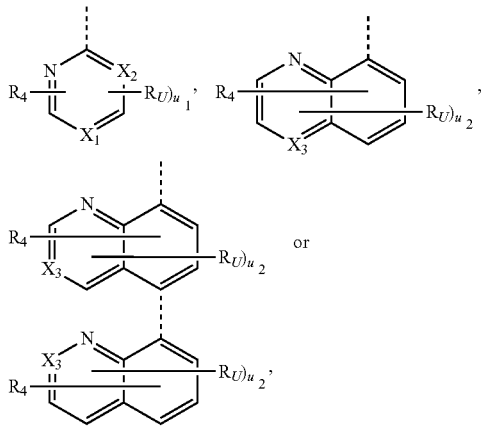

at least one of $R_1$, $R_2$, $R_3$ and $R_4$ is a silicon-containing substituent.

When any one of $U_1$ and $U_2$ is

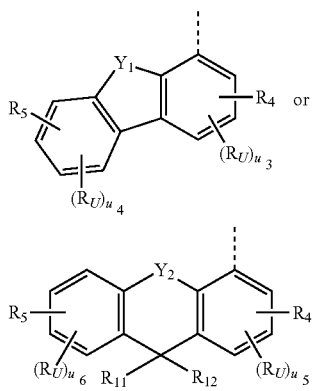

at least one of $R_1$, $R_2$, $R_3$, $R_4$, and $R_5$ is a silicon-containing substituent.

$R_U$ and $R_N$ are each independently selected from any one of hydrogen, deuterium, tritium, a C1-C30 straight or branched alkyl, a C1-C30 alkoxyl, a substituted or unsubstituted C6-C40 aryl, a substituted or unsubstituted C3-C40 heteroaryl.

$R_{11}$ and $R_{12}$ are each independently selected from any one of hydrogen, deuterium, tritium, a C1-C30 straight or branched alkyl, a C1-C30 alkoxyl, a substituted or unsubstituted C6-C40 aryl, and a substituted or unsubstituted C3-C40 heteroaryl.

$u_1$, $u_4$ and $u_6$ are each independently selected from an integer of 0-4, for example 0, 1, 2, 3 or 4.

$u_2$ is selected from an integer of 0-6, for example 0, 1, 2, 3, 4, 5 or 6.

$u_3$ and $u_5$ are each independently selected from an integer of 0-3, for example 0, 1, 2, or 3.

In the above groups, the dotted line represents linking position of a group.

The C1-C30 can be C2, C4, C5, C6, C8, C10, C13, C15, C18, C20, C23, C25, C27 or C29.

The C6-C40 can be C7, C8, C10, C13, C15, C18, C20, C23, C25, C28, C30, C33, C35, C37 or C39.

The C3-C40 can be C4, C5, C6, C8, C10, C13, C15, C18, C20, C23, C25, C28, C30, C33, C35, C37 or C39.

A second aspect of the present disclosure is to provide an electron transport material comprising the organic compound according to the first aspect.

A third aspect of the present disclosure is to provide a display panel, and the display panel comprises an OLED device, the OLED device comprises an anode, a cathode, and an organic thin film layer between the anode and the cathode, and the organic thin film layer comprises an electron transport layer.

The material of the electron transport layer includes the electron transport material according to the second aspect.

A fourth aspect of the present disclosure is to provide a display device comprising the display panel according to the third aspect.

Compared with the related technics, the present disclosure achieves the following beneficial effects:

The organic compound provided by the present disclosure has a skeletal structure of o-phenanthroline. Design of molecular structure and substituents of the present disclosure enables it to undergo tridentate coordination or tetradentate coordination with a metal, realizing more stable and firm combination between the organic compound and the metal, so that it has stronger stability and longer working life when used as an electron transport material, which effectively solves the problem of rising drift voltage. The organic compound will not absorb wavelengths in visible light range, and its o-phenanthroline skeletal structure coordinates with a large sterically hindered substituent mutually, which gives the organic compound a large rigid distortion, suppressing an increase of intermolecular attraction and being able to prevent it from forming a planar structure to cause excessive intermolecular attraction. Since the organic compound provided by the present disclosure has a LUMO value of 1.4-2.0 eV, it is suitable to be used as common layer material for electron transport, which is used as an electron transport layer and/or an electron injection layer of an OLED device, and can effectively improve luminous efficiency and working life of the device, and reduce turn-on voltage.

DESCRIPTION OF DRAWINGS

FIG. 1 is a schematic structural diagram of an OLED device provided by the present disclosure, and 101 is an anode, 102 is a cathode, 103 is a light emitting layer, 104 is a first organic thin film layer, and 105 is a second organic thin film layer.

DETAILED DESCRIPTION

The technical solutions of the present disclosure will be further described below by way of specific embodiments. The embodiments are merely illustrations of the present disclosure and should not be construed as specific limitations to the present disclosure.

One aspect of the present disclosure is to provide a compound having a structure as shown in Formula I:

Formula I

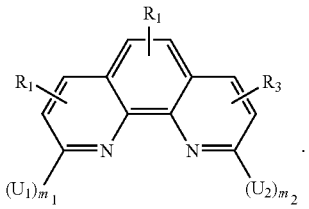

In Formula I, $m_1$ and $m_2$ are each independently 0 or 1, and $m_1+m_2 \geq 1$, i.e., $m_1$ and $m_2$ cannot be 0 at the same time.

In Formula I, $U_1$ and $U_2$ are each independently selected from any one of the following groups:

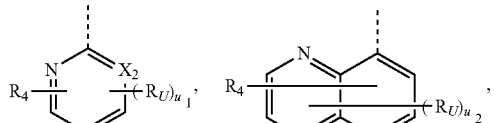

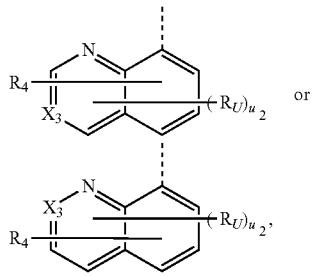

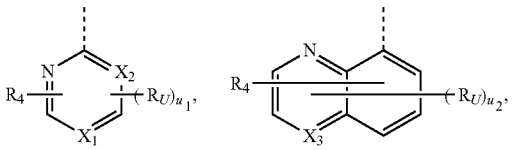

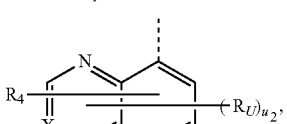

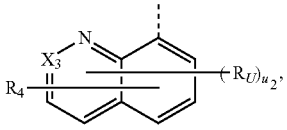, and

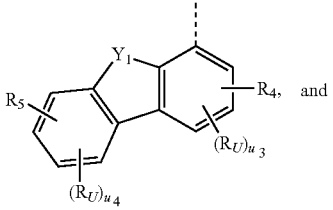

$X_1$, $X_2$ and $X_3$ are each independently selected from N or C—H.

$Y_1$ and $Y_2$ are each independently selected from O, S or N—$R_N$.

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted adamantyl, a substituted or unsubstituted C6-C40 aryl, and a substituted or unsubstituted C3-C40 heteroaryl.

When $U_1$ and $U_2$ are selected from

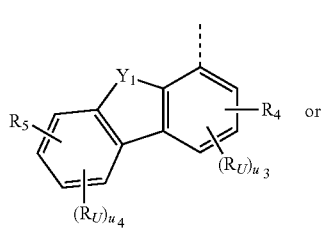

at least one of $R_1$, $R_2$, $R_3$ and $R_4$ is a silicon-containing substituent.

When any one of $U_1$ and $U_2$ is

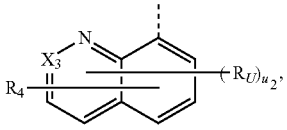 or

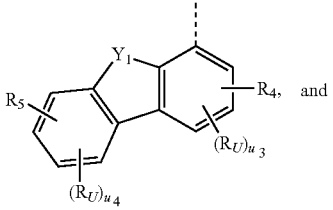

at least one of $R_1$, $R_2$, $R_3$, $R_4$, and $R_5$ is a silicon-containing substituent.

$R_U$ and $R_N$ are each independently selected from any one of hydrogen, deuterium, tritium, a C1-C30 straight or branched alkyl, a C1-C30 alkoxyl, a substituted or unsubstituted C6-C40 aryl, and a substituted or unsubstituted C3-C40 heteroaryl.

$R_{11}$ and $R_{12}$ are each independently selected from any one of hydrogen, deuterium, tritium, a C1-C30 straight or branched alkyl, a C1-C30 alkoxyl, a substituted or unsubstituted C6-C40 aryl, and a substituted or unsubstituted C3-C40 heteroaryl.

$u_1$, $u_4$ and $u_6$ are each independently selected from an integer of 0-4, for example 0, 1, 2, 3 or 4.

$u_2$ is selected from an integer of 0-6, for example 0, 1, 2, 3, 4, 5 or 6.

$u_3$ and $u_5$ are each independently selected from an integer of 0-3, for example 0, 1, 2, or 3.

In the above groups, the dotted line represents linking position of a group.

The C1-C30 can be C2, C4, C5, C6, C8, C10, C13, C15, C18, C20, C23, C25, C27 or C29.

The C6-C40 can be C7, C8, C10, C13, C15, C18, C20, C23, C25, C28, C30, C33, C35, C37 or C39.

The C3-C40 can be C4, C5, C6, C8, C10, C13, C15, C18, C20, C23, C25, C28, C30, C33, C35, C37 or C39.

The organic compound provided by the present disclosure has a o-phenanthroline skeletal structure, and the skeletal structure includes at least one substituent ($U_1$ and/or $U_2$) containing non-shared electron pairs. When $m_1+m_2=1$, the organic compound contains three non-shared electron pairs, which can be combined with a metal through coordination bonds to form a stable tridentate coordination structure; and when $m_1+m_2=2$, the organic compound contains four non-shared electron pairs, which can be combined with a metal through coordination bonds to form a stable tetradentate coordination structure. The organic compound provided by the present disclosure effectively improves firmness and bonding stability of combination with a metal by forming a tridentate or tetradentate coordination structure with the metal, which can suppress metal movement caused by heat and electric field generated during device driving process and avoids electron injection and movement characteristics caused by changes in arrangement of an electron transport layer in early stage of driving, and finally improves working life of a OLED device.

In the organic compound provided by the present disclosure, the o-phenanthroline skeletal structure and a plurality of large sterically hindered substituents cooperate with each other, so that the organic compound has a large rigid distortion, and avoids increase in intermolecular attraction caused by excessive planar structure of a conventional phenanthroline compound. The organic compound has a suitable spatial structure and molecular weight, and its molecular weight is in the range of 600-1200 g/mol, which is helpful for controlling evaporation rate and can suppress accumulation caused by increase in intermolecular attraction.

In one embodiment, substituent in a substituted aryl and substituted heteroaryl is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

In one embodiment, $R_1$, $R_2$, $R_3$, $R_4$ and $R_5$ are each independently selected from any one of the group consisting of hydrogen, deuterium, tritium, a silicon-containing substituent, a substituted or unsubstituted C6-C20 (e.g., C7, C9, C10, C12, C14, C15, C17 or C19) aryl, and a substituted or unsubstituted C3-C20 (e.g., C4, C6, C8, C10, C12, C14, C16 or C18) heteroaryl.

When $U_1$ and $U_2$ are selected from

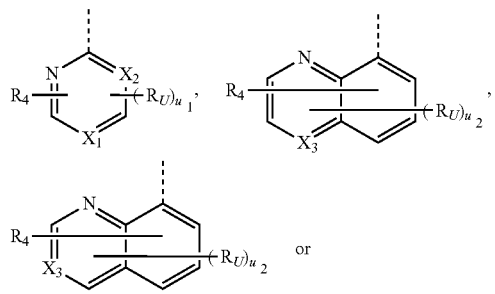

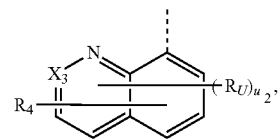

at least one of $R_1$, $R_2$, $R_3$ and $R_4$ is a silicon-containing substituent.

When any one of $U_1$ and $U_2$ is

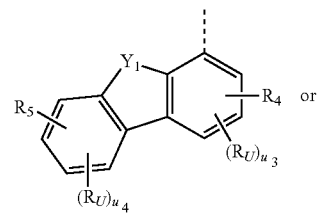

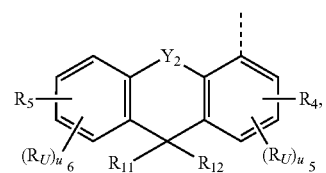

at least one of $R_1$, $R_2$, $R_3$, $R_4$, and $R_5$ is a silicon-containing substituent.

When a substituent is present in the above group, the substituent is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

In one embodiment, $U_1$ and $U_2$ are each independently selected from any one of the following groups:

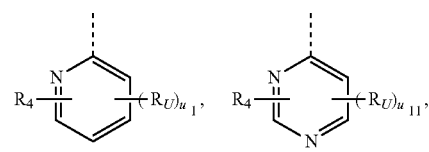

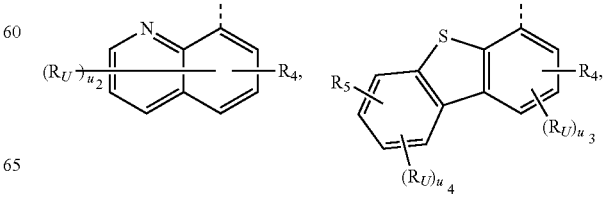

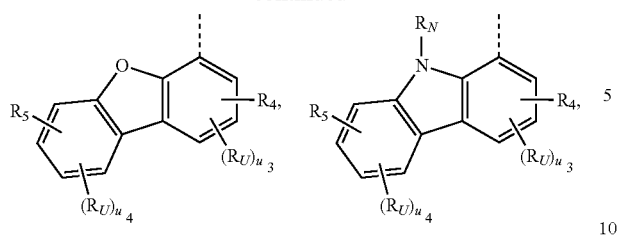

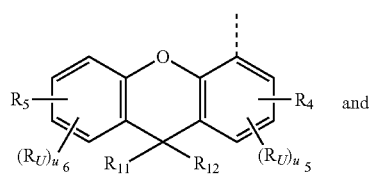 and

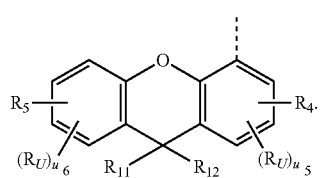

In one embodiment, each of $R_4$, $R_5$, $R_U$, $R_N$, $R_{11}$, $R_{12}$, $u_1$, $u_2$, $u_3$, $u_4$, $u_5$, and $u_6$ independently has the same limited range as that in Formula 1.

$u_{11}$ is an integer of 0-2, for example 0, 1 or 2.

The dotted line represents linking position of a group.

In one embodiment, $U_1$ and $U_2$ are each independently selected from any one of the following groups:

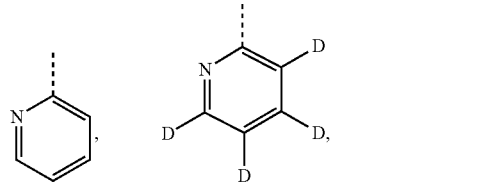

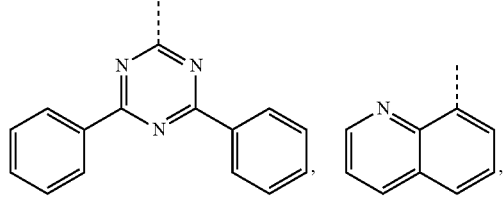

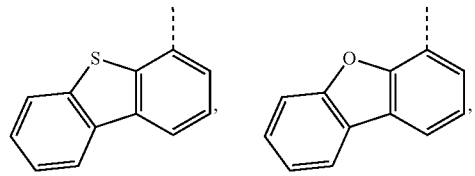

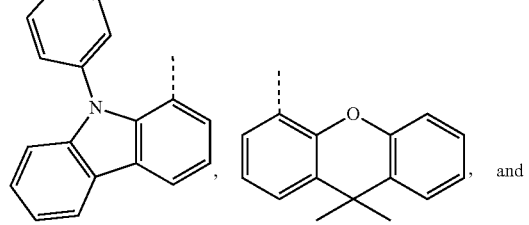
and

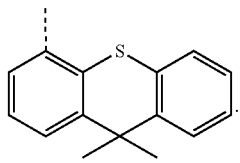

In one embodiment, the dotted line represents linking position of a group.

In one embodiment, the organic compound has a structure as shown in any one of Formula I-1 to Formula I-4:

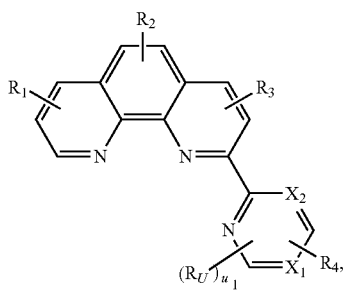

Formula I-1

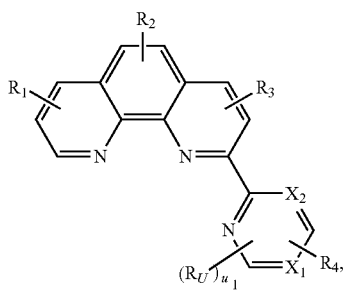

Formula I-2

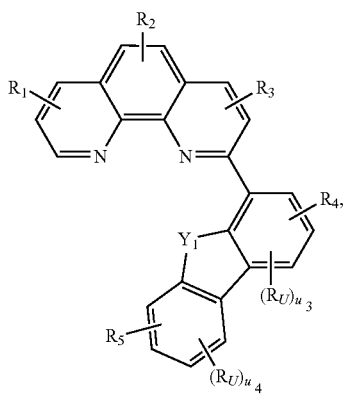

Formula I-3 and

-continued

Formula I-4

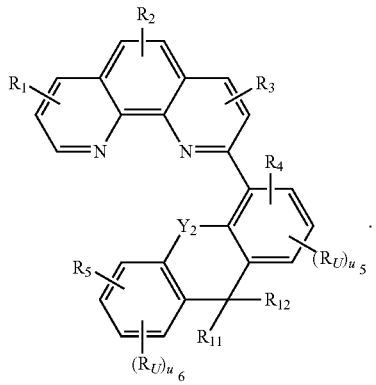

Formula I-5

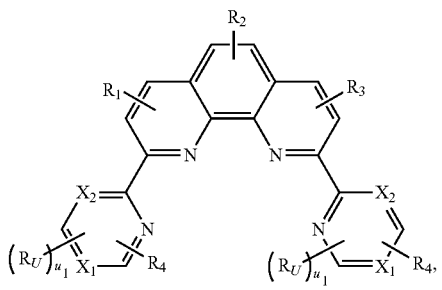

Formula I-6

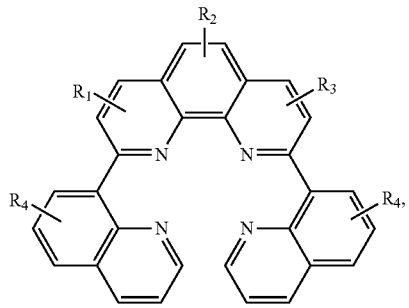

Formula I-7

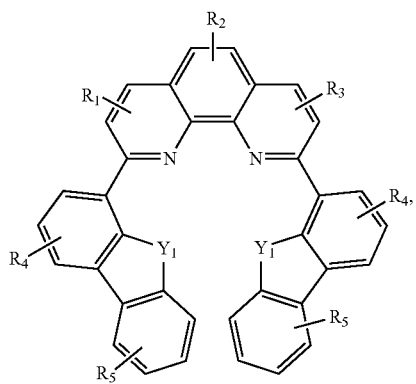

Formula I-8

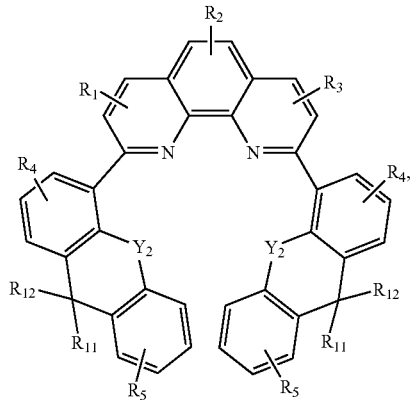

In one embodiment, each of $X_1$, $X_2$, $Y_1$, $Y_2$, $R_U$, $R_{11}$, $R_{12}$, $u_1$, $u_2$, $u_3$, $u_4$, $u_5$, and $u_6$ independently has the same limited range as that in Formula I.

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted C6-C40 aryl, and a substituted or unsubstituted C3-C40 heteroaryl.

The C1-C30 can be C2, C4, C5, C6, C8, C10, C13, C15, C18, C20, C23, C25, C27 or C29.

The C6-C40 can be C7, C8, C10, C13, C15, C18, C20, C23, C25, C28, C30, C33, C35, C37 or C39.

The C3-C40 can be C4, C5, C6, C8, C10, C13, C15, C18, C20, C23, C25, C28, C30, C33, C35, C37 or C39.

In Formula I-1 and Formula I-2, at least one of $R_1$, $R_2$, $R_3$, and $R_4$ is a silicon-containing substituent.

In Formula I-3 and Formula I-4, at least one of $R_1$, $R_2$, $R_3$, $R_4$, and $R_5$ is a silicon-containing substituent.

When a substituent is present in the above group, the substituent is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

When the organic compound according to the present disclosure has a structure as shown in any one of Formula I-1 to Formula I-4, the molecular structure contains three non-shared electron pairs, and when it is used as an electron transport material, it can form a stable structure of tridentate coordination with a metal.

In one embodiment, the organic compound has a structure as shown in any one of Formula I-5 to Formula I-11:

-continued

Formula I-9

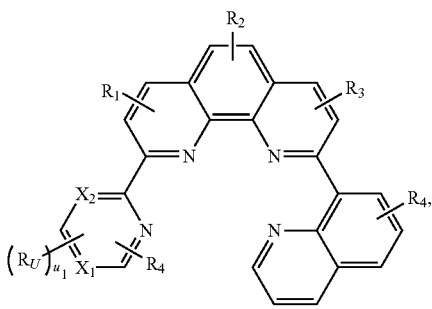

Formula I-10

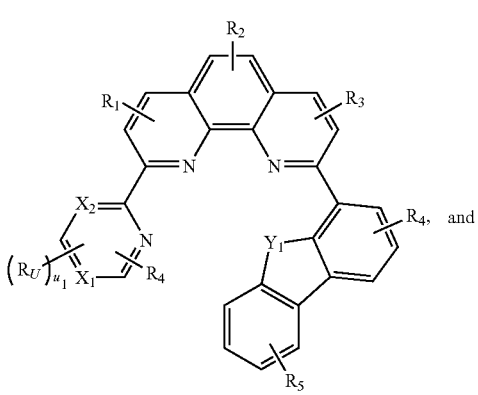

Formula I-11

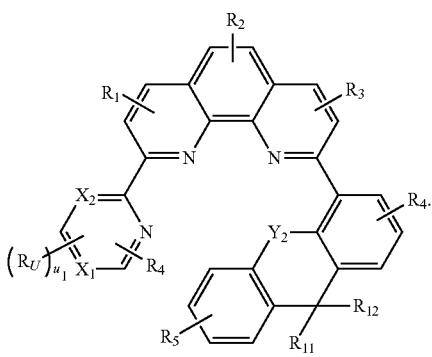

In one embodiment, each of $X_1$, $X_2$, $Y_1$, $Y_2$, $R_U$, $R_{11}$, $R_{12}$, and $u_1$ independently has the same limited range as that in Formula I.

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted C6-C40 aryl, and a substituted or unsubstituted C3-C40 heteroaryl.

The C1-C30 can be C2, C4, C5, C6, C8, C10, C13, C15, C18, C20, C23, C25, C27 or C29.

The C6-C40 can be C7, C8, C10, C13, C15, C18, C20, C23, C25, C28, C30, C33, C35, C37 or C39.

The C3-C40 can be C4, C5, C6, C8, C10, C13, C15, C18, C20, C23, C25, C28, C30, C33, C35, C37 or C39.

In Formula I-5, Formula I-6, and Formula I-9, at least one of $R_1$, $R_2$, $R_3$, and $R_4$ is a silicon-containing substituent.

In Formula I-7, Formula I-8, Formula I-10, and Formula I-11, at least one of $R_1$, $R_2$, $R_3$, $R_4$, and $R_5$ is a silicon-containing substituent.

When a substituent is present in the above group, the substituent is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

When the organic compound according to the present disclosure has a structure as shown in any one of Formula I-5 to Formula I-11, the molecular structure contains four non-shared electron pairs, and when it is used as an electron transport material, it can form a stable structure of tetradentate coordination with a metal.

In one embodiment, at least one of $R_1$, $R_2$, and $R_3$ is a silicon-containing substituent.

In one embodiment, at least one of $R_1$ and $R_3$ is a silicon-containing substituent.

In one embodiment, the silicon-containing substituent has a structure as shown in Formula II:

Formula II

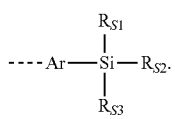

In Formula II, Ar is selected from a single bond, a substituted or unsubstituted C6-C30 arylene group.

In Formula II, $R_{S1}$, $R_{S2}$ and $R_{S3}$ are each independently selected from any one of a C1-C30 straight or branched alkyl, a C1-C30 alkoxyl, a substituted or unsubstituted C6-C40 aryl, and a substituted or unsubstituted C3-C40 heteroaryl.

The C6-C30 can be C7, C8, C10, C13, C15, C18, C20, C23, C25, C27 or C29.

The C1-C30 can be C2, C4, C5, C6, C8, C10, C13, C15, C18, C20, C23, C25, C27 or C29.

The C6-C40 can be C7, C8, C10, C13, C15, C18, C20, C23, C25, C28, C30, C33, C35, C37 or C39.

The C3-C40 can be C4, C5, C6, C8, C10, C13, C15, C18, C20, C23, C25, C28, C30, C33, C35, C37 or C39.

In Formula II, the dotted line represents linking position of a group.

When a substituent is present in the above group, the substituent is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

In one embodiment, Ar is selected from a single bond or a C6-C20 (for example, C7, C9, C10, C12, C14, C15, C17 or C19) arylene group.

In one embodiment, $R_{S1}$, $R_{S2}$ and $R_{S3}$ are each independently selected from any one of the group consisting of a substituted or unsubstituted C6-C40 (for example, C7, C8, C10, C13, C15, C18, C20, C23, C25, C28, C30, C33, C35, C37 or C39) aryl group, a substituted or unsubstituted C3-C40 (for example, C4, C5, C6, C8, C10, C13, C15, C18, C20, C23, C25, C28, C30, C33, C35, C37 or C39) heteroaryl group.

When a substituent is present in the above group, the substituent is selected from at least one of the group consisting of deuterium, tritium, C1-C10 (i.e., C2, C3, C4, C5, C6, C7, C8 or C9) straight or branched alkyl, adamantyl, C6-C20 (e.g., C7, C9, C10, C12, C14, C15, C17 or C19) aryl, C3-C20 (e.g., C4, C6, C8, C10, C12, C14, C16 or C18) heteroaryl, C1-C10 (e.g., C2, C3, C4, C5, C6, C7, C8 or C9) alkoxyl, C6-C20 (e.g., C7, C9, C10, C12, C14, C15, C17 or C19) arylamino, C3-C20 (e.g., C4, C6, C8, C10, C12, C14, C16 or C18) cycloalkyl, and halogen (e.g., fluorine, chlorine, bromine or iodine).

In one embodiment, the silicon-containing substituent is selected from any one of the following groups:

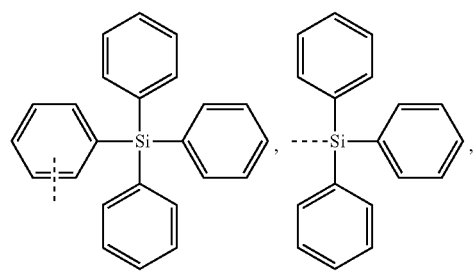

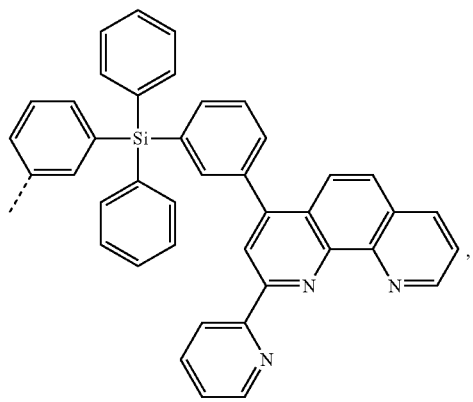

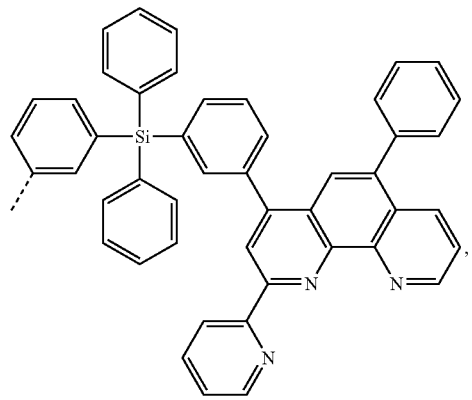

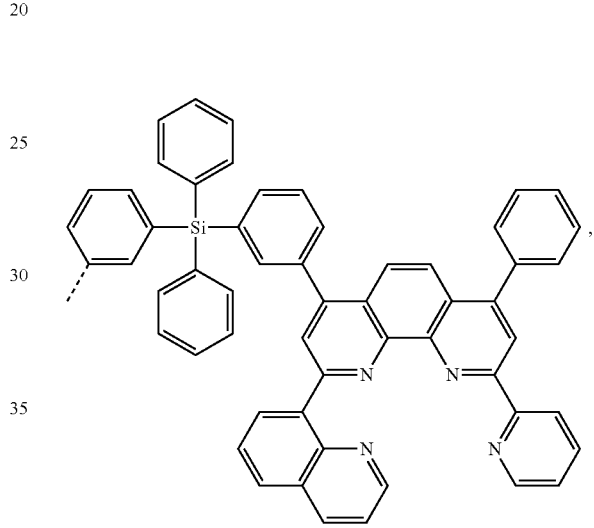

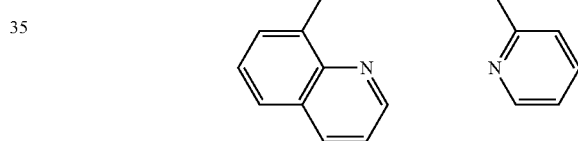

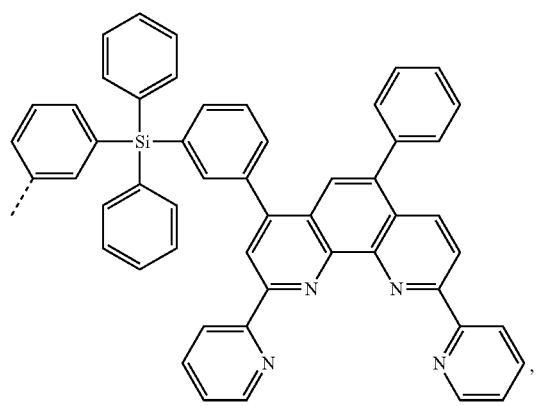

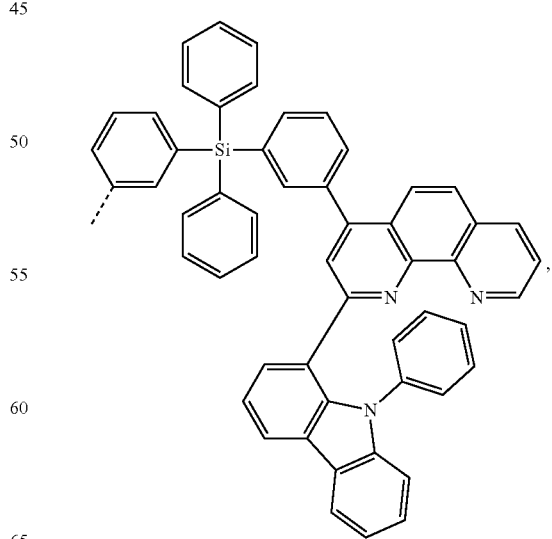

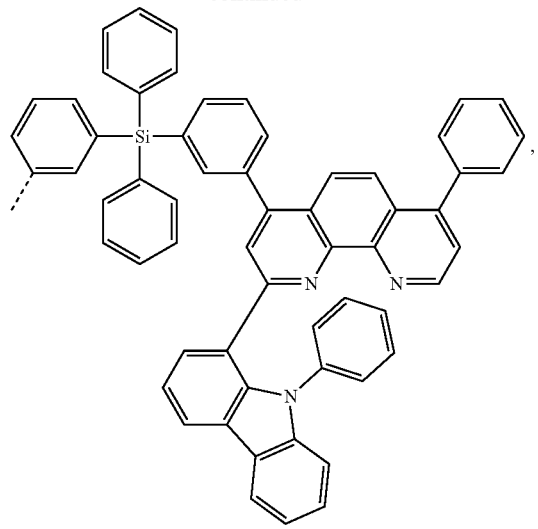
,
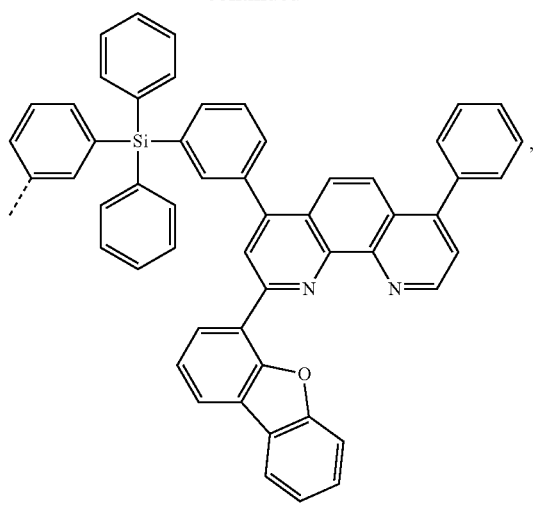
,
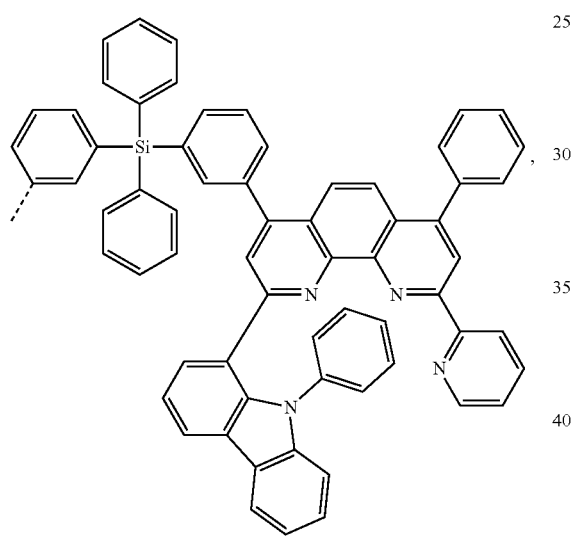
,
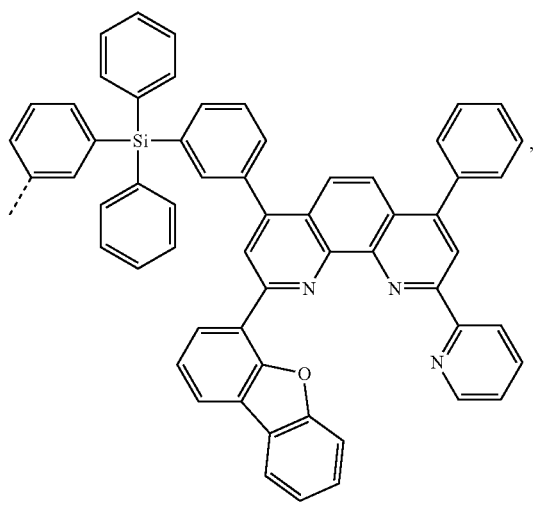
,
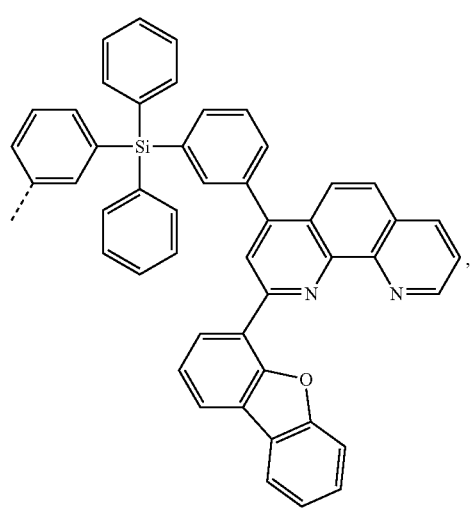
,
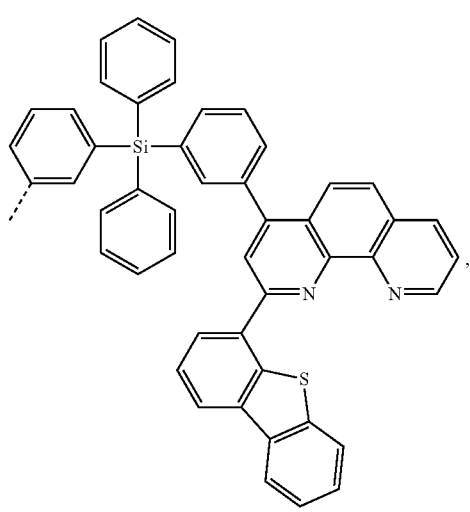
,

-continued
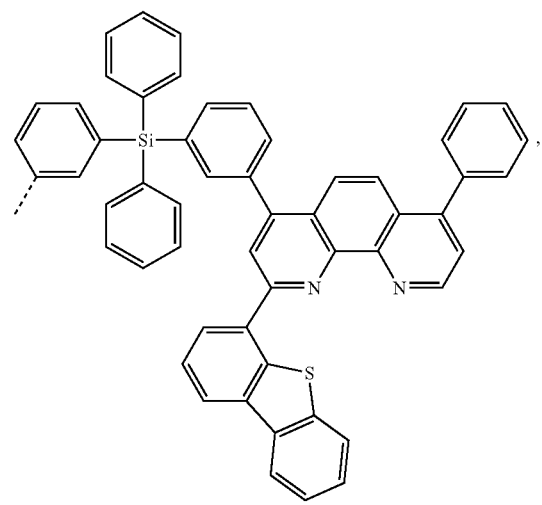
,
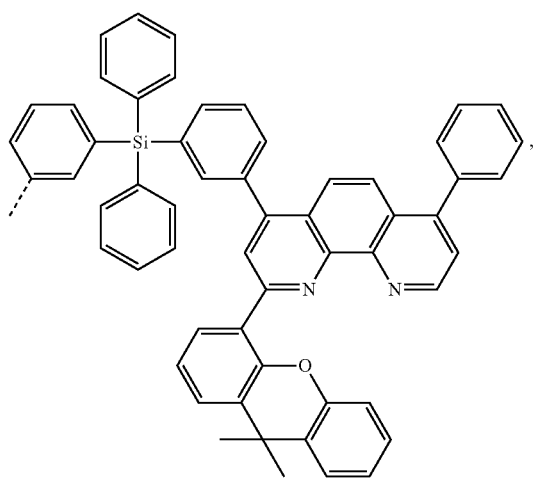
,
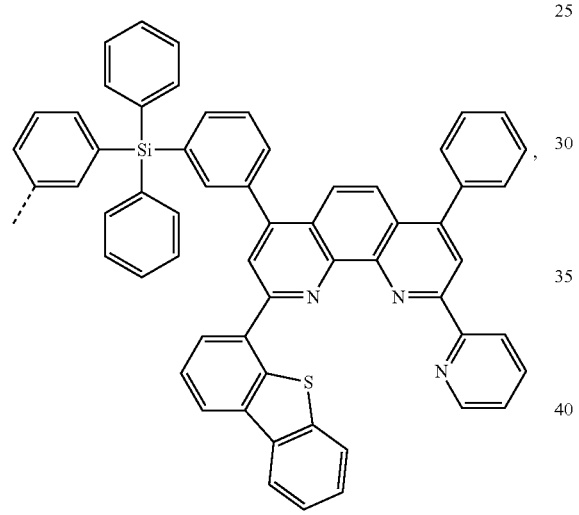
,
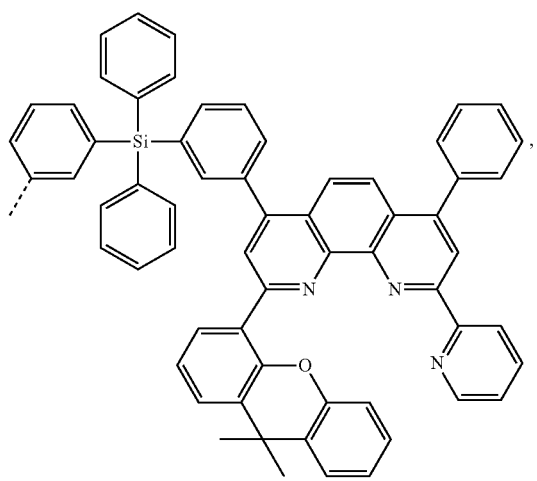
,
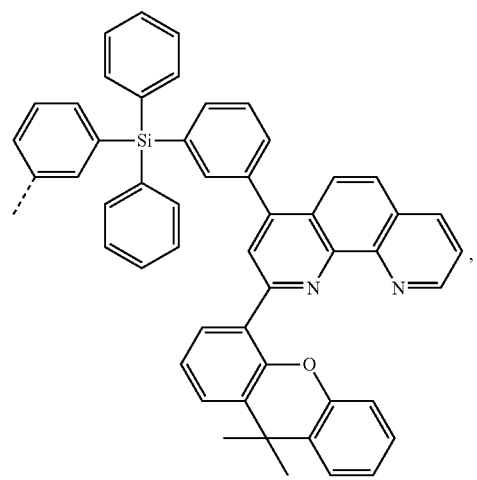
,
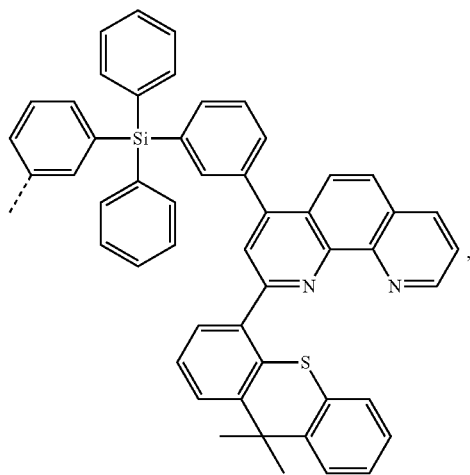
, -continued
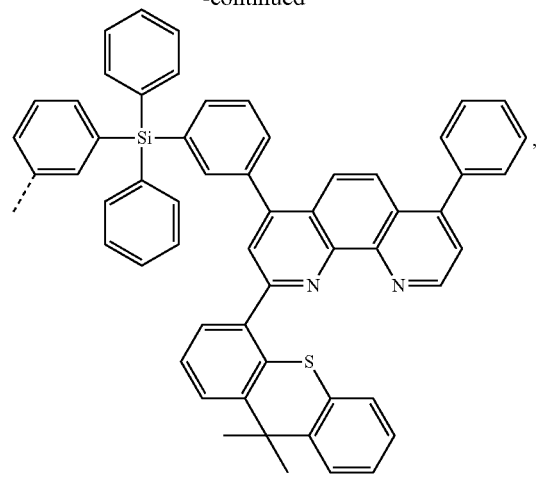
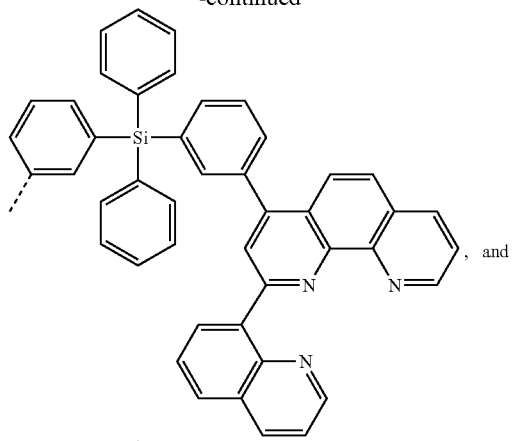, and
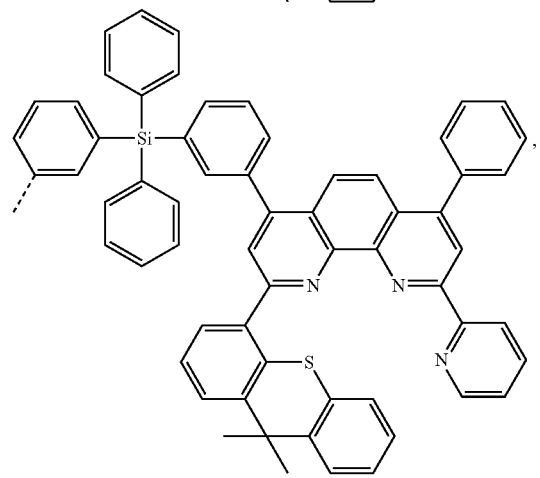
In one embodiment, the dotted line represents linking position of a group.
In one embodiment, the organic compound is selected from any one of the following compounds M1 to M41:
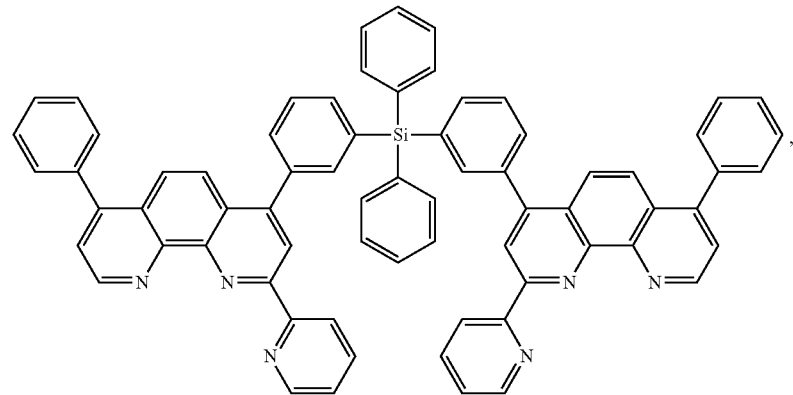
M1

-continued
M2
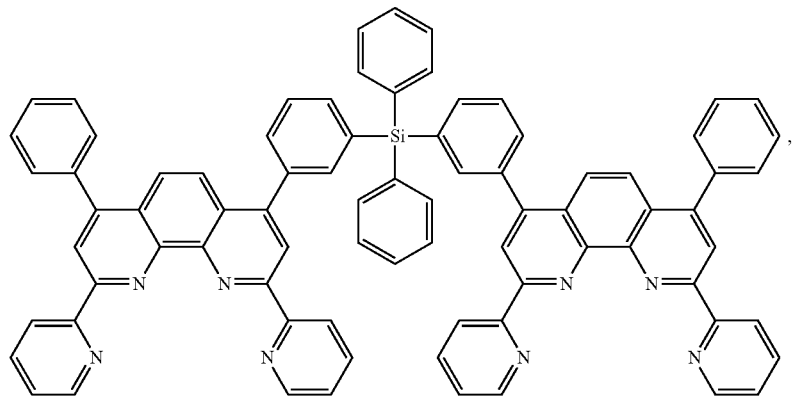
M3
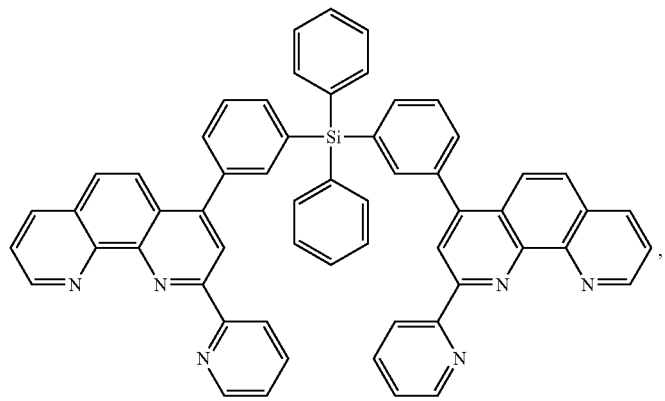
M4
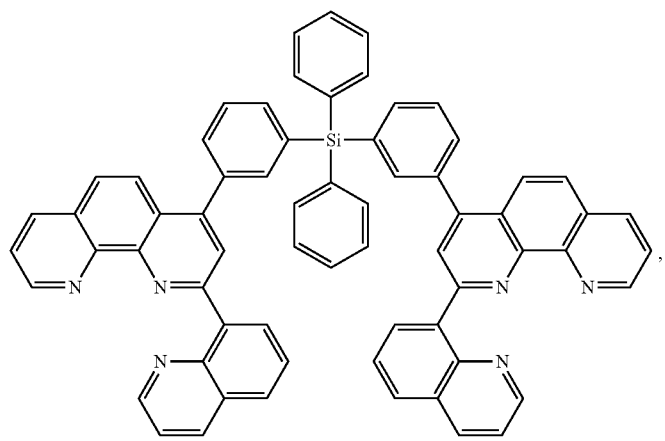
M5
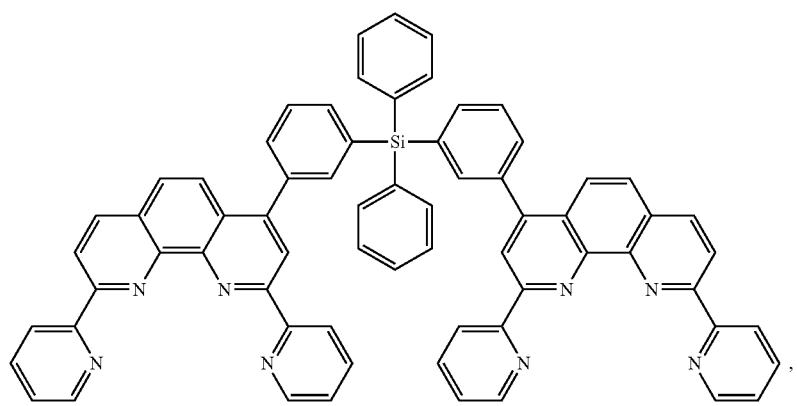

-continued
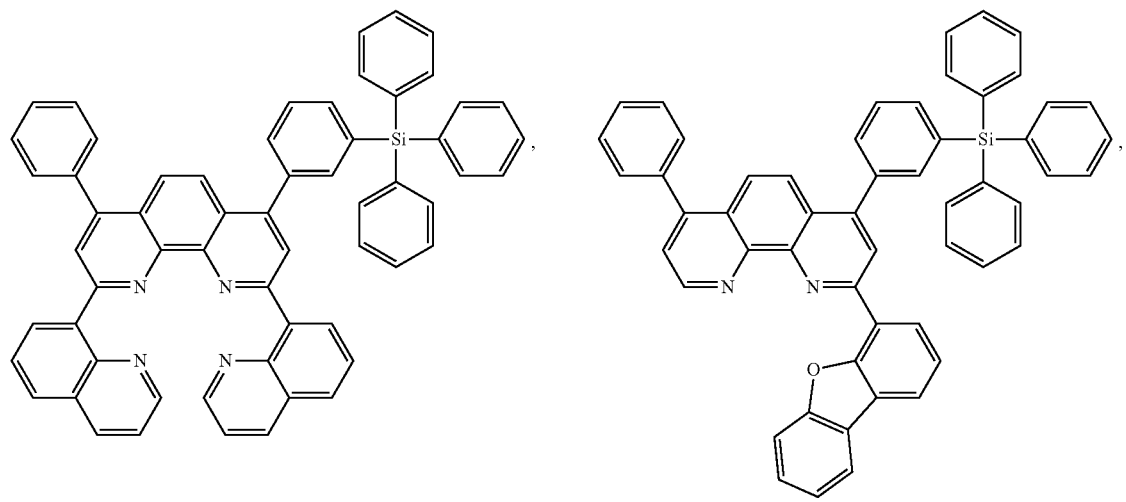
M6
M7
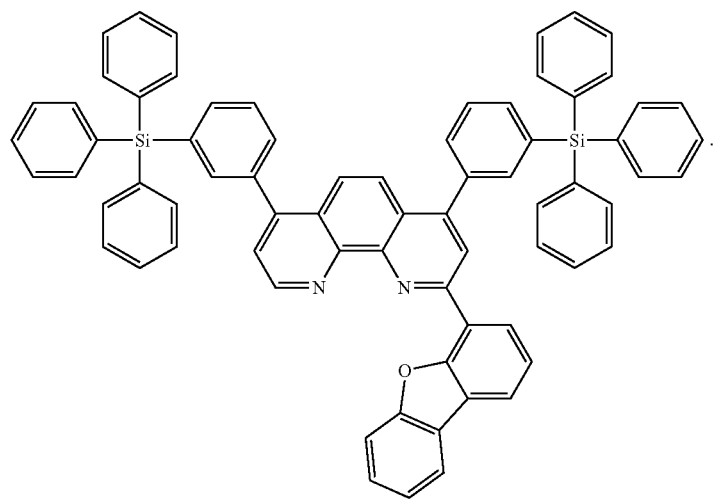
M8
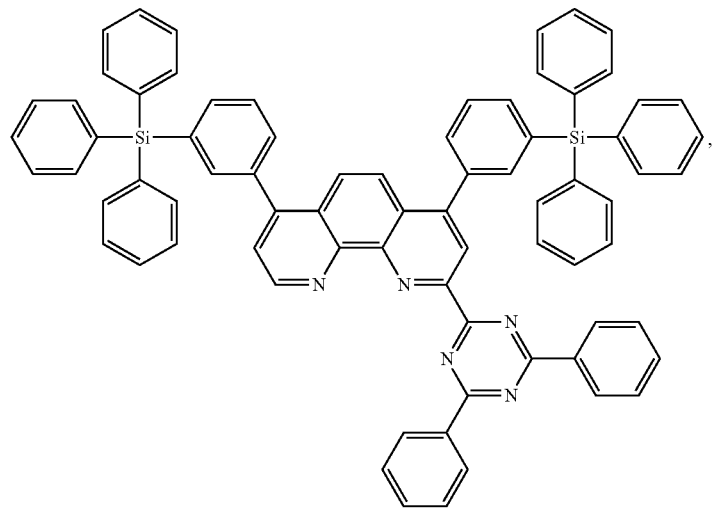
M9

-continued
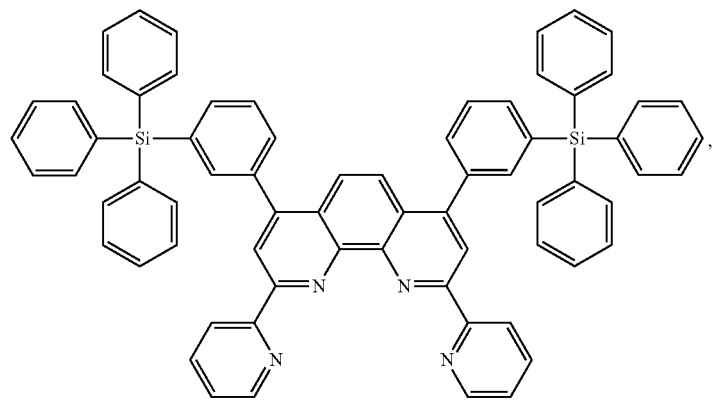
M10
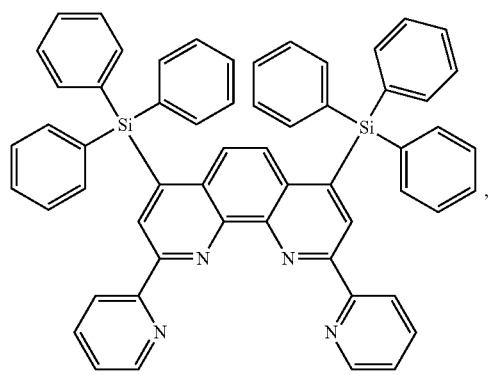
M11
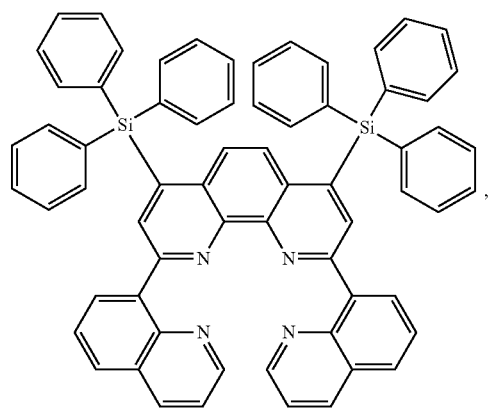
M12
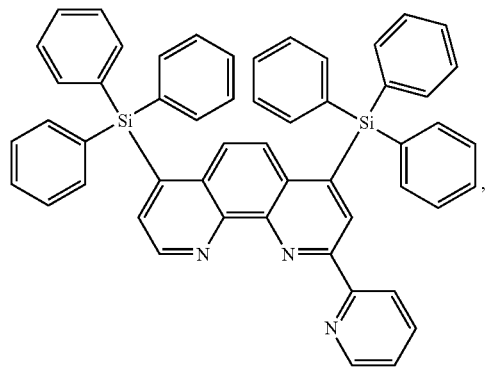
M13
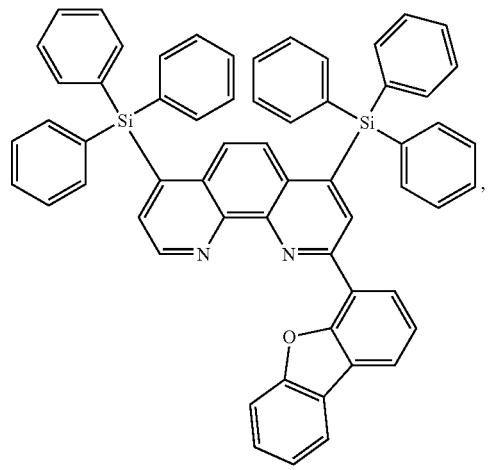
M14

-continued
M15
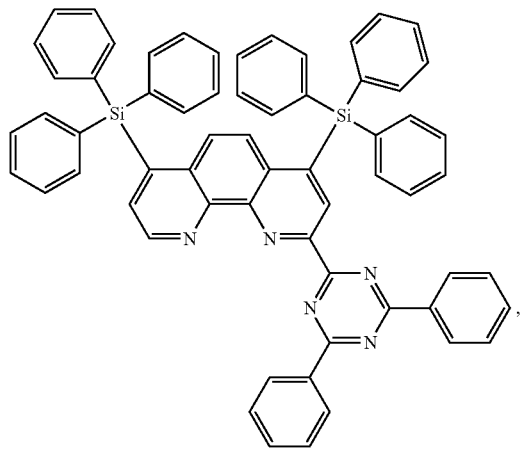
M16
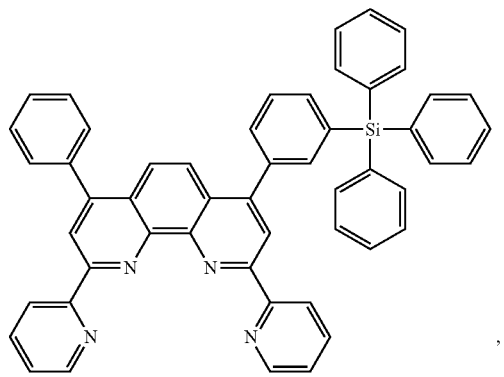
M17
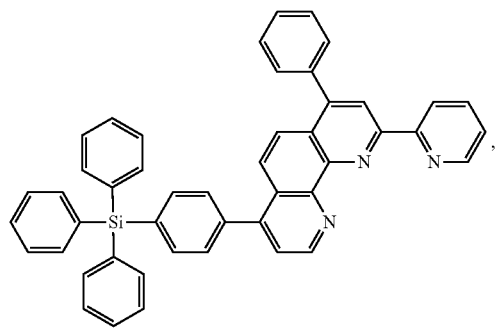
M18
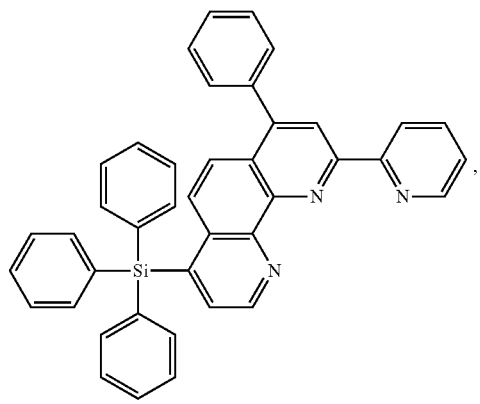
M19
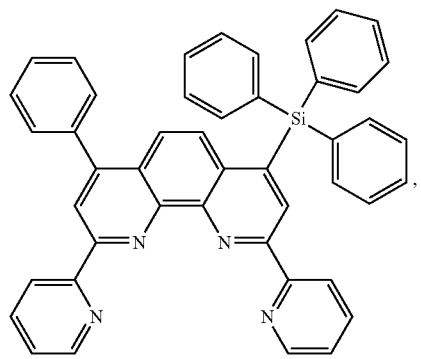

-continued
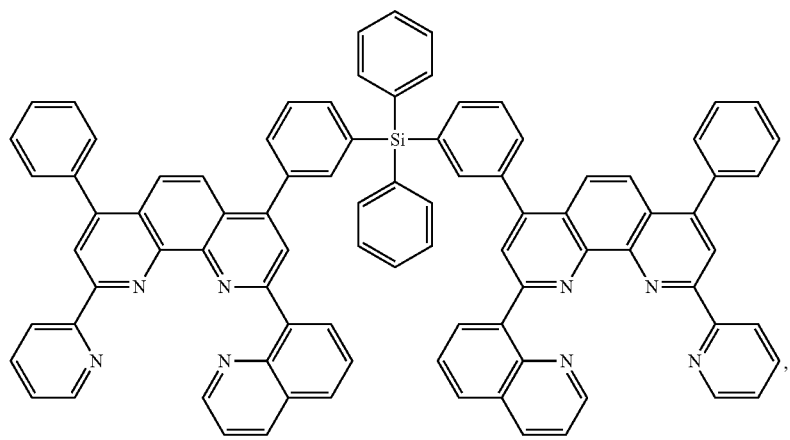
M20
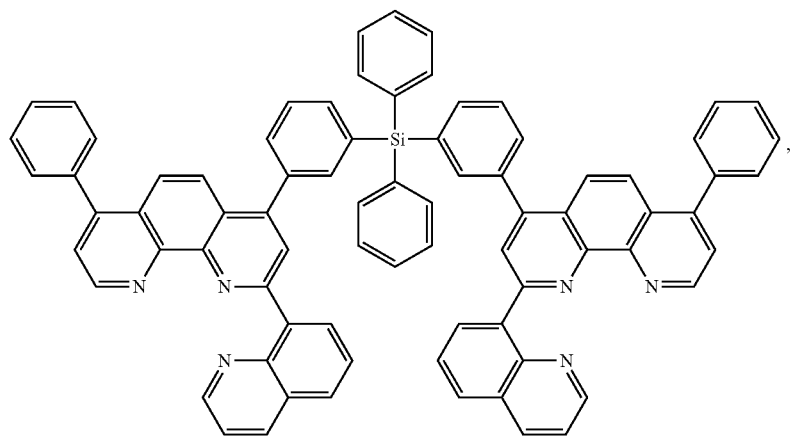
M21
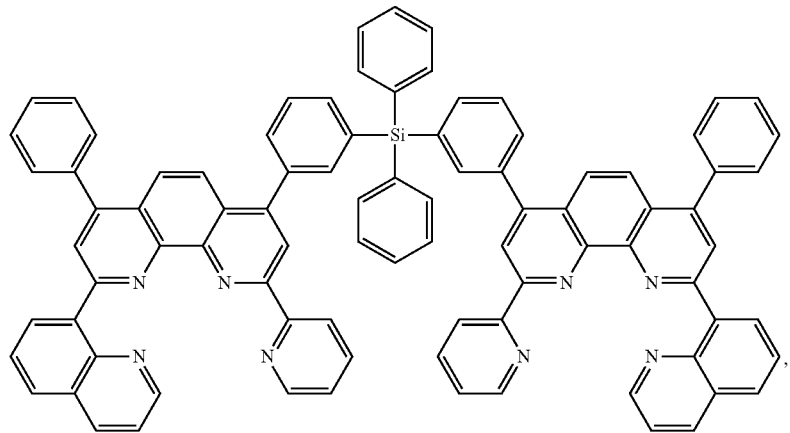
M22

-continued
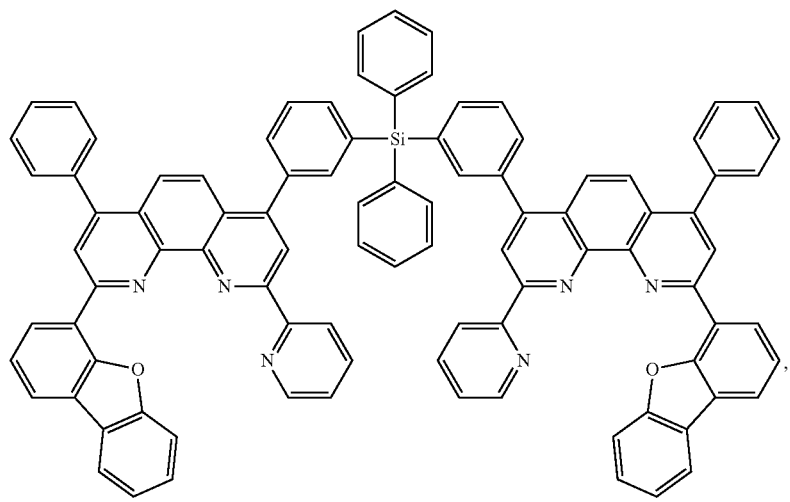
M23
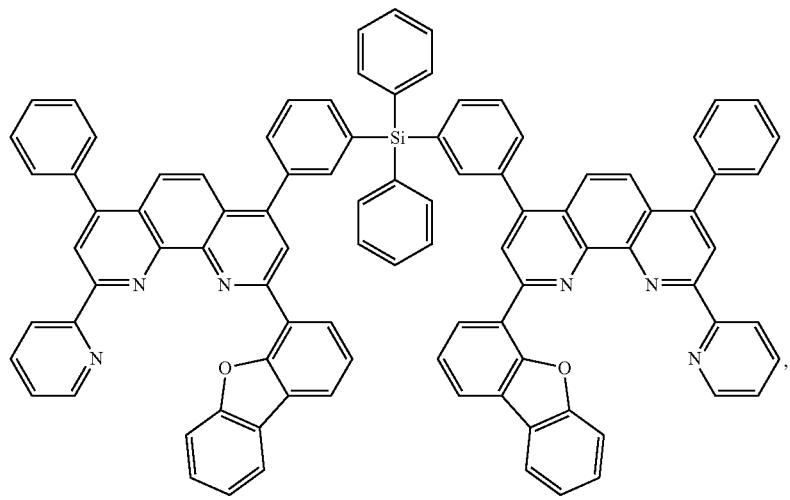
M24
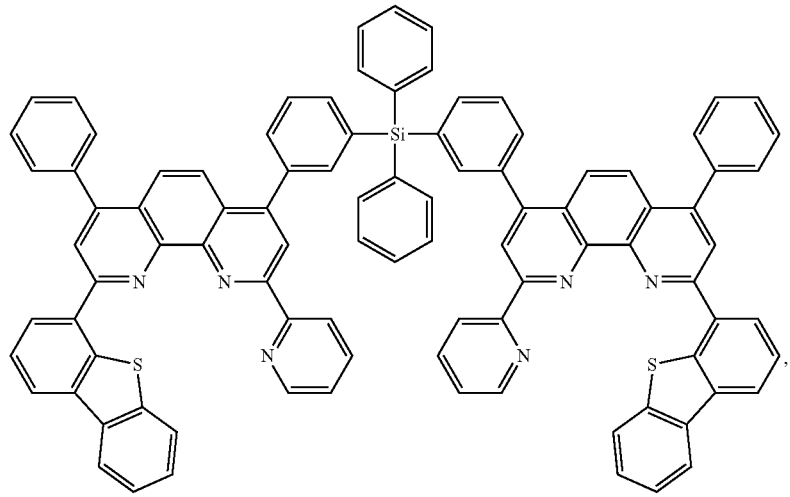
M25

-continued
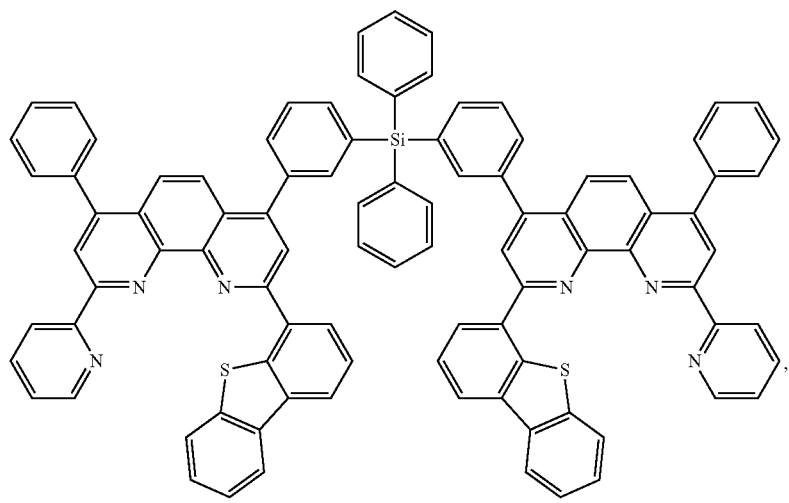
M26
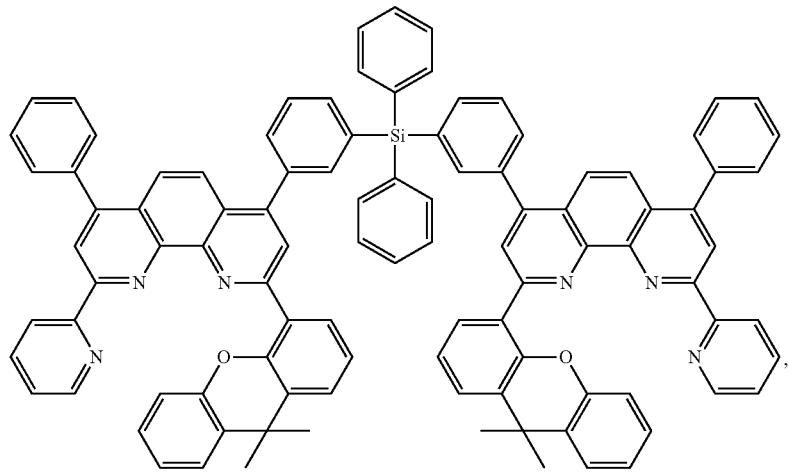
M27
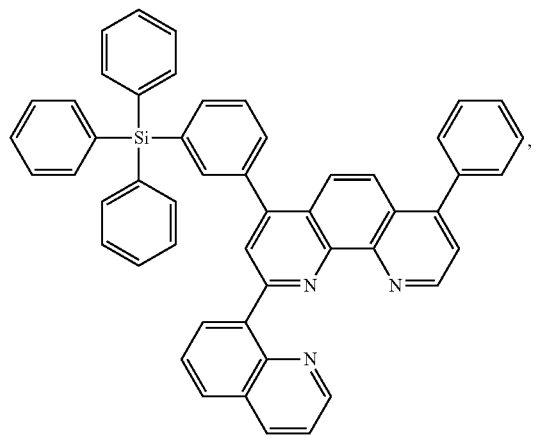
M28
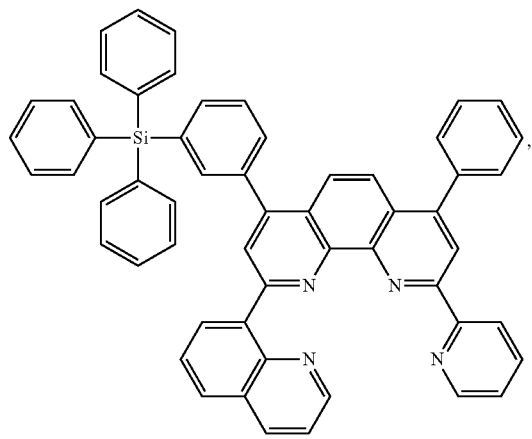
M29

-continued
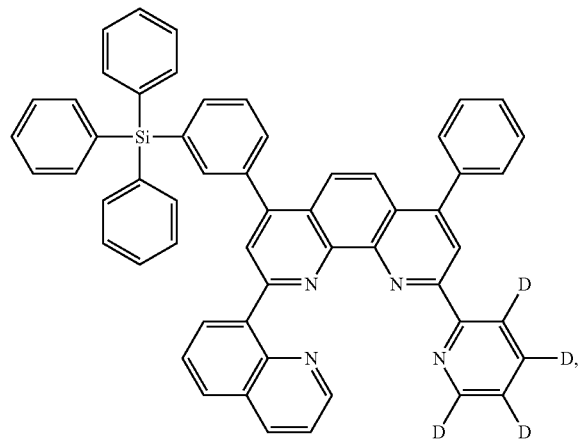
M30
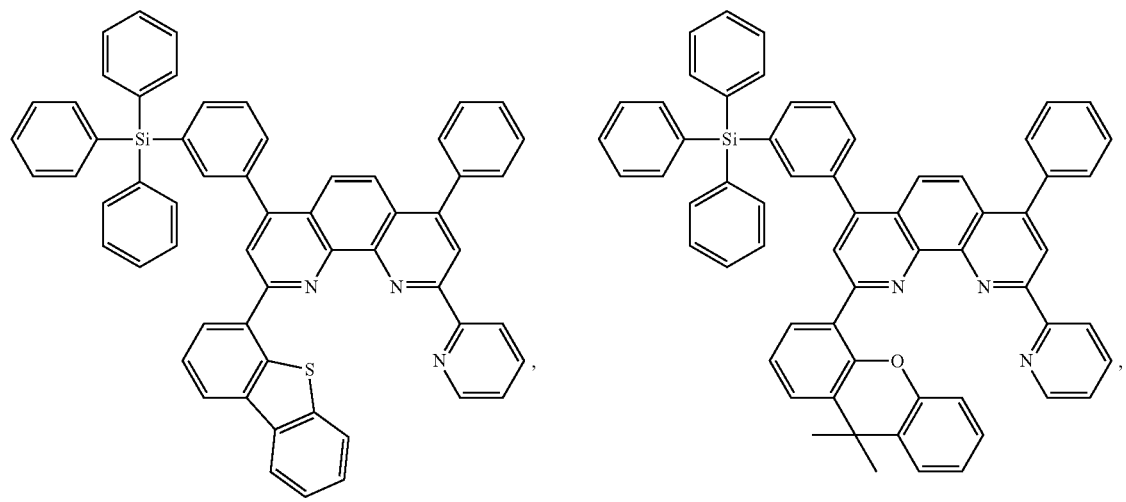
M31  M32
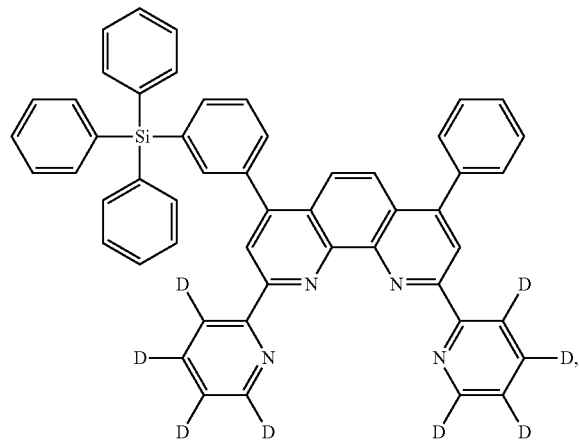
M33

-continued
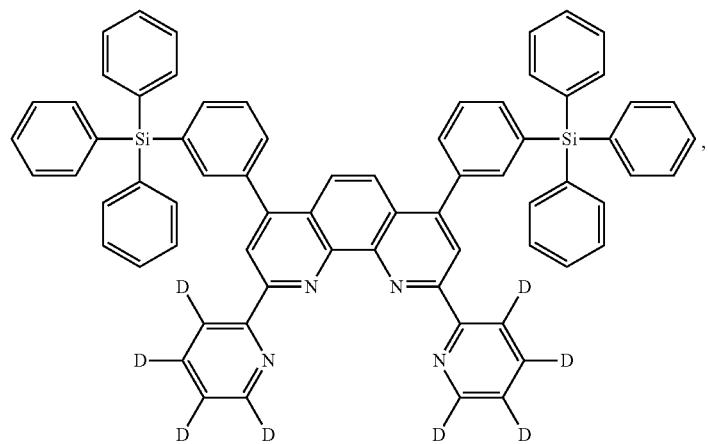
M34
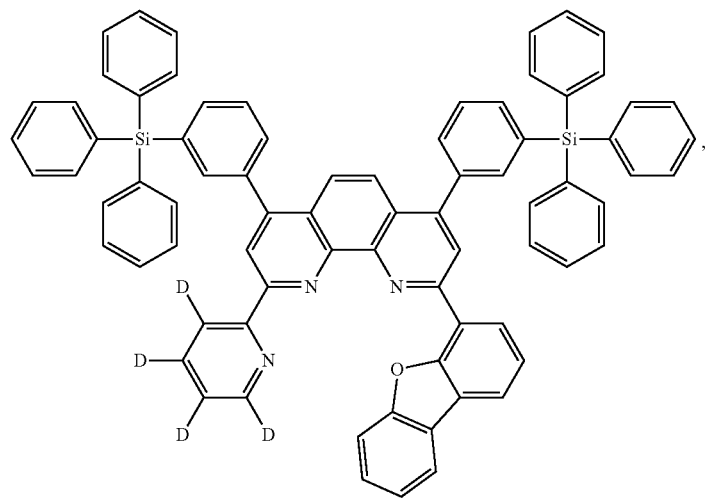
M35
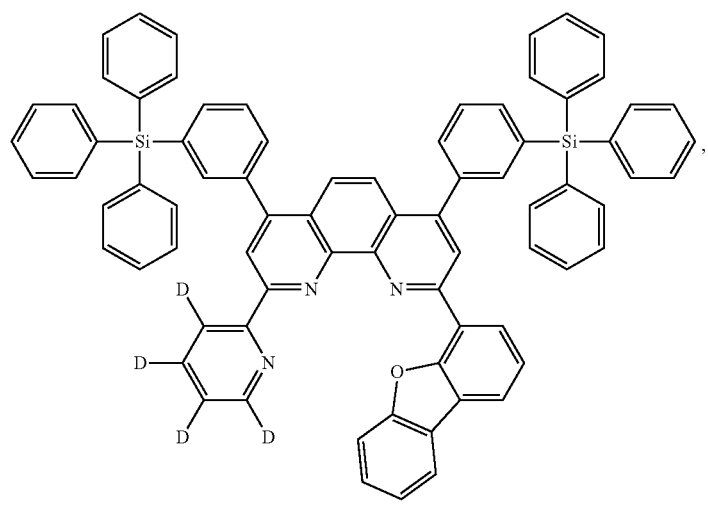
M36

-continued
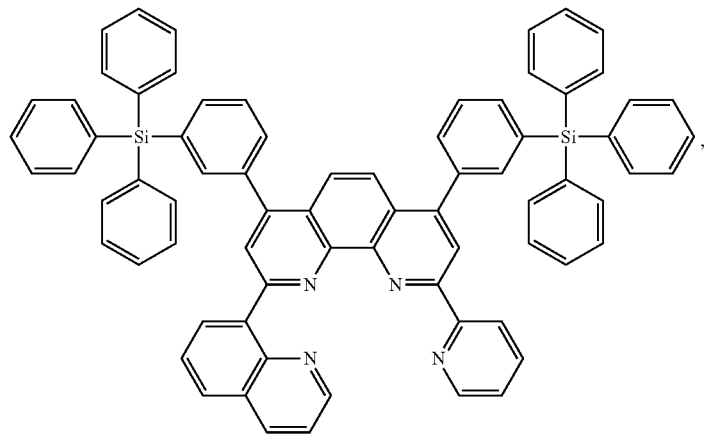
M37
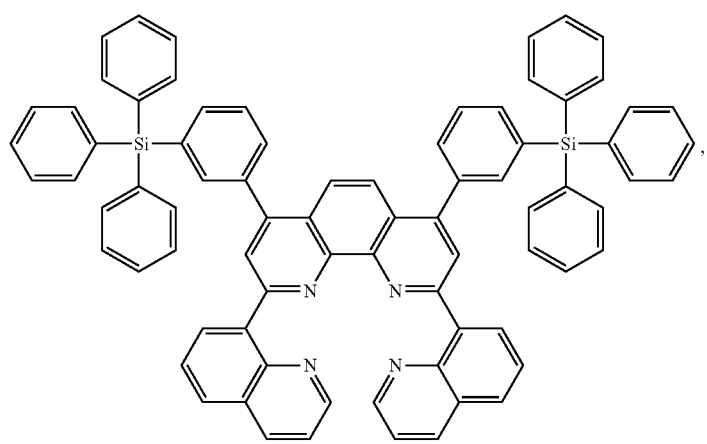
M38
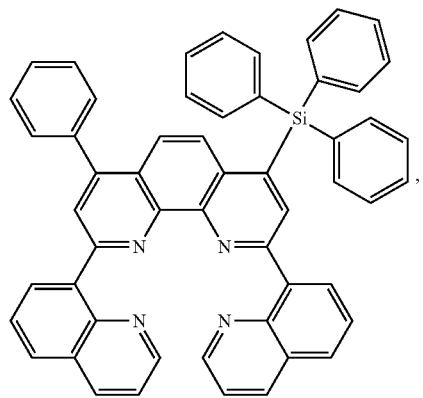
M39
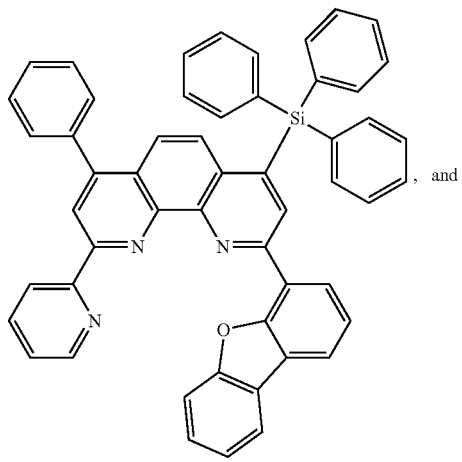
M40
, and

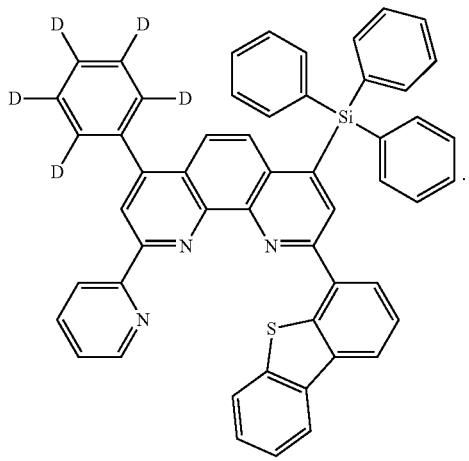

M41

A second aspect of the present disclosure is to provide an electron transport material comprising the organic compound as described above.

In one embodiment, the electron transport material is an electron transport material containing a metal; and the metal is selected from any one or a combination of at least two of an alkali metal, an alkali metal compound, an alkaline earth metal, an alkaline earth metal compound, a transition metal, a transition metal compound, a rare earth metal, and a rare earth metal compound.

In the electron transport material, the organic compound provided by the present disclosure forms a stable structure of tridentate coordination or a tetradentate coordination with a metal and/or a metal compound; and the alkali metal includes Li, Na, K, Rb or Cs, the alkaline earth metal includes Be, Mg, Ca, Sr or Ba, the transition metal includes Ti, Cr, Mn, Fe, Co, Ni, Zr, Nb, Mo, Ru, Rh, Pd, La, Hf, Re, Os, Ir or Pt, and the rare earth metal includes La, Ce, Pr, Nd, Pm, Sm, Eu, Gd, Tb, Dy, Ho, Er, Tm, Yb or Lu.

A third aspect of the present disclosure is to provide a display panel, and the display panel comprises an OLED device, the OLED device comprises an anode, a cathode, and an organic thin film layer between the anode and the cathode, the organic thin film layer includes an electron transport layer; the material of the electron transport layer includes the electron transport material as described above.

In one embodiment, the organic thin film layer further comprises an electron injection layer; material of the electron injection layer includes the electron transport material as described above.

In the OLED device according to the present disclosure, anode material may be a metal, a metal oxide or a conductive polymer; and the metal includes copper, gold, silver, iron, chromium, nickel, manganese, palladium, platinum, or the alloys thereof, the metal oxide includes indium tin oxide (ITO), indium zinc oxide (IZO), zinc oxide, or indium gallium zinc oxide (IGZO), and the conductive polymer includes polyaniline, polypyrrole, or poly (3-methylthiophene). In addition to the materials and combination thereof as described above which facilitate hole injection, other materials known to be suitable for anodes can be included.

In the OLED device, the cathode material may be a metal or a multilayer metal material; and the metal includes aluminum, magnesium, silver, indium, tin, titanium and alloys thereof, and the multilayer metal material includes LiF/Al, LiO$_2$/Al, and BaF$_2$/Al. In addition to the materials and combination thereof as described above which facilitate electron injection, other materials known to be suitable for cathodes can be included.

In the OLED device, the organic thin film layer includes at least one light emitting layer (EML) and any one or a combination of at least two of an electron transport layer (ETL), a hole transport layer (HTL), a hole injection layer (HIL), an electron blocking layer (EBL), a hole blocking layer (HBL), and an electron injection layer (EIL) disposed on both sides of the light emitting layer; and the hole injection and transport layer may be a carbazole compound, an arylamine compound, an acridine compound, and the electron injection material or the transport material includes a nitrogen-containing heterocyclic compound, a boron-containing heterocyclic compound, a phosphorus-containing compound, a fused aromatic ring compound and a metal compound.

A schematic diagram of the OLED device is as shown in FIG. 1 and includes an anode 101 and a cathode 102, a light emitting layer 103 disposed between the anode 101 and the cathode 102, a first organic thin film layer 104 and a second organic thin film layer 105 are provided on both sides of the light emitting layer 103, the first organic thin film layer 104 is any one or a combination of at least two of a hole transport layer (HTL), a hole injection layer (HIL), or an electron blocking layer (EBL), the second organic thin film layer 105 is an electron transport layer (ETL), and the second organic thin film layer 105 further includes a hole blocking layer (HBL) and/or an electron injection layer (EIL).

The OLED device can be prepared by the following method: forming an anode on a transparent or non-transparent smooth substrate, forming an organic thin layer on the anode, and forming a cathode on the organic thin layer. In one embodiment, the organic thin layer can be formed by known film-forming methods such as evaporation, sputtering, spin coating, dipping, and ion plating.

A fourth aspect of the present disclosure is to provide a display device comprising the display panel according to the third aspect.

The organic compounds provided by the present disclosure are exemplarily prepared by the following synthetic route:

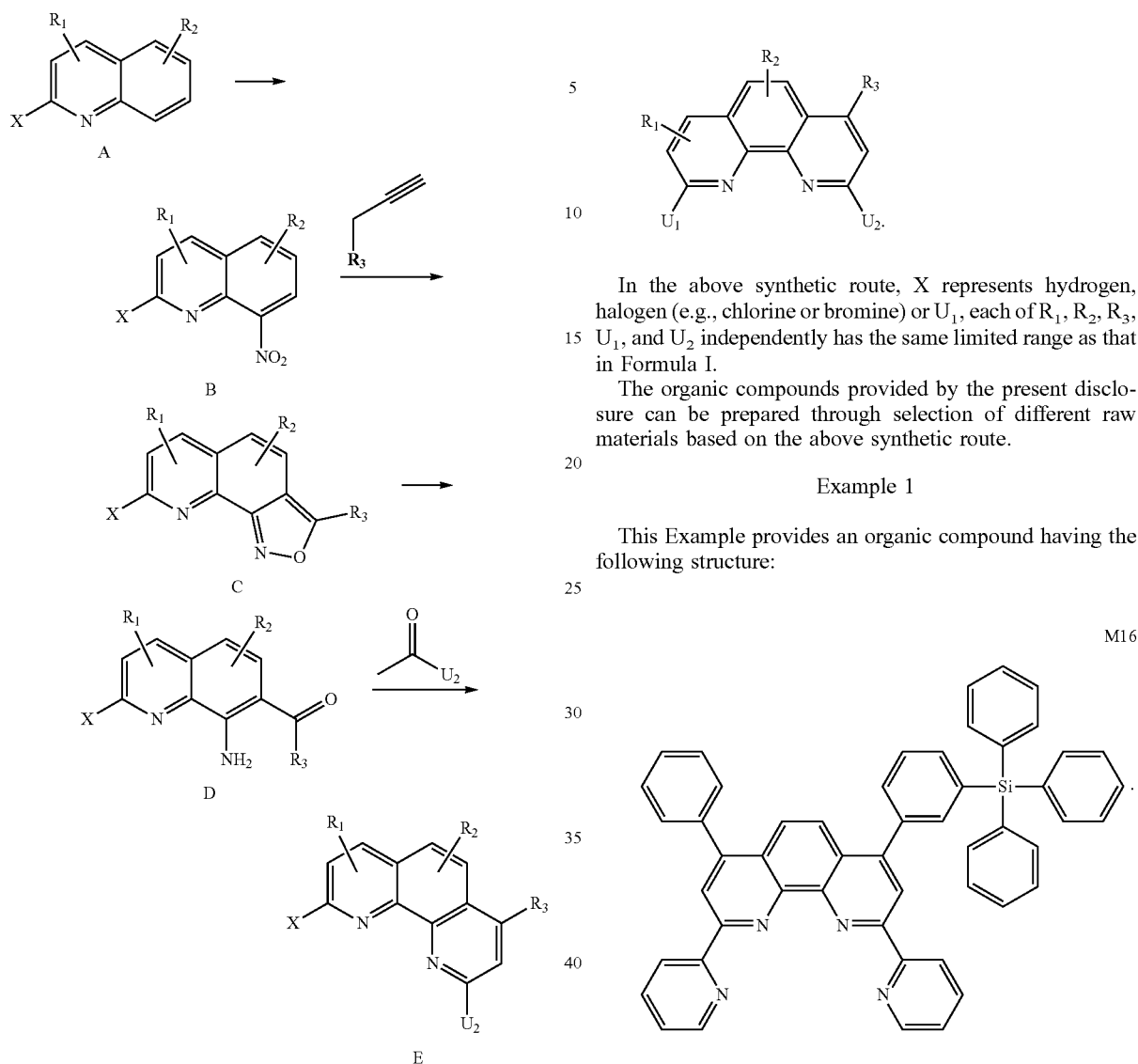

In the above synthetic route, the benzopyridine compound A undergoes a one-step nitration reaction to obtain a nitration product B; the nitration product B undergoes a cycloaddition reaction with a terminal alkyne-containing compound to obtain a fused ring product C; and the fused ring product C undergoes a hydrolysis reaction to obtain a compound D; the compound D is cyclized with a methyl ketone compound containing a $U_2$ substituent to obtain the core structure E of General Formula I; when X is a halogen, the core structure E undergoes a coupling reaction with

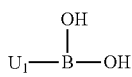

under the catalysis of palladium catalyst to obtain

In the above synthetic route, X represents hydrogen, halogen (e.g., chlorine or bromine) or $U_1$, each of $R_1$, $R_2$, $R_3$, $U_1$, and $U_2$ independently has the same limited range as that in Formula I.

The organic compounds provided by the present disclosure can be prepared through selection of different raw materials based on the above synthetic route.

Example 1

This Example provides an organic compound having the following structure:

M16

The method for preparing the organic compound M16 includes the following steps:

(1)

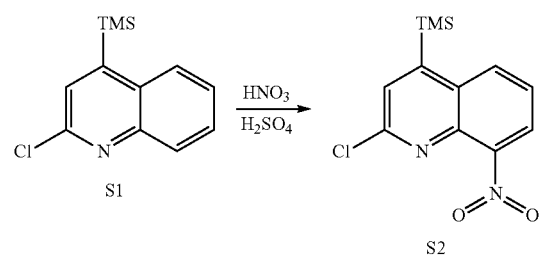

In a 100 mL three-necked flask, first dissolving S1 (10 mmol, where TMS is trimethylsilyl) in 20 mL of concentrated sulfuric acid, and controlling the temperature in an ice-water bath. After stirring evenly at a certain rotation speed, adding concentrated nitric acid (15 mmol) to the reaction system for 2 h; adjusting the reaction solution to neutrality with an aqueous NaOH solution under an ice water bath; after the reaction was completed, extracting the reaction system with diethyl ether, and drying the obtained organic phase over anhydrous sodium sulfate, distilling off the solvent and purifying through column chromatography to obtain intermediate S2 (9.5 mmol, yield 95%).

The structure of intermediate S2 was tested: MALDI-TOF-MS (m/z) obtained by Matrix assisted laser desorption ionization time-of-flight mass spectrometry: $C_{12}H_{13}N_2O_2$, calculated value: 280.78, tested value: 280.04.

(2)

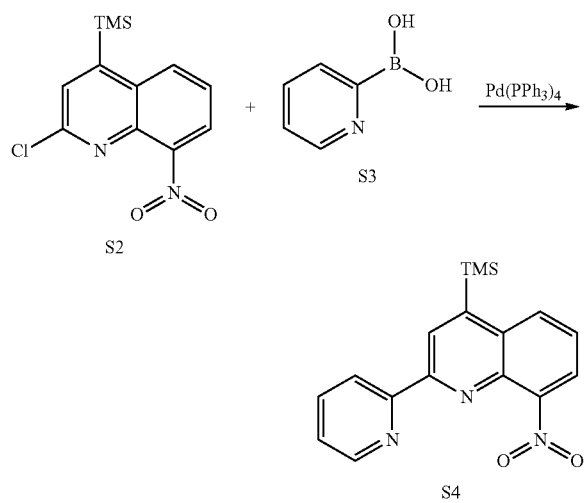

Under the protection of nitrogen, dissolving intermediates S2 (1 mmol) and S3 (1.2 mmol) in 20 mL of toluene, adding tetra(triphenylphosphine)palladium Pd(PPh₃)₄ (0.05 mmol) as a catalyst, and adding 2 mL of aqueous potassium carbonate solution (2 mol/L), refluxing the same for 12 h; after the reaction was completed, extracting the reaction system with saturated brine and ethyl acetate three times, combining the organic phases and drying over anhydrous sodium sulfate. Removing all solvents by reduced pressure distillation, and collecting the crude product. Purifying the crude product by a silica gel column chromatography using a mixed solvent of n-hexane and chloroform in a volume ratio of 5:1 as an eluent, and finally purifying to obtain intermediate S6 (0.87 mmol, yield 87%).

The structure of intermediate S4 was tested: MALDI-TOF-MS (m/z) obtained by Matrix assisted laser desorption ionization time-of-flight mass spectrometry: $C_{17}H_{17}N_3O_2Si$, calculated value: 323.42, tested value: 323.11.

(3)

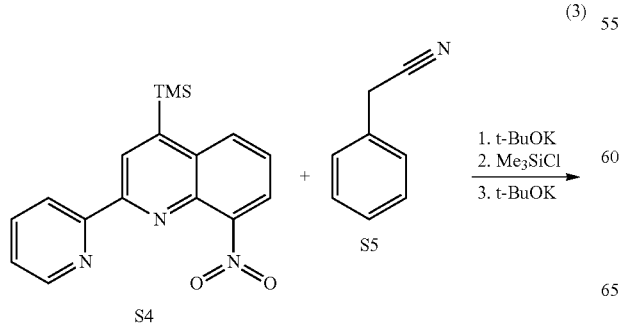

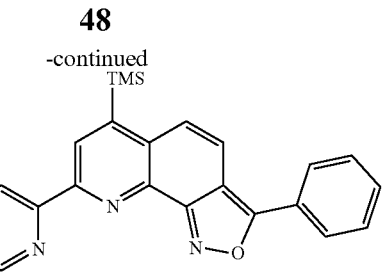

Under the protection of nitrogen, dissolving intermediates S4 (3 mmol) and S5 (3.1 mmol) in 20 mL of tetrahydrofuran (THF), reducing the temperature to −60° C. with an ethanol bath, and dropwise adding 3.3 mmol of potassium tert-butoxide (t-BuOK) dissolved in 5 mL of THF to the reaction system; after 5 min, adding 12 mmol of trimethylchlorosilane Me₃SiCl, and stirring continuously at low temperature for 5 min; then dissolving 15 mmol of t-BuOK in 20 mL of THF solution, and injecting the same to the reaction system. Naturally returning the reaction system to room temperature, and stirring continuously for 3.5 h. After the reaction was completed, pouring the reaction solution into a dilute hydrochloric acid solution and extracted with ethyl acetate several times, combining the organic phases, and then drying the same over anhydrous Na₂SO₄. Removing all solvents by reduced pressure distillation, and collecting the crude product. Purifying the crude product by a silica gel column chromatography using a mixed solvent of n-hexane and chloroform in a volume ratio of 5:1 as an eluent, and finally purifying to obtain solid intermediate S6 (2.73 mmol, yield 91%).

The structure of intermediate S6 was tested: MALDI-TOF-MS (m/z) obtained by Matrix assisted laser desorption ionization time-of-flight mass spectrometry: $C_{24}H_{21}N_3OSi$, calculated value: 395.53, tested value: 395.15.

(4)

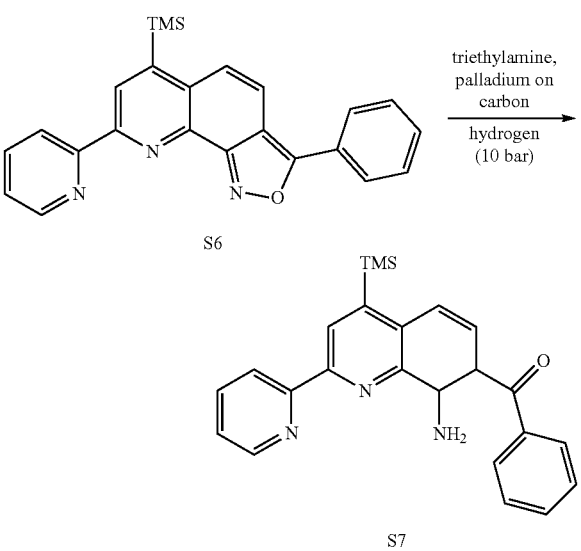

Charging intermediate S6 (1 mmol), triethylamine (1 mL), palladium on carbon (10%, 10 mg) and 6 mL of tetrahydrofuran (THF) in a reaction kettle. Injecting hydrogen into the reaction kettle to bring the pressure in the reaction kettle to 10 bar. Stirring the reaction system at room temperature for 12 h. After the reaction was completed, extracting the reaction system with saturated brine and ethyl acetate for several times, combining the organic phases, and then drying the same over Na₂SO₄. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain intermediate S7 (0.95 mmol, yield 95%).

The structure of the intermediate S7 was tested: MALDI-TOF-MS (m/z) obtained by Matrix assisted laser desorption ionization time-of-flight mass spectrometry: $C_{24}H_{23}N_3OSi$, calculated value: 397.54, tested value: 397.16.

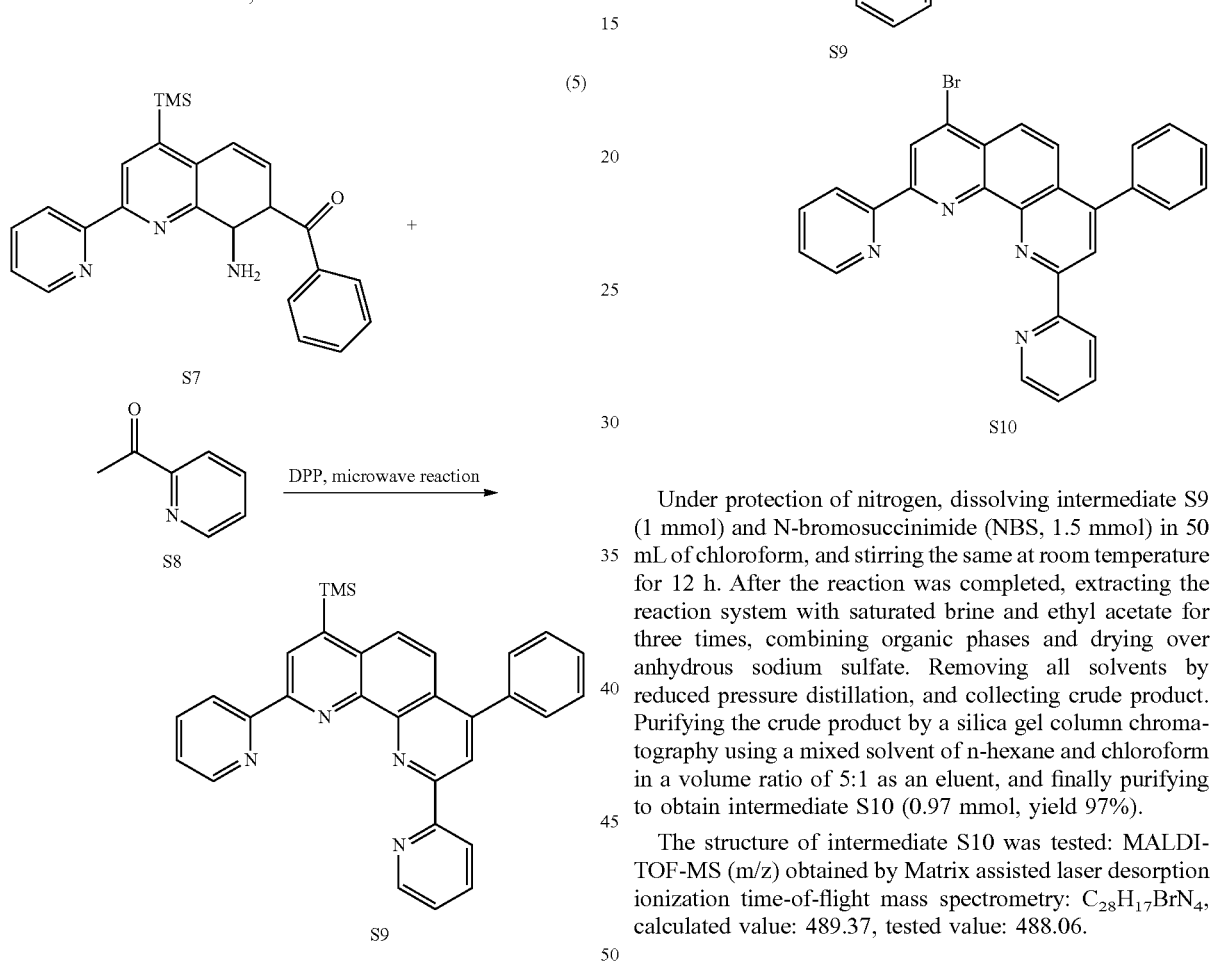

Placing intermediates S7 (1 mmol), S8 (1.05 mmol) and diamyl phthalate (DPP, 0.5 mmol) in a microwave reactor and subjecting the same to microwave reaction for 3 min. After the reaction was completed, diluting the reaction system with ethyl acetate, neutralizing with a 10% aqueous NaOH solution, and extracting with ethyl acetate, drying the organic phase over Na₂SO₄. Purifying the crude product through a silica gel chromatography column using a mixed solvent of ethyl acetate and n-hexane in a volume ratio of 1:20 as an eluent, and finally purifying to obtain a solid intermediate S9 (0.74 mmol, yield 74%).

The structure of intermediate S9 was tested: MALDI-TOF-MS (m/z) obtained by Matrix assisted laser desorption ionization time-of-flight mass spectrometry: $C_{31}H_{26}N_4Si$, calculated value: 482.65, tested value: 482.19.

Under protection of nitrogen, dissolving intermediate S9 (1 mmol) and N-bromosuccinimide (NBS, 1.5 mmol) in 50 mL of chloroform, and stirring the same at room temperature for 12 h. After the reaction was completed, extracting the reaction system with saturated brine and ethyl acetate for three times, combining organic phases and drying over anhydrous sodium sulfate. Removing all solvents by reduced pressure distillation, and collecting crude product. Purifying the crude product by a silica gel column chromatography using a mixed solvent of n-hexane and chloroform in a volume ratio of 5:1 as an eluent, and finally purifying to obtain intermediate S10 (0.97 mmol, yield 97%).

The structure of intermediate S10 was tested: MALDI-TOF-MS (m/z) obtained by Matrix assisted laser desorption ionization time-of-flight mass spectrometry: $C_{28}H_{17}BrN_4$, calculated value: 489.37, tested value: 488.06.

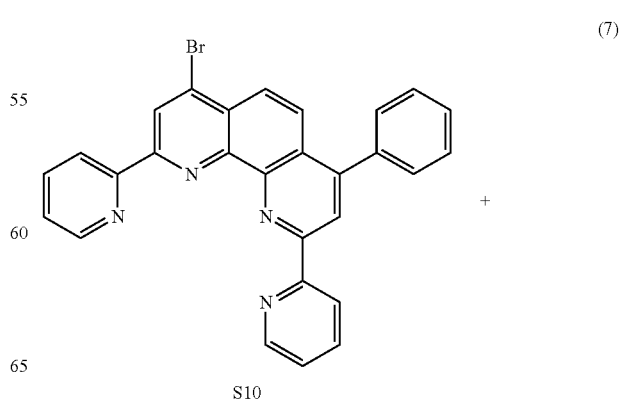

-continued

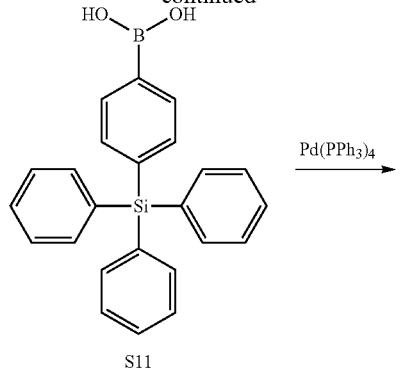

S11

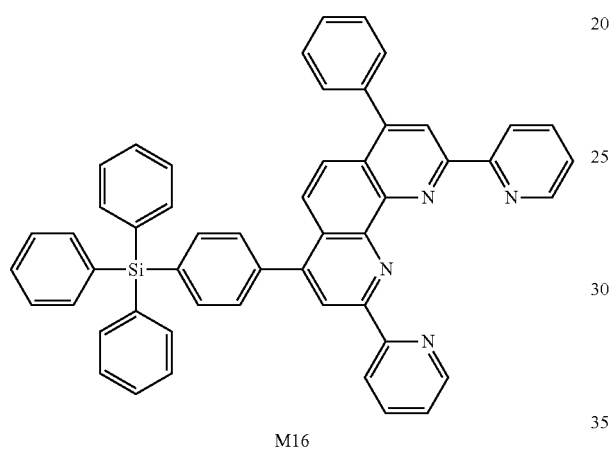

M16

Under protection of nitrogen, dissolving intermediates S10 (1 mmol) and S11 (1.1 mmol) in toluene, adding Pd(PPh$_3$)$_4$ (0.05 mmol) as a catalyst, and adding 2 mL of aqueous potassium carbonate solution (2 mol/L), refluxing the same for 12 h. After the reaction was completed, extracting the reaction system with saturated brine and ethyl acetate for three times, combining organic phases and drying over anhydrous sodium sulfate. Removing all solvents by reduced pressure distillation, and collecting crude product. Purifying the crude product by a silica gel column chromatography using a mixed solvent of n-hexane and chloroform in a volume ratio of 5:1 as an eluent, and finally purifying to obtain the solid desired product M16 (0.89 mmol, yield 89%).

The structure of the desired product M16 was tested: MALDI-TOF-MS (m/z) obtained by Matrix assisted laser desorption ionization time-of-flight mass spectrometry: C$_{52}$H$_{36}$N$_4$Si, calculated value: 744.95, tested value: 744.27.

Elemental analysis: Theoretical value: C83.84, H4.87, N7.52, Si3.77; tested value: C83.85, H4.85, N7.56, Si3.74.

$^1$H-NMR (400 MHz, CDCl$_3$): δ (ppm) 7.12 (m, 2H), 7.22 (m, 1H), 7.32 (m, 2H), 7.36 (m, 9H), 7.43 (m, 1H), 7.48 (m, 2H), 7.54 (m, 6H), 7.58-7.60 (m, 4H), 7.66-7.68 (m, 3H), 8.50 (m, 2H), 8.59-8.62 (m, 4H).

Example 2

This Example provides an organic compound having the following structure:

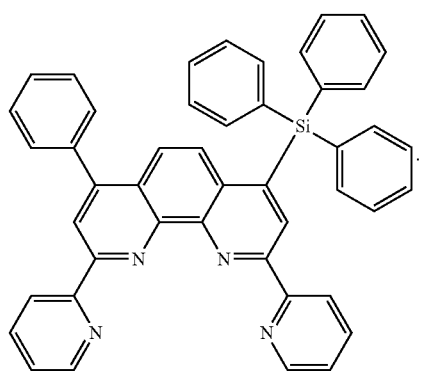

M19

The method for preparing the organic compound M19 includes the following steps:

obtaining intermediate S10 according to the method of steps (1) to (6) in Example 1;

(7)

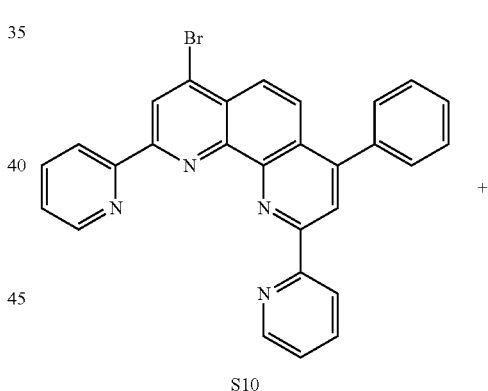

S10

+

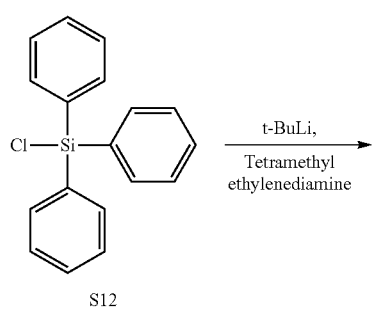

S12

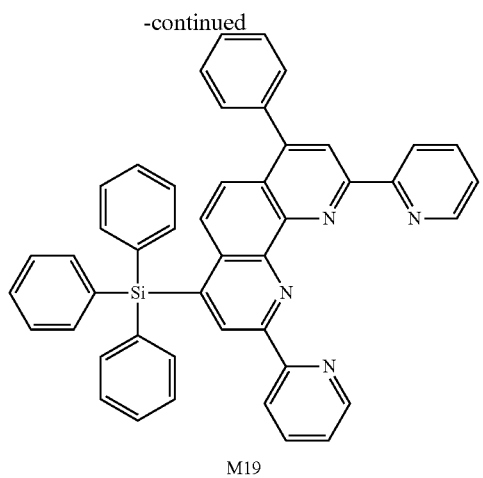

M19

Adding intermediate S10 (1 mmol) and tetramethylethylenediamine (2.5 mmol) to 90 mL of THF, reducing the temperature to −78° C. in an ethanol bath, and dropwise adding tert-butyllithium (t-BuLi, 2.5 mmol) into the reaction system within 15 min, and stirring at low temperature for 1 h. Adding S12 (2.5 mmol) at low temperature, and after stirring at low temperature for 1 h, naturally returning it to room temperature and stirring overnight. After the reaction was completed, extracting the reaction system with water and ethyl acetate, and then drying organic phase over Na$_2$SO$_4$. Purifying the crude product by a silica gel column chromatography using a mixed solvent of n-hexane and chloroform in a volume ratio of 5:1 as an eluent, and finally purifying to obtain the solid desired product M19 (0.87 mmol, yield 87%).

The structure of the desired product M19 was tested: MALDI-TOF-MS (m/z) obtained by Matrix assisted laser desorption ionization time-of-flight mass spectrometry: C$_{46}$H$_{32}$N$_4$Si, calculated value: 668.86, tested value: 668.24.

Elemental analysis: Theoretical value: C82.60, H4.82, N8.38, Si4.20; tested value: C82.62, H4.81, N8.38, Si4.21.

$^1$H-NMR (400 MHz, CDCl$_3$): δ (ppm) 7.12 (m, 2H), 7.22 (m, 1H), 7.32 (m, 2H), 7.36 (m, 9H), 7.43 (m, 1H), 7.48 (m, 2H), 7.54 (m, 6H), 7.66-7.68 (m, 3H), 8.50 (m, 2H), 8.59-8.60 (m, 3H), 8.66 (s, 1H).

Example 3

This Example provides an organic compound having the following structure:

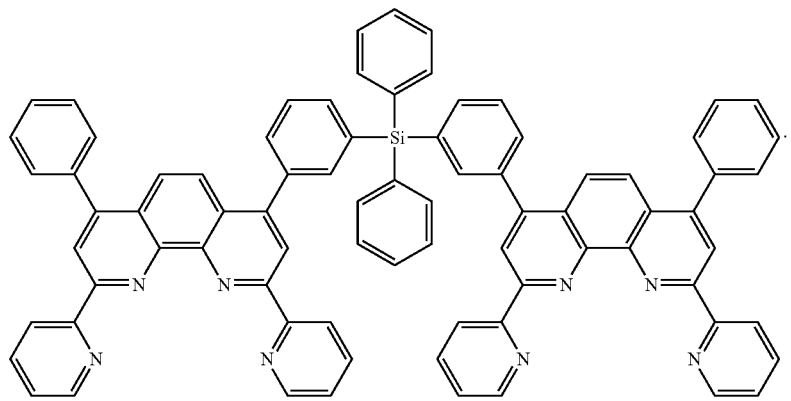

M2

The method for preparing the organic compound M2 includes the following steps:

obtaining intermediate S10 according to the method of steps (1) to (6) in Example 1;

(7)

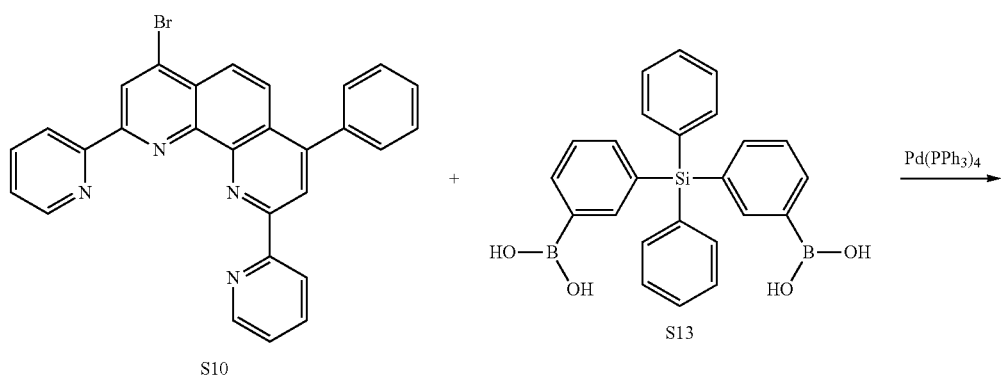

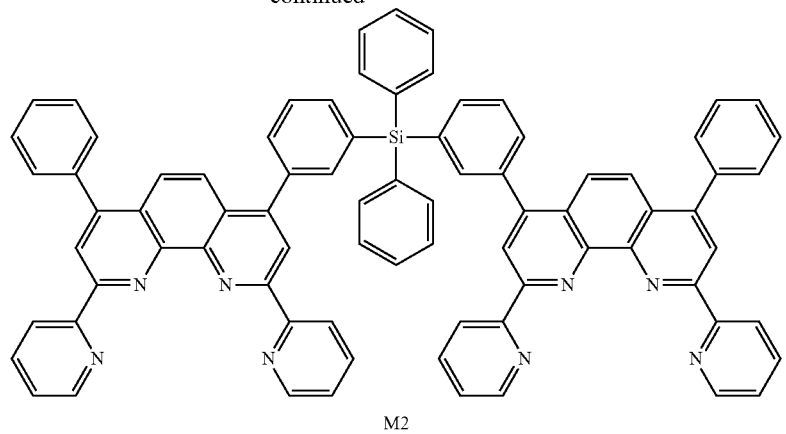

M2

Under protection of nitrogen, dissolving intermediates S10 (2 mmol) and S13 (1 mmol) in 30 mL of toluene, adding Pd(PPh$_3$)$_4$ (0.1 mmol) as a catalyst, and adding 4 mL of aqueous potassium carbonate solution (2 mol/L), refluxing the same for 12 h. After the reaction was completed, extracting the reaction system with saturated brine and ethyl acetate for three times, combining the organic phases and drying over anhydrous sodium sulfate. Removing all solvents by reduced pressure distillation, and collecting a crude product. Purifying the crude product by a silica gel column chromatography using a mixed solvent of n-hexane and chloroform in a volume ratio of 5:2 as an eluent, and finally purifying to obtain a solid desired product M2 (0.80 mmol, yield 80%).

The structure of the desired product M2 was tested: MALDI-TOF-MS (m/z) obtained by Matrix assisted laser desorption ionization time-of-flight mass spectrometry: C$_{80}$H$_{52}$N$_8$Si, calculated value: 1153.41, tested value: 1152.41.

Elemental analysis: Theoretical value: C83.31, H4.54, N9.72, Si2.44; tested value: C83.30, H4.53, N9.73, Si2.45.

$^1$H-NMR (400 MHz, CDCl$_3$): δ (ppm) 7.12 (m, 4H), 7.22 (m, 2H), 7.32 (m, 4H), 7.36 (m, 6H), 7.42-7.43 (m, 4H), 7.48-7.50 (m, 6H), 7.54 (m, 4H), 7.58 (m, 2H), 7.66-7.68 (m, 6H), 7.76 (m, 2H), 8.50 (m, 4H), 8.59-8.62 (m, 8H).

Example 4

This Example provides an organic compound having the following structure:

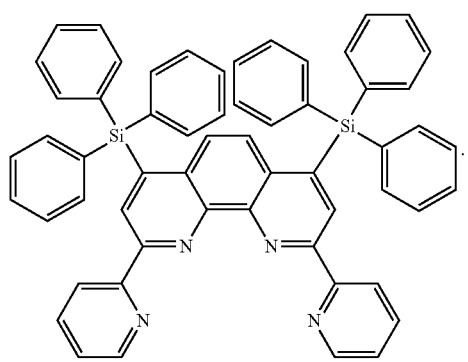

M11

The method for preparing the organic compound M11 includes the following steps:

obtaining intermediate S4 according to the method of steps (1) to (2) in Example 1;

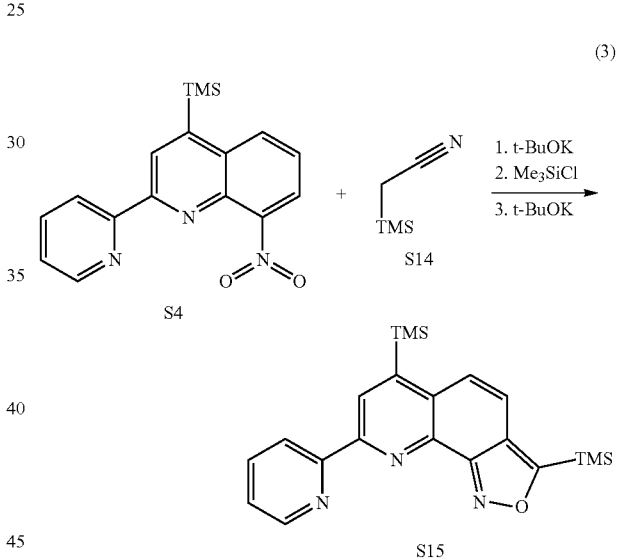

(3)

Under protection of nitrogen, dissolving intermediates S4 (3 mmol) and S14 (3.1 mmol) in 20 mL of tetrahydrofuran (THF), reducing its temperature to −60° C. with an ethanol bath, and dropwise adding 3.3 mmol of potassium tert-butoxide (t-BuOK) dissolved in 5 mL of THF to the reaction system; after 5 min, adding 12 mmol of Me$_3$SiCl, and stirring continuously at low temperature for 5 min. Then, dissolving 15 mmol of t-BuOK in 20 mL of THF solution, and injecting the same to the reaction system. Naturally returning the reaction system to room temperature, and stirring continuously for 3.5 h. After the reaction was completed, pouring the reaction solution into a dilute hydrochloric acid solution and extracted with ethyl acetate for several times, combining the organic phases, and then drying the same over Na$_2$SO$_4$. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain intermediate S15 (2.58 mmol, yield 86%).

The structure of intermediate S15 was tested: MALDI-TOF-MS (m/z) obtained by Matrix assisted laser desorption ionization time-of-flight mass spectrometry: $C_{21}H_{25}N_3OSi_2$, calculated value: 391.61, tested value: 391.15.

(4)

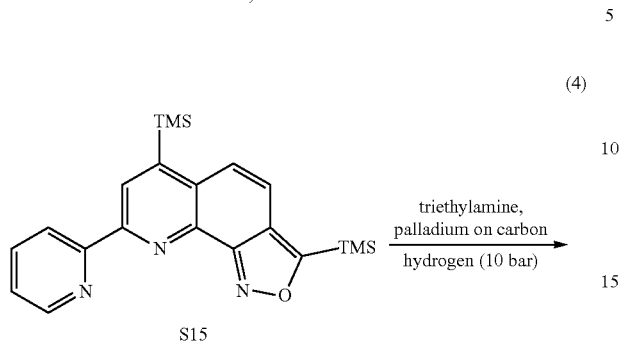

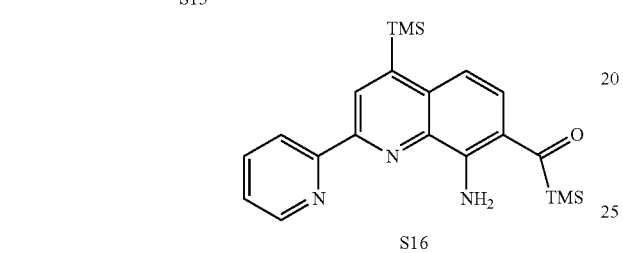

Charging intermediate S15 (1 mmol), triethylamine (1 mL), palladium on carbon (10%, 10 mg) and 6 mL of tetrahydrofuran (THF) in a reaction kettle. Injecting hydrogen into the reaction kettle to bring the pressure in the reaction kettle to 10 bar. Stirring the reaction system at room temperature for 12 h. After the reaction was completed, extracting the reaction system with ethyl acetate for several times, combining the organic phases, and then drying the same over $Na_2SO_4$. Removing all solvents by reduced pressure distillation, and collecting the crude product. Purifying the crude product by a silica gel column chromatography using a mixed solvent of n-hexane and chloroform in a volume ratio of 5:1 as an eluent, and finally purifying to obtain intermediate S16 (0.90 mmol, yield 90%).

The structure of intermediate S16 was tested: MALDI-TOF-MS (m/z) obtained by Matrix assisted laser desorption ionization time-of-flight mass spectrometry: $C_{21}H_{27}N_3OSi_2$, calculated value: 393.63, tested value: 393.17.

(5)

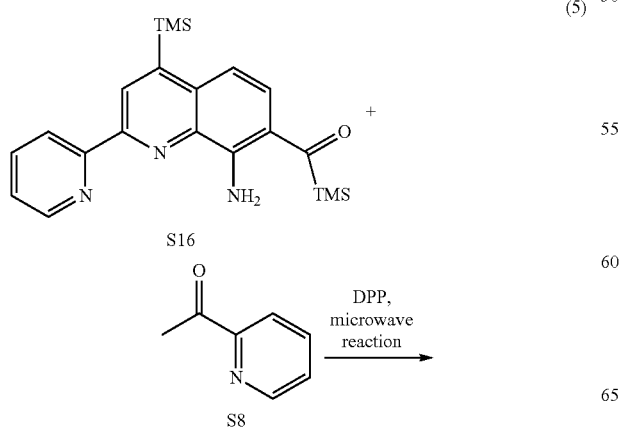

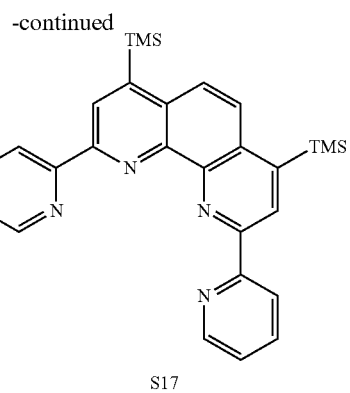

Placing intermediates S16 (1 mmol), S8 (1.05 mmol) and diamyl phthalate (DPP, 0.5 mmol) in a microwave reactor and subjecting the same to microwave reaction for 3 min. After the reaction was completed, diluting the reaction system with ethyl acetate, and neutralizing with a 10% aqueous NaOH solution. Then extracting with ethyl acetate, and drying the organic phase over $Na_2SO_4$. Purifying the crude product through a silica gel chromatography column using a mixed solvent of ethyl acetate and n-hexane in a volume ratio of 1:20 as an eluent, and finally purifying to obtain a solid intermediate S17 (0.71 mmol, yield 71%).

The structure of intermediate S17 was tested: MALDI-TOF-MS (m/z) obtained by Matrix assisted laser desorption ionization time-of-flight mass spectrometry: $C_{28}H_{30}N_4Si_2$, calculated value: 478.74, tested value: 478.20.

(6)

Under protection of nitrogen, dissolving intermediate S17 (1 mmol) and N-bromosuccinimide (NBS, 3 mmol) in 50 mL of chloroform, and stirring the same at room temperature for 12 h. After the reaction was completed, extracting the reaction system with saturated brine and ethyl acetate for three times, combining the organic phases, drying over anhydrous sodium sulfate, removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain intermediate S18 (0.94 mmol, yield 94%).

The structure of intermediate S18 was tested: MALDI-TOF-MS (m/z) obtained by Matrix assisted laser desorption ionization time-of-flight mass spectrometry: $C_{22}H_{12}Br_2N_4$, calculated value: 492.17, tested value: 491.94.

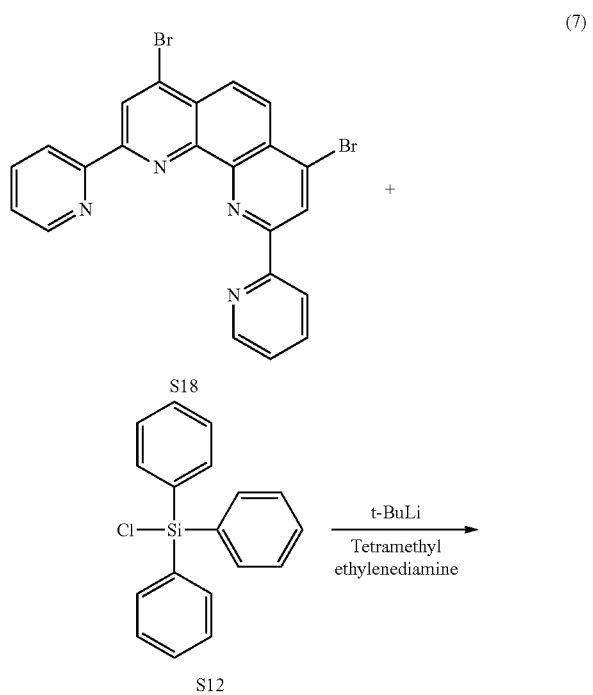

Adding intermediate S18 (1 mmol) and tetramethylethylenediamine (2.5 mmol) to 90 mL of THF, reducing the temperature to −78° C. in an ethanol bath, and dropwise adding tert-butyllithium (t-BuLi, 2.5 mmol) into the reaction system within 15 min, and stirring at low temperature for 1 h. Adding S12 (5 mmol) at low temperature, and after stirring at low temperature for 1 h, naturally returning it to room temperature and stirring overnight. After the reaction was completed, extracting the reaction system with water and ethyl acetate, and then drying the organic phase over Na₂SO₄ to obtain a crude product. Purifying the crude product by a silica gel column chromatography using a mixed solvent of n-hexane and chloroform in a volume ratio of 5:1 as an eluent, and finally purifying to obtain a solid desired product M11 (0.77 mmol, yield 77%).

The structure of the desired product M11 was tested: MALDI-TOF-MS (m/z) obtained by Matrix assisted laser desorption ionization time-of-flight mass spectrometry: $C_{58}H_{42}N_4Si_2$, calculated value: 851.15, tested value: 850.29.

Elemental analysis: Theoretical value: C81.84, H4.97, N6.58, Si6.60; tested value: C81.85, H4.96, N6.59, Si6.59.

$^1$H-NMR (400 MHz, CDCl₃): δ (ppm) 7.12 (m, 2H), 7.36 (m, 18H), 7.54 (m, 4H), 7.66 (m, 2H), 8.50 (m, 2H), 8.59 (m, 2H), 8.66 (s, 2H).

Example 5

This Example provides an organic compound having the following structure:

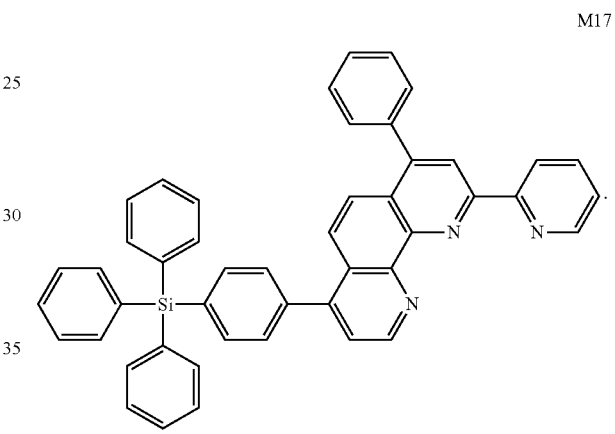

The method for preparing the organic compound M17 includes the following steps:

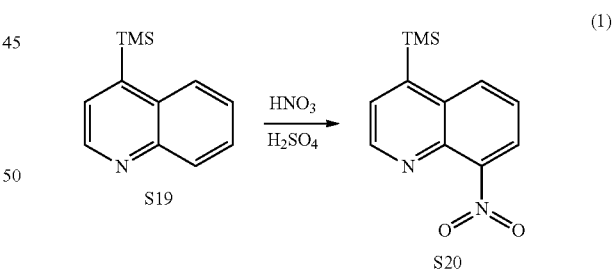

In a 100 mL three-necked flask, first dissolving S19 (10 mmol) in 20 mL of concentrated sulfuric acid, and controlling the temperature in an ice-water bath. After stirring evenly at a certain rotation speed, adding concentrated nitric acid (15 mmol) to the reaction system for 2 h; adjusting the reaction solution to neutrality with an aqueous NaOH solution under an ice water bath; after the reaction was completed, extracting the reaction system with diethyl ether, and drying the obtained organic phase over anhydrous sodium sulfate, distilling off the solvent and purifying through column chromatography to obtain intermediate S20 (9.0 mmol, yield 90%).

The structure of intermediate S20 was tested: MALDI-TOF-MS (m/z) obtained by Matrix assisted laser desorption ionization time-of-flight mass spectrometry: $C_{12}H_{14}N_2O_2Si$, calculated value: 246.34, tested value: 246.08.

(2)

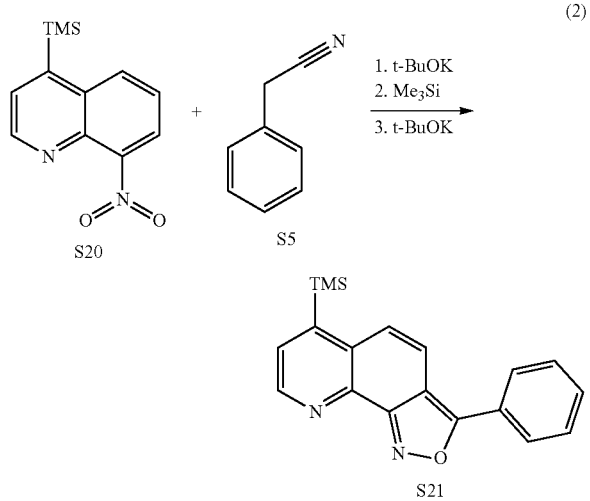

Under protection of nitrogen, dissolving intermediates S20 (3 mmol) and S5 (3 mmol) in 20 mL of THF, reducing the temperature to −60° C. with an ethanol bath, and dropwise adding 3.3 mmol of potassium tert-butoxide (t-BuOK) dissolved in 5 mL of THF to the reaction system; after 5 min, adding 12 mmol of trimethylchlorosilane Me₃SiCl, and stirring continuously at low temperature for 5 min; then dissolving 15 mmol of t-BuOK in 20 mL of THF solution, and injecting the same to the reaction system. Naturally returning the reaction system to room temperature, and stirring continuously for 3.5 h. After the reaction was completed, pouring the reaction solution into a dilute hydrochloric acid solution and extracted with ethyl acetate for several times, combining organic phases, and then drying the same over Na₂SO₄. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain intermediate S21 (2.37 mmol, yield 79%).

The structure of intermediate S21 was tested: MALDI-TOF-MS (m/z) obtained by Matrix assisted laser desorption ionization time-of-flight mass spectrometry: $C_{19}H_{18}N_2OSi$, calculated value: 318.44, tested value: 318.12.

(3)

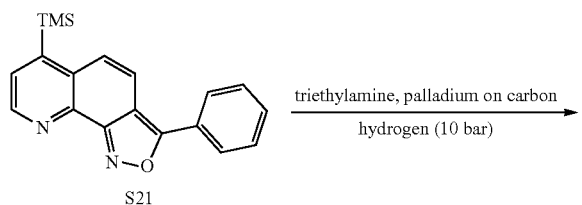

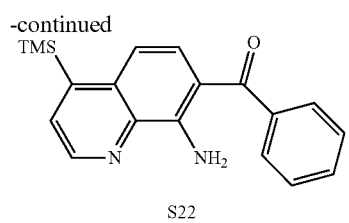

Charging intermediate S21 (1 mmol), triethylamine (1 mL), palladium on carbon (10%, 10 mg) and 6 mL of tetrahydrofuran (THF) in a reaction kettle. Injecting hydrogen into the reaction kettle to bring the pressure in the reaction kettle to 10 bar. Stirring the reaction system at room temperature for 12 h. After the reaction was completed, extracting the reaction system with ethyl acetate for several times, combining organic phases, and then drying the same over Na₂SO₄. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain intermediate S22 (0.88 mmol, yield 88%).

The structure of intermediate S22 was tested: MALDI-TOF-MS (m/z) obtained by Matrix assisted laser desorption ionization time-of-flight mass spectrometry: $C_{19}H_{20}N_2OSi$, calculated value: 320.46, tested value: 320.13.

(4)

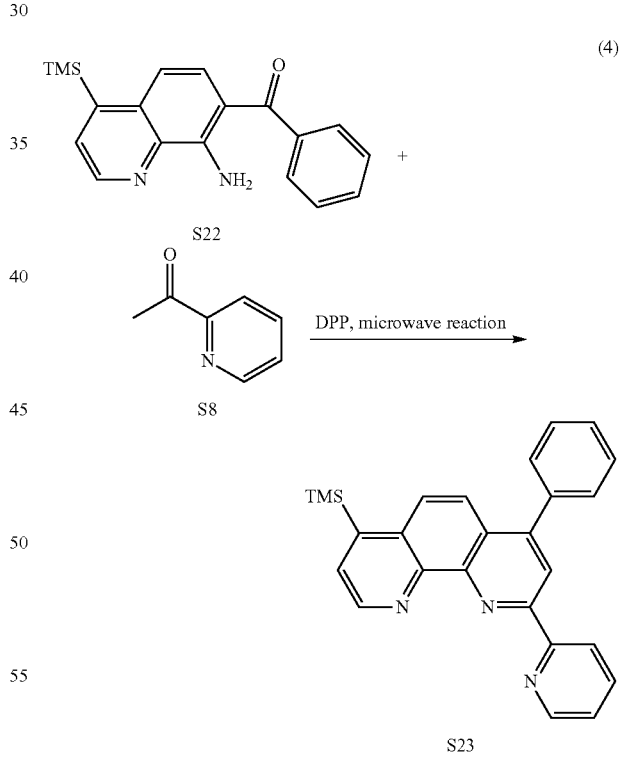

Placing intermediates S22 (1 mmol), S8 (1.1 mmol) and diamyl phthalate (DPP, 0.5 mmol) in a microwave reactor and subjecting the same to microwave reaction for 3 min. After the reaction was completed, diluting the reaction system with ethyl acetate, neutralizing with a 10% aqueous NaOH solution, and extracting with ethyl acetate, drying the organic phase over Na₂SO₄. Purifying the crude product through a silica gel chromatography column using a mixed solvent of ethyl acetate and n-hexane in a volume ratio of 1:20 as an eluent, and finally purifying to obtain a solid intermediate S23 (0.68 mmol, yield 68%).

The structure of the intermediate S23 was tested: MALDI-TOF-MS (m/z) obtained by Matrix assisted laser desorption ionization time-of-flight mass spectrometry: $C_{26}H_{23}N_3Si$, calculated value: 405.57, tested value: 405.17.

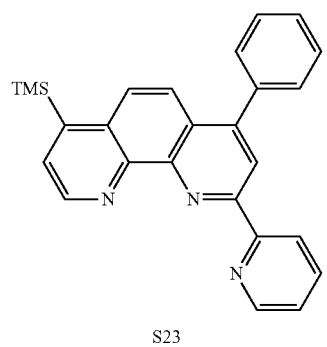

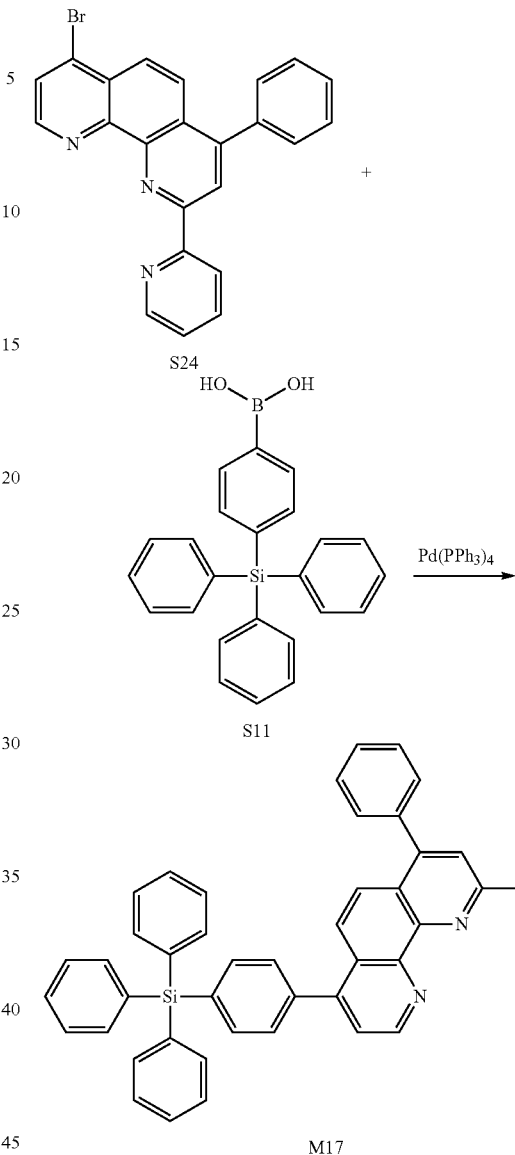

Under protection of nitrogen, dissolving intermediate S23 (1 mmol) and N-bromosuccinimide (NBS, 1.5 mmol) in 50 mL of chloroform, and stirring the same at room temperature for 12 h. After the reaction was completed, extracting the reaction system with saturated brine and ethyl acetate for three times, combining the organic phases and drying over anhydrous sodium sulfate. Removing all solvents by reduced pressure distillation, and collecting the crude product. Purifying the crude product by a silica gel column chromatography using a mixed solvent of n-hexane and chloroform in a volume ratio of 5:1 as an eluent, and finally purifying to obtain intermediate S24 (0.92 mmol, yield 92%).

The structure of intermediate S24 was tested: MALDI-TOF-MS (m/z) obtained by Matrix assisted laser desorption ionization time-of-flight mass spectrometry: $C23H_{14}BrN_3$, calculated value: 412.28, tested value: 413.04.

Under protection of nitrogen, dissolving intermediates S24 (1 mmol) and S11 (1.06 mmol) in 20 mL of toluene, adding $Pd(PPh_3)_4$ (0.05 mmol) as a catalyst, and adding 2 mL of aqueous potassium carbonate solution (2 mol/L), refluxing the same for 12 h. After the reaction was completed, extracting the reaction system with saturated brine and ethyl acetate for three times, combining the organic phases and drying over anhydrous sodium sulfate. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain a solid desired product M17 (0.85 mmol, yield 85%).

The structure of the desired product M17 was tested: MALDI-TOF-MS (m/z) obtained by Matrix assisted laser desorption ionization time-of-flight mass spectrometry: $C_{47}H_{33}N_3Si$, calculated value: 667.87, tested value: 667.24.

Elemental analysis: Theoretical value: C84.52, H4.98, N6.29, Si4.21; tested value: C84.53, H4.97, N6.28, Si4.22.

¹H-NMR (400 MHz, CDCl₃): δ (ppm) 7.12 (m, 1H), 7.22 (m, 1H), 7.32 (m, 2H), 7.36 (m, 9H), 7.43 (m, 1H), 7.48 (m, 3H), 7.54 (m, 6H), 7.58-7.60 (m, 4H), 7.66-7.68 (m, 2H), 8.50 (m, 1H), 8.59-8.62 (m, 2H), 8.87 (m, 1H).

Example 6

This Example provides an organic compound having the following structure:

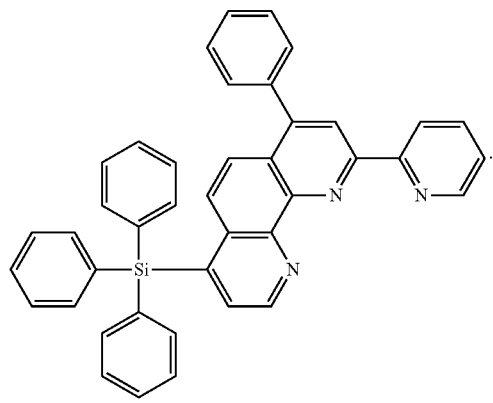

M18

The method for preparing the organic compound M18 includes the following steps:

obtaining intermediate S24 according to the method of steps (1) to (5) in Example 5;

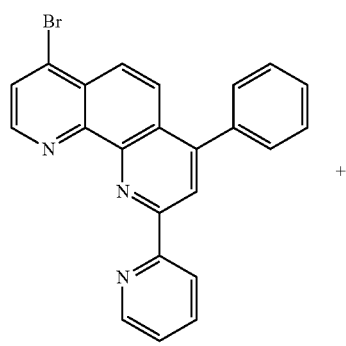

S24

(6)

+

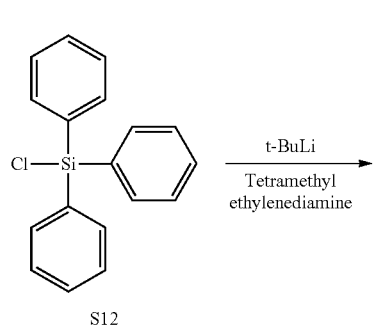

S12

-continued

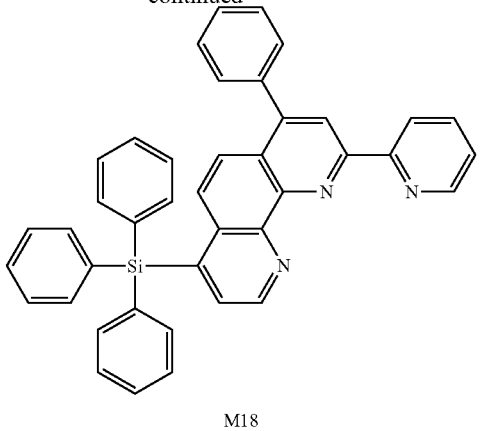

M18

Adding intermediate S24 (1 mmol) and tetramethylethylenediamine (2.5 mmol) to 90 mL of THF, reducing the temperature to −78° C. in an ethanol bath, and dropwise adding tert-butyllithium (t-BuLi, 2.5 mmol) into the reaction system within 15 min, and stirring at low temperature for 1 h. Adding S12 (2.5 mmol) at low temperature, and after stirring at low temperature for 1 h, naturally returning it to room temperature and stirring overnight. After the reaction was completed, extracting the reaction system with water and ethyl acetate, and then drying the organic phase over Na₂SO₄. Purifying the crude product by a silica gel column chromatography using a mixed solvent of n-hexane and chloroform in a volume ratio of 5:1 as an eluent, and finally purifying to obtain a solid desired product M18 (0.82 mmol, yield 82%).

The structure of the desired product M18 was tested: MALDI-TOF-MS (m/z) obtained by Matrix assisted laser desorption ionization time-of-flight mass spectrometry: $C_{41}H_{29}N_3Si$, calculated value: 591.77, tested value: 591.21.

Elemental analysis: Theoretical value: C83.21, H4.94, N7.10, Si4.75; tested value: C83.22, H4.93, N7.11, Si4.74.

¹H-NMR (400 MHz, CDCl₃): δ (ppm) 7.12 (m, 1H), 7.22 (m, 1H), 7.32 (m, 2H), 7.36 (m, 9H), 7.43 (m, 1H), 7.48 (m, 2H), 7.54 (m, 7H), 7.66-7.68 (m, 2H), 8.50 (m, 1H), 8.59-8.62 (m, 2H), 8.91 (m, 1H).

Comparative Example 1

This comparative example provides comparative compound 3, which has the following structure:

comparative compound 3

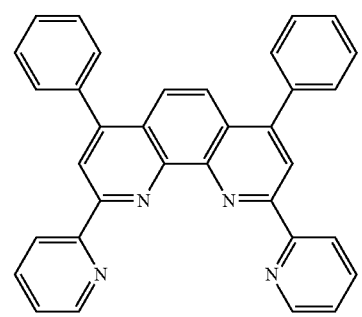

the method for preparing the comparative compound 3 includes the following steps:

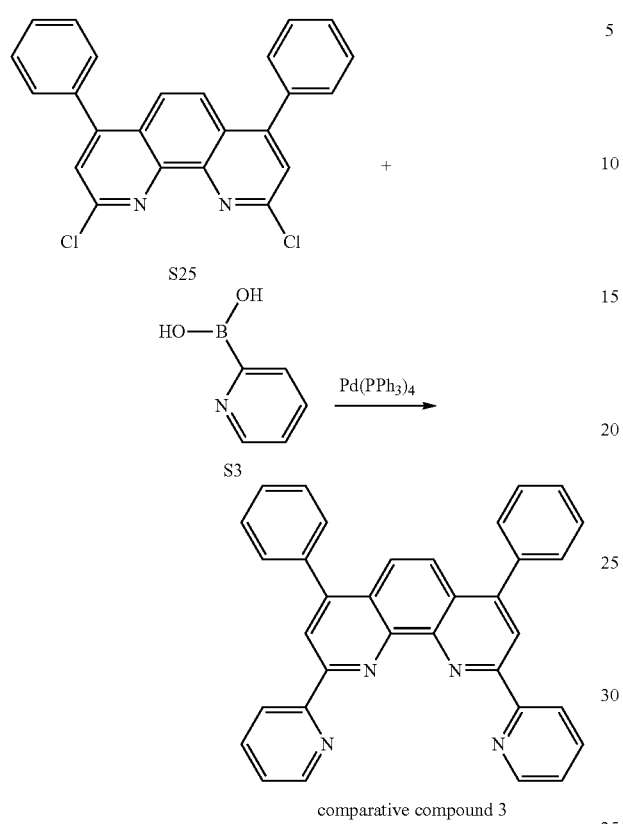

Under protection of nitrogen, dissolving intermediates S25 (1 mmol) and S3 (2.2 mmol) in 30 mL of toluene, adding tetra(triphenylphosphine)palladium Pd(PPh$_3$)$_4$ (0.1 mmol) as a catalyst, and adding 4 mL of aqueous potassium carbonate solution (2 mol/L), refluxing the same for 12 h; after the reaction was completed, extracting the reaction system with saturated brine and ethyl acetate for three times, and combining organic phases. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain a solid comparative compound 3 (0.83 mmol, yield 83%).

The structure of comparative compound 3 was tested: MALDI-TOF-MS (m/z) obtained by Matrix assisted laser desorption ionization time-of-flight mass spectrometry: $C_{34}H_{22}N_4$, calculated value: 486.57, tested value: 486.18.

Elemental analysis: Theoretical value C83.93, H4.56, N11.51; tested value: C83.91, H4.57, N11.52.

$^1$H-NMR (400 MHz, CDCl$_3$): δ (ppm) 7.12 (m, 2H), 7.22 (m, 2H), 7.32 (m, 4H), 7.48 (m, 4H), 7.55 (m, 2H), 7.66 (m, 2H), 8.50 (m, 2H), 8.59-8.62 (m, 4H).

Comparative Example 2

This comparative example provides comparative compound 4, which has the following structure:

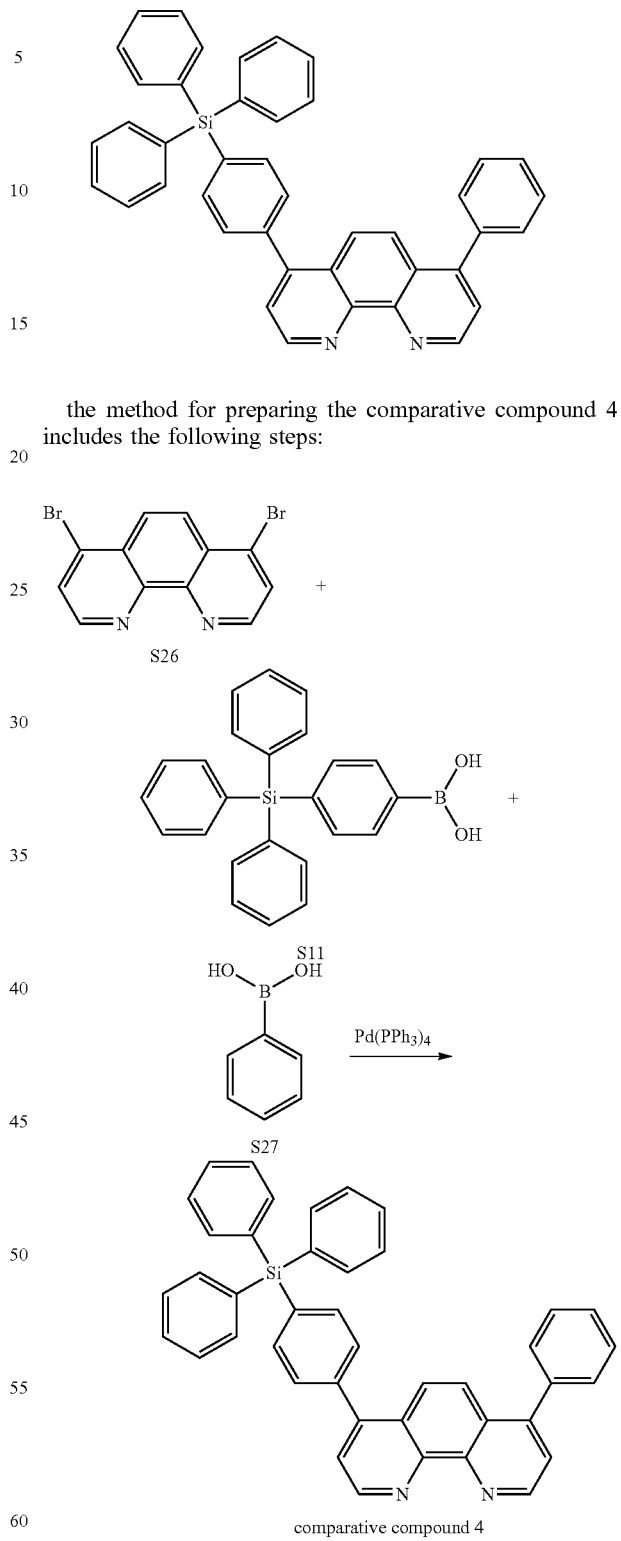

the method for preparing the comparative compound 4 includes the following steps:

Under protection of nitrogen, dissolving S26 (1 mmol), S11 (1 mmol) and S27 (1 mmol) in 30 mL of toluene, adding tetrakis(triphenylphosphine)palladium Pd(PPh$_3$)$_4$ (0.1 mmol) as a catalyst, and adding 4 mL of aqueous potassium carbonate solution (2 mol/L), refluxing same for 12 h; after the reaction was completed, extracting the reaction system with saturated brine and ethyl acetate for three times, and combining organic phases. Removing all solvents by reduced pressure distillation, and collecting a crude product. Purifying the crude product by a silica gel column chromatography using a mixed solvent of n-hexane and chloroform in a volume ratio of 5:1 as an eluent, and finally purifying to obtain a solid comparative compound 4 (0.40 mmol, yield 40%).

The structure of comparative compound 4 was tested: MALDI-TOF-MS (m/z) obtained by Matrix assisted laser desorption ionization time-of-flight mass spectrometry: $C_{42}H_{30}N_2Si$, calculated value: 590.79, tested value: 590.22.

Elemental analysis: Theoretical value: C85.39, H5.12, N4.74, Si4.75; tested value: C85.41, H5.11, N4.72, Si4.76.

$^1$H-NMR (400 MHz, CDCl$_3$): δ (ppm) 7.22 (m, 1H), 7.32 (m, 2H), 7.36 (m, 9H), 7.43 (m, 1H), 7.48 (m, 4H), 7.54 (m, 6H), 7.57-7.61 (m, 4H), 7.68 (m, 1H), 8.87 (m, 2H).

The followings are application examples of several organic compounds used in OLED devices:

Application Example 1

This application example provides an OLED device, which in sequence includes: a substrate, an ITO anode, a hole injection layer, a first hole transport layer, a second hole transport layer, a light emitting layer, a first electron transport layer, a second electron transport layer, and a cathode (silver electrode).

The preparation of the OLED device includes the following steps:

(1) cutting the glass substrate into a size of 50 mm×50 mm×0.7 mm, sonicating in acetone, isopropanol and deionized water for 30 minutes, respectively, and then cleaning in ozone for 10 min; mounting the obtained glass substrate with ITO anode to a vacuum deposition apparatus;

(2) vacuum-evaporating the hole injection layer material compound 1 on the ITO anode layer to a thickness of 5 nm under a vacuum degree of $2×10^{-6}$ Pa;

(3) evaporating compound 2 on the hole injection layer as the first hole transport layer to a thickness of 90 nm;

(4) vacuum-evaporating compound 3 on the first hole transport layer as a second hole transport layer to a thickness of 10 nm;

(5) vacuum-evaporating a light-emitting layer on the second hole transport layer, and the compound 4 was used as a host material of the light-emitting layer, and compound 5 was used as a doping material of the light-emitting layer, the doping ratio was 3% and the thickness was 30 nm;

(6) vacuum-evaporating compound 6 on the light-emitting layer as a first electron transport layer to a thickness of 5 nm;

(7) vacuum-evaporating the organic compound M16 provided by the present disclosure and the doped metal ytterbium (the mass ratio of both is 97:3) on the first electron transport layer as a second electron transport layer with a thickness of 30 nm;

(8) vacuum-evaporating a silver electrode on the second electron transport layer as a cathode to a thickness of 100 nm.

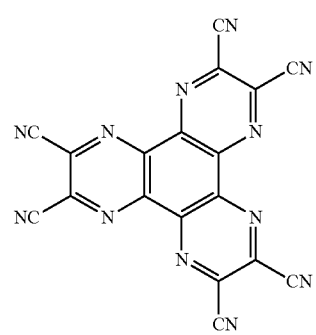

compound1

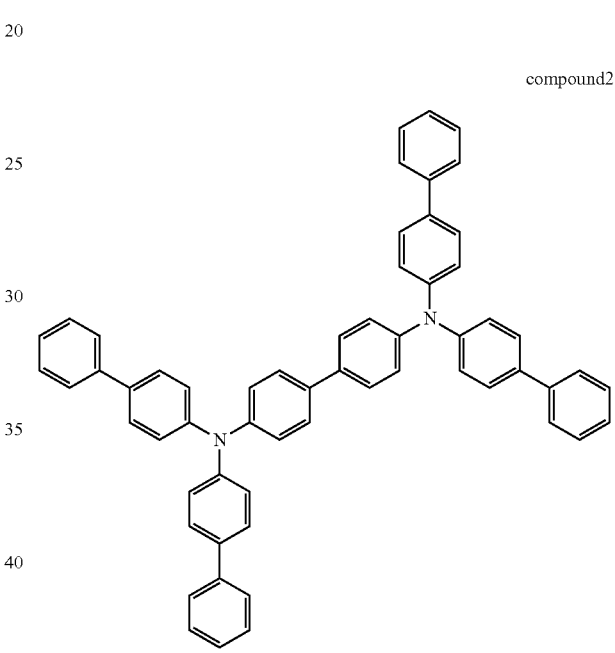

compound2

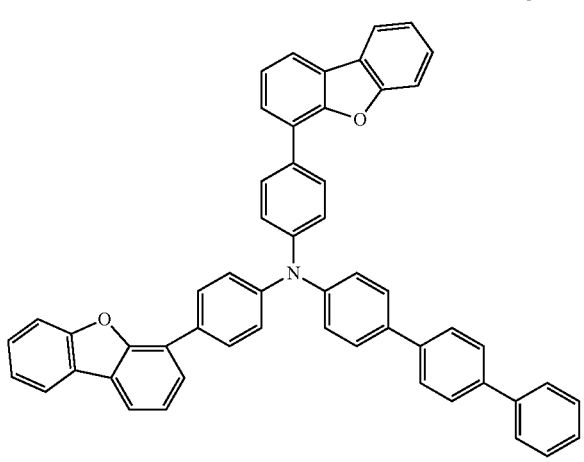

compound3 compound4

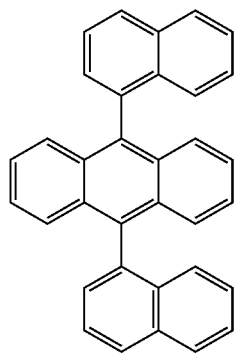

compound5

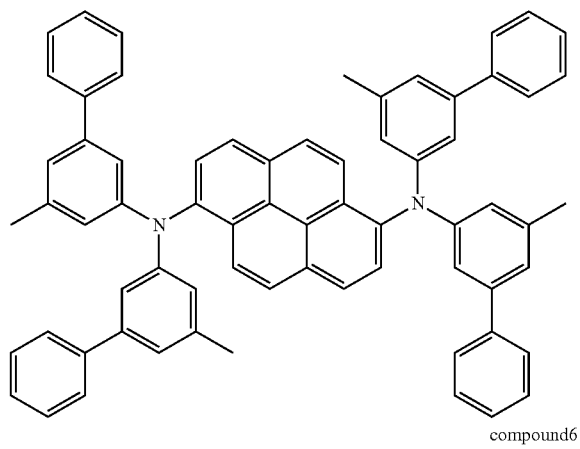

compound6

Application Example 2

This application example differs from the application example 1 in that M16 in the step (6) is replaced with an equal amount of M19.

Application Example 3

This application example differs from the application example 1 in that M16 in the step (6) is replaced with an equal amount of M2.

Application Example 4

This application example differs from the application example 1 in that M16 in the step (6) is replaced with an equal amount of M11.

Application Example 5

This application example differs from the application example 1 in that M16 in the step (6) is replaced with an equal amount of M17.

Application Example 6

This application example differs from the application example 1 in that M16 in the step (6) is replaced with an equal amount of M18.

Comparative Example 1

This comparative example differs from the application example 1 in that M16 in the step (6) is replaced with an equal amount of comparative compound 1.

Comparative Example 2

This comparative example differs from the application example 1 in that M16 in the step (6) is replaced with an equal amount of comparative compound 2.

Comparative Example 3

This comparative example differs from the application example 1 in that M16 in the step (6) is replaced with an equal amount of comparative compound 3.

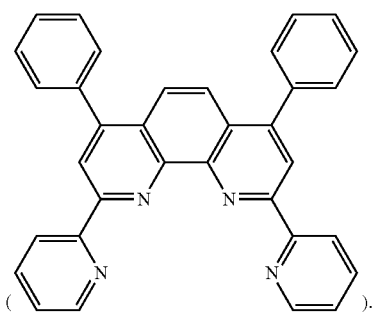 [SMILES: c1ccc(-c2cc(-c3ccccn3)nc3c2ccc2c(-c4ccccc4)cc(-c4ccccn4)nc23)cc1]

Comparative Example 4

This comparative example differs from the application example 1 in that M16 in the step (6) is replaced with an equal amount of comparative compound 4.

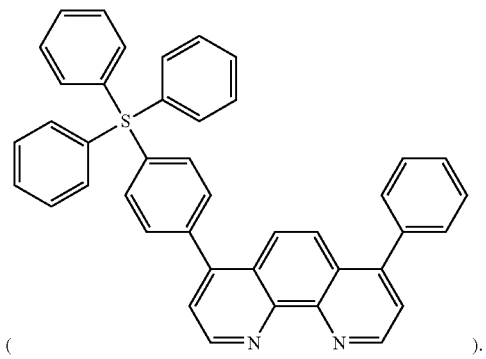 [SMILES: c1ccc(-c2ccnc3c2ccc2c(-c4ccc(S(c5ccccc5)(c5ccccc5)c5ccccc5)cc4)ccnc23)cc1]

Performance Test:
(1) Simulation Calculation of Compounds:

Using density functional theory (DFT), for the organic compounds provided by the present disclosure, Gaussian 09 program package (Guassian Inc.) was used to optimize and calculate the distribution condition of molecular frontier orbitals HOMO and LUMO at B3LYP/6-31 G (d) calculation level. At the same time, based on time-dependent density functional theory (TD-DFT), the singlet energy level $S_1$ and the triplet energy level $T_1$ of the compound molecule were simulated and calculated. The results are shown in Table 1.

TABLE 1

| Examples | Organic compounds | HOMO (eV) | LUMO (eV) | S1 (eV) | $T_1$ (eV) | $E_g$ (eV) |
|---|---|---|---|---|---|---|
| Example 1 | M16 | 5.72 | 1.64 | 3.60 | 2.54 | 4.08 |
| Example 2 | M19 | 5.74 | 1.65 | 3.54 | 2.54 | 4.09 |
| Example 3 | M2 | 5.71 | 1.59 | 3.63 | 2.57 | 4.12 |
| Example 4 | M11 | 5.67 | 1.52 | 3.65 | 2.59 | 4.15 |
| Example 5 | M17 | 5.83 | 1.59 | 3.70 | 2.62 | 4.24 |
| Example 6 | M18 | 5.84 | 1.60 | 3.63 | 2.62 | 4.24 |
| Comparative example 1 | Comparative Compound 1 | 5.98 | 1.47 | 3.91 | 2.72 | 4.51 |
| Comparative example 2 | Comparative Compound 2 | 5.79 | 1.28 | 3.86 | 2.74 | 4.51 |
| Comparative example 3 | Comparative Compound 3 | 5.73 | 1.84 | 3.45 | 2.43 | 3.89 |
| Comparative example 4 | Comparative Compound 4 | 5.96 | 1.48 | 3.88 | 2.71 | 4.48 |

From the data in Table 1, it can be obtained that the organic compound $S_1$ values provided in Examples 1-6 of the present disclosure have no absorption in the visible light field, and the LUMO (eV) value is between 1.4 and 2.0 eV, thus it is suitable to be used as the common layer material for electron transport.

(2) Performance Evaluation of OLED Devices:

The current of the OLED device at different voltages was measured with a Keithley 2365A digital nanovoltmeter, and then the current density at different voltages of the OLED device was obtained by dividing the current by the light-emitting area; the OLED device was tested for luminance and radiant energy flux density at different voltages using a Konicaminolta CS-2000 spectroradiometer; according to the current density and luminance of the OLED device at different voltages, working voltage V and current efficiency (Cd/A) at the same current density (10 mA/cm²) were obtained, $V_{on}$ is the turn-on voltage at a luminance of 1 cd/m²; the lifetime T95 was obtained by measuring the time when the luminance of the OLED device reached 95% of the initial luminance (under a test condition of 50 mA/cm²); the test data are shown in Table 2.

TABLE 2

| OLED device | Electron transport layer material | $V_{on}$ (V) | V (V) | Current efficiency (Cd/A) | Lifetime $LT_{95}$ (h) |
|---|---|---|---|---|---|
| Application example 1 | M16 | 2.65 | 3.97 | 6.69 | 68 |
| Application example 2 | M19 | 2.68 | 3.98 | 6.62 | 65 |
| Application example 3 | M2 | 2.64 | 3.92 | 6.76 | 70 |
| Application example 4 | M11 | 2.70 | 4.01 | 6.57 | 63 |
| Application example 5 | M17 | 2.73 | 4.03 | 6.46 | 62 |
| Application example 6 | M18 | 2.76 | 4.05 | 6.25 | 63 |
| Comparative example 1 | Comparative Compound 1 | 2.85 | 4.12 | 5.45 | 46 |
| Comparative example 2 | Comparative Compound 2 | 2.82 | 4.11 | 5.91 | 47 |
| Comparative example 3 | Comparative Compound 3 | 2.88 | 4.15 | 5.72 | 49 |
| Comparative example 4 | Comparative Compound 4 | 2.79 | 4.09 | 5.82 | 52 |

It can be obtained from the data in Table 2 that the OLED device prepared based on the organic compounds provided in Examples 1-6 of the present disclosure as the material of the electron transport layer has a lower turn-on voltage and working voltage, higher current efficiency and longer working life relative to comparative compound 1, comparative compound 2, comparative compound 3 and comparative compound 4. This benefits from the molecular structure designed by the present disclosure having a multidentate nitrogen-containing ligand and being able to complex with metal Yb. Therefore, the heat and electric field generated during the device driving process can alleviate the metal movement. In addition, among the molecules designed in this application, the o-phenanthroline skeletal structure and a plurality of large sterically hindered substituents cooperate with each other, so that the organic compound has a large rigid distortion, and avoids the increase in intermolecular attraction caused by excessive planar structure of the conventional phenanthroline compound. The organic compound has a suitable spatial structure and molecular weight, and its molecular weight is in the range of 600-1200 g/mol, which is helpful for controlling the evaporation rate and can suppress the accumulation caused by the increase in intermolecular attraction. These factors work together to reduce the turn-on voltage of the OLED device, reduce the operating voltage of the OLED device, improve efficiency, and increase lifetime.

Another embodiment of the present disclosure provides an organic light emitting display device, including the organic light emitting display panel as described above.

In the present disclosure, the OLED device may be used in an organic light emitting display device, and the organic light emitting display device may be a mobile phone display screen, a computer display screen, a television display screen, a smart watch display screen, a smart car display panel, a VR or AR helmet display screen, display screens of various smart devices.

Applicant has stated that although an organic compound, an electron transport material, and an application thereof of the present disclosure have been described by the above Examples, the present disclosure is not limited to the above processing steps, that is to say, it is not meant that the present disclosure has to be implemented depending on the above processing steps. Any improvements made to the present disclosure, equivalent replacements and addition of adjuvant ingredients to the raw materials selected in the present disclosure, and selections of the specific implementations, all fall within the protection scope and the disclosure scope of the present disclosure.

What is claimed is:

1. An organic compound, wherein, the organic compound has a structure as shown in Formula (I):

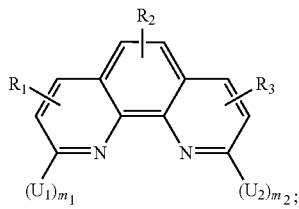

Formula I wherein, $m_1$ and $m_2$ are each independently 0 or 1, and $m_1+m_2 \geq 1$;

$U_1$ and $U_2$ are each independently selected from any one of the following groups:

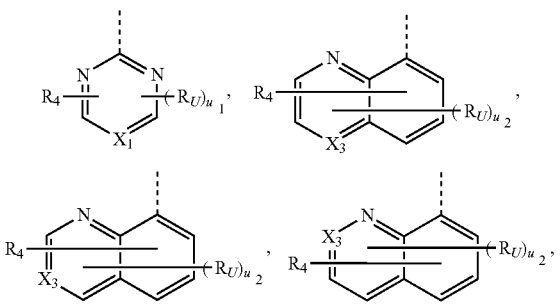

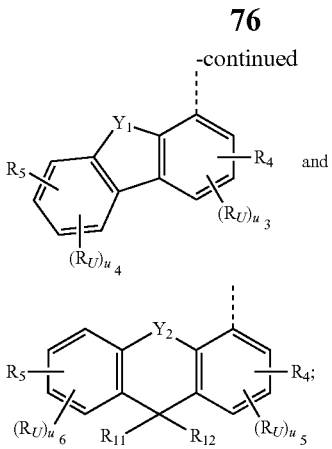

$X_1$, $X_2$ and $X_3$ are each independently selected from N or C—H;

$Y_1$ and $Y_2$ are each independently selected from O, S or N—$R_N$;

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted adamantyl, a substituted or unsubstituted C6-C40 aryl, and a substituted or unsubstituted C3-C40 heteroaryl;

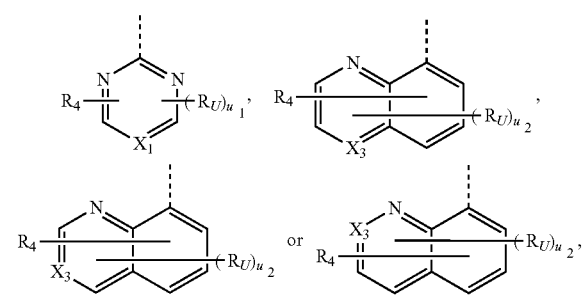

when $U_1$ and $U_2$ are selected from
at least one of $R_1$, $R_2$, $R_3$, and $R_4$ is a silicon-containing substituent;

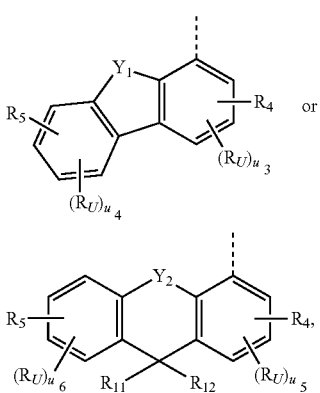

when any one of $U_1$ and $U_2$ is at least one of $R_1$, $R_2$, $R_3$, $R_4$, and $R_5$ is a silicon-containing substituent;

$R_U$ and $R_N$ are each independently selected from any one of hydrogen, deuterium, tritium, a C1-C30 straight or branched alkyl, a C1-C30 alkoxyl, a substituted or unsubstituted C6-C40 aryl, and a substituted or unsubstituted C3-C40 heteroaryl;

$R_{11}$ and $R_{12}$ are each independently selected from any one of hydrogen, deuterium, tritium, a C1-C30 straight or branched alkyl, a C1-C30 alkoxyl, a substituted or unsubstituted C6-C40 aryl, and a substituted or unsubstituted C3-C40 heteroaryl;

$u_1$, $u_4$, and $u_6$ are each independently selected from an integer of 0-4, $u_2$ is selected from an integer of 0-6, $u_3$ and $u_5$ are each independently selected from an integer of 0-3;

the dotted line represents linking position of a group, wherein the silicon-containing substituent has a structure as shown in Formula II:

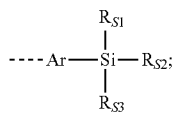

Formula II wherein, Ar is selected from a single bond or a substituted or unsubstituted C6-C30 arylene group;

$R_{S1}$, $R_{S2}$ and $R_{S3}$ are each independently selected from any one of a C2-C30 straight or branched alkyl, a C1-C30 alkoxyl, a substituted or unsubstituted C6-C40 aryl, a substituted or unsubstituted C3-C40 heteroaryl;

the dotted line represents linking position of a group;

when a substituent is present in the above groups, the substituent is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

2. The organic compound according to claim 1, wherein, a substituent in the substituted aryl and the substituted heteroaryl is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

3. The organic compound according to claim 1, wherein, $R_1$, $R_2$, $R_3$, $R_4$ and $R_5$ are each independently selected from any one of hydrogen, deuterium, tritium, a silicon-containing substituent, a substituted or unsubstituted C6-C20 aryl, and a substituted or unsubstituted C3-C20 heteroaryl;

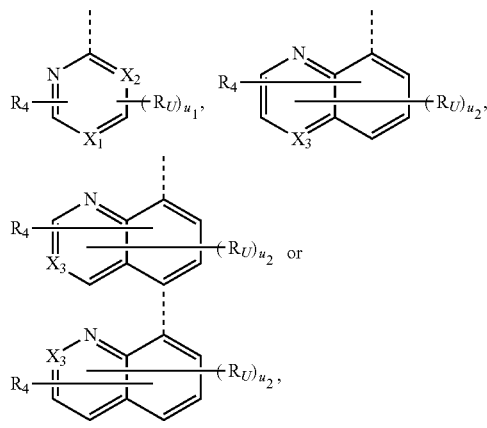

when $U_1$ and $U_2$ are selected from at least one of $R_1$, $R_2$, $R_3$, and $R_4$ is a silicon-containing substituent;

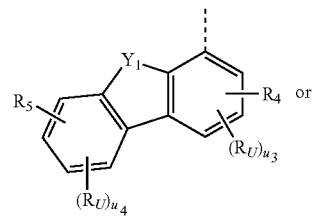

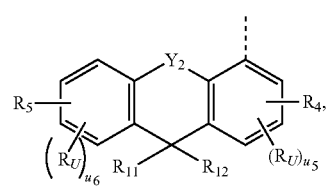

when any one of $U_1$ and $U_2$ is at least one of $R_1$, $R_2$, $R_3$, $R_4$, and $R_5$ is a silicon-containing substituent;

when a substituent is present in the above groups, the substituent is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

4. The organic compound according to claim 1, wherein, $U_1$ and $U_2$ are each independently selected from any one of the following groups:

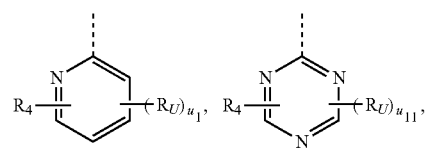

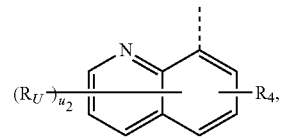

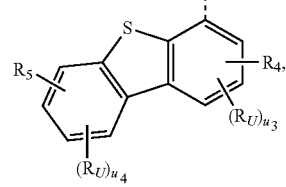

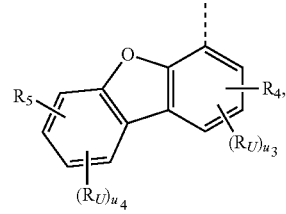

-continued

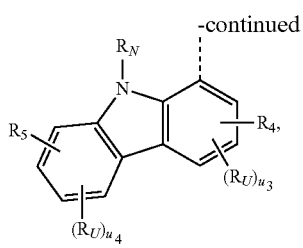

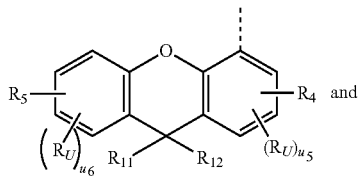

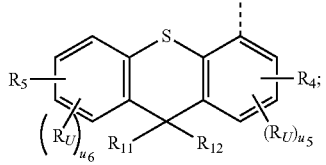

wherein, each of $R_4$, $R_5$, $R_U$, $R_N$, $R_{11}$, $R_{12}$, $u_1$, $u_2$, $u_3$, $u_4$, $u_5$, and $u_6$ independently has the same limited range as that in claim 1;

$u_{11}$ is an integer of 0-2;

the dotted line represents linking position of a group.

5. The organic compound according to claim 4, wherein, the $U_1$ and $U_2$ are each independently selected from any one of the following groups:

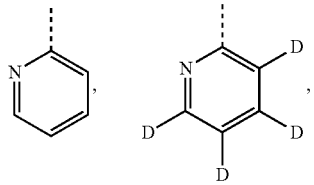

-continued wherein, the dotted line represents linking position of a group.

6. The organic compound according to claim 1, wherein, the organic compound has a structure as shown in any one of Formula I-1 to Formula I-4:

Formula I-1

Formula I-2

Formula I-3

Formula I-4

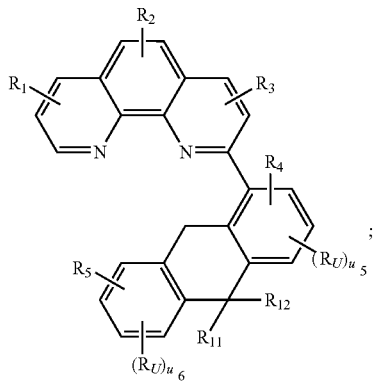

wherein, each of $X_1$, $X_2$, $Y_1$, $Y_2$, $R_U$, $R_{11}$, $R_{12}$, $u_1$, $u_2$, $u_3$, $u_4$, $u_5$, and $u_6$ independently has the same limited range as that in claim 1;

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted C6-C40 aryl, and a substituted or unsubstituted C3-C40 heteroaryl;

in Formula I-1 and Formula I-2, at least one of $R_1$, $R_2$, $R_3$, and $R_4$ is a silicon-containing substituent;

in Formula I-3 and Formula I-4, at least one of $R_1$, $R_2$, $R_3$, $R_4$, and $R_5$ is a silicon-containing substituent;

when a substituent is present in the above groups, the substituent is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

7. The organic compound according to claim 1, wherein, the organic compound has a structure as shown in any one of Formula I-5 to Formula I-11:

Formula I-5

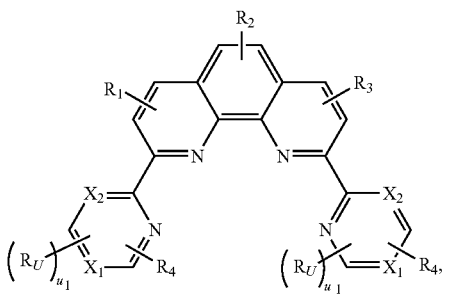

Formula I-6

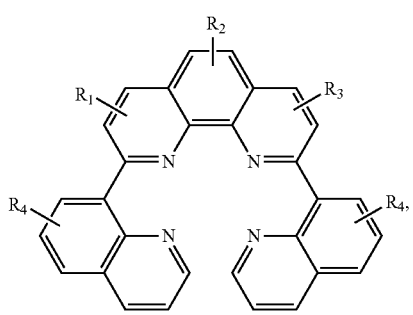

Formula I-7

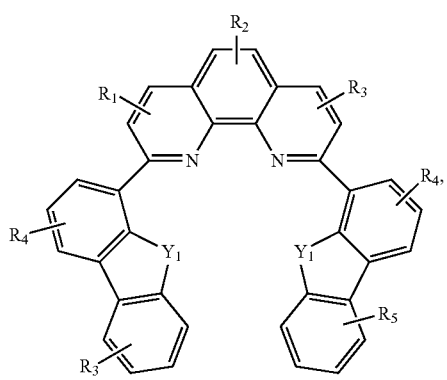

Formula I-8

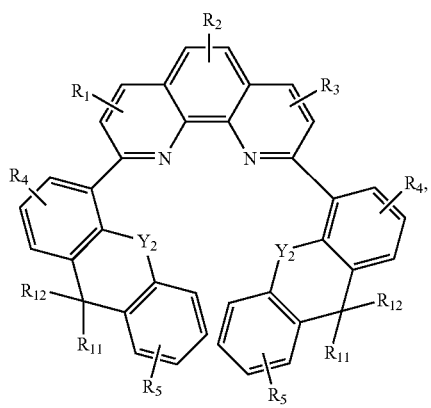

Formula I-9

Formula I-10

, and

Formula I-11

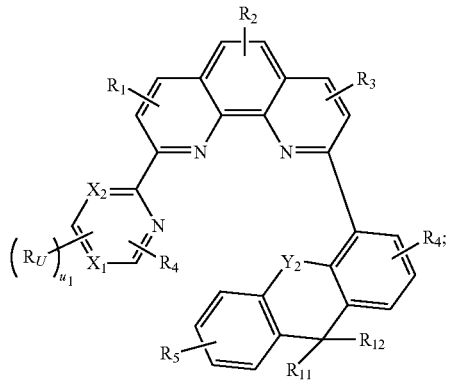

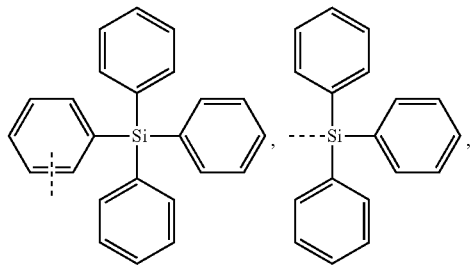

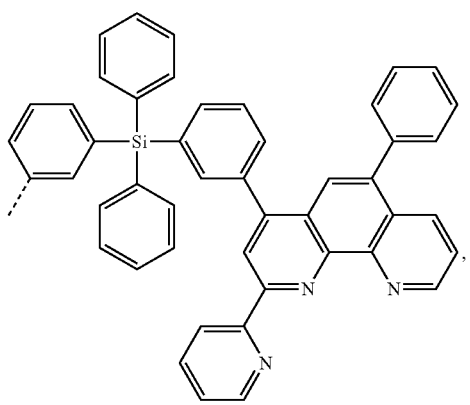

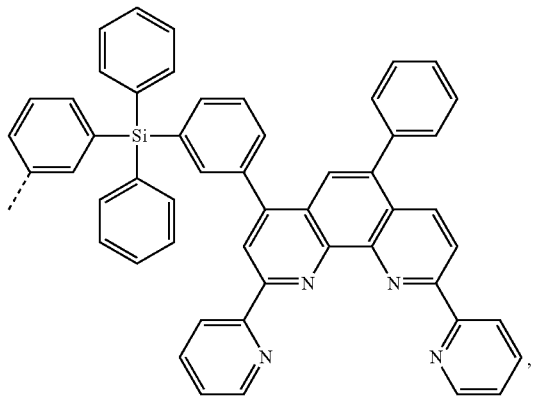

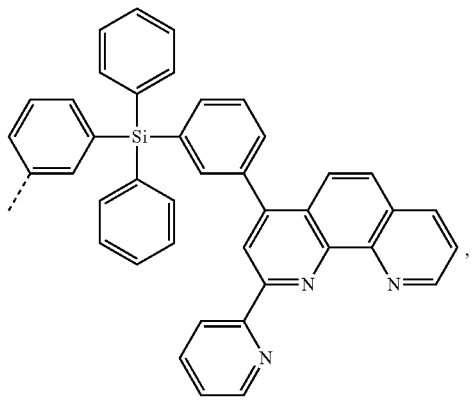

wherein, each of $X_1$, $X_2$, $Y_1$, $Y_2$, $R_U$, $R_{11}$, $R_{12}$, and $u_1$ independently has the same limited range as that in claim 1;

$R_1$, $R_2$, $R_3$, $R_4$ and $R_5$ are each independently selected from any one of hydrogen, deuterium, tritium, a silicon-containing substituent, a C1-C30 straight or branched alkyl, a C1-C30 alkoxyl, a substituted or unsubstituted C6-C40 aryl, and a substituted or unsubstituted C3-C40 heteroaryl;

in Formula I-5, Formula I-6, and Formula I-9, at least one of $R_1$, $R_2$, $R_3$, and $R_4$ is a silicon-containing substituent;

in Formula I-7, Formula I-8, Formula I-10, and Formula I-11, at least one of $R_1$, $R_2$, $R_3$, $R_4$, and $R_5$ is a silicon-containing substituent;

when a substituent is present in the above groups, the substituent is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

8. The organic compound according to claim 1, wherein, at least one of $R_1$, $R_2$ and $R_3$ is a silicon-containing substituent.

9. The organic compound according to claim 8, wherein, at least one of $R_1$ and $R_3$ is a silicon-containing substituent.

10. The organic compound according to claim 1, wherein, Ar is selected from a single bond or a C6-C20 arylene group.

11. The organic compound according to claim 1, wherein, $R_{S1}$, $R_{S2}$ and $R_{S3}$ are each independently selected from any one of a substituted or unsubstituted C6-C40 aryl and a substituted or unsubstituted C3-C40 heteroaryl;

when a substituent is present in the above groups, the substituent is selected from at least one of deuterium, tritium, a C1-C10 straight or branched alkyl, an adamantyl, a C6-C20 aryl, a C3-C20 heteroaryl, a C1-C10 alkoxyl, a C6-C20 arylamino, a C3-C20 cycloalkyl, and a halogen.

12. The organic compound according to claim 1, wherein, the silicon-containing substituent is selected from any one of the following groups:

85
-continued
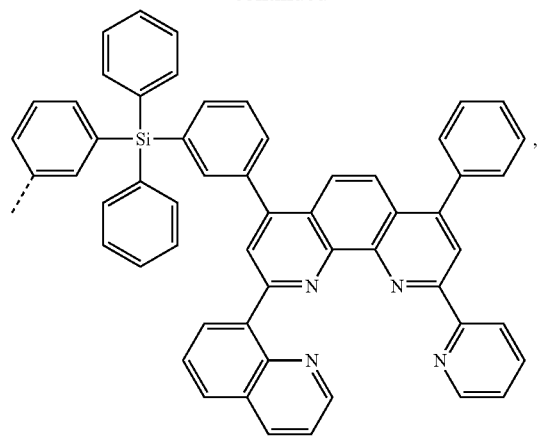
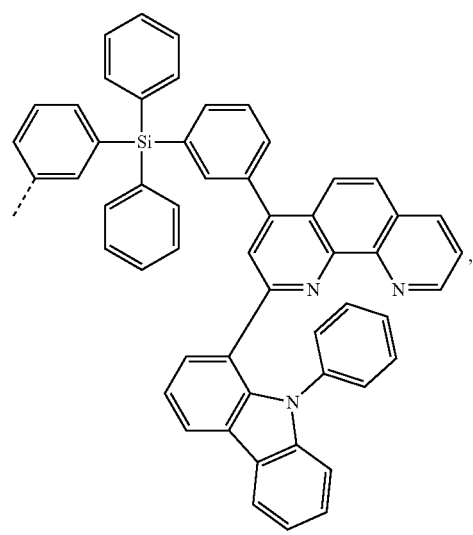
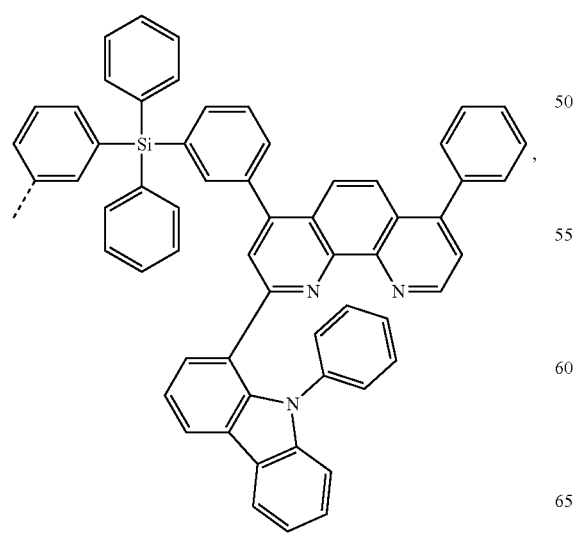
86
-continued
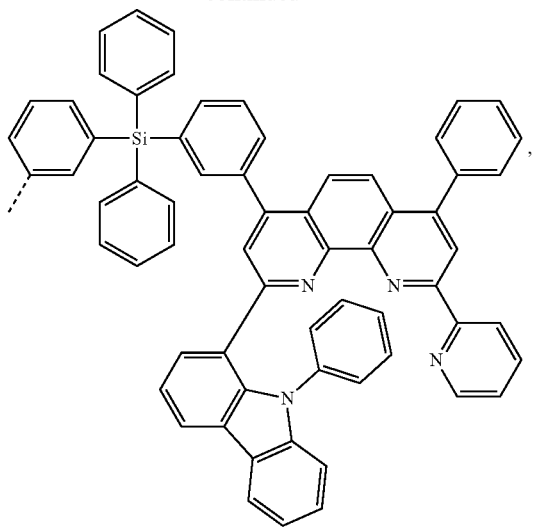
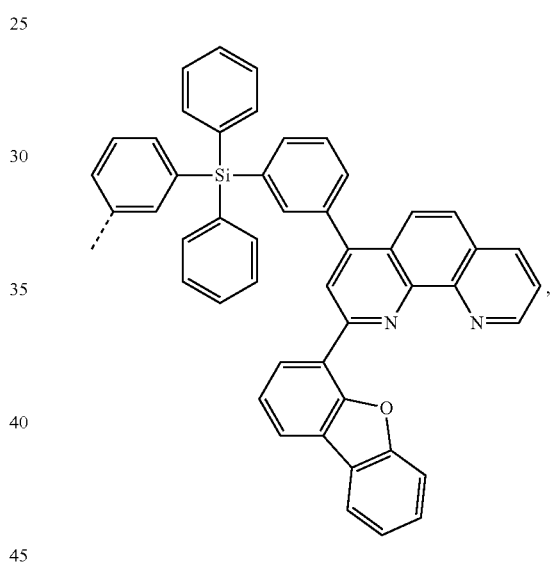
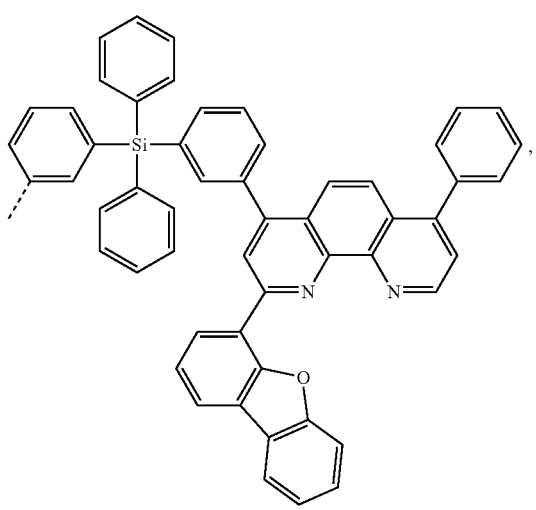

87
-continued
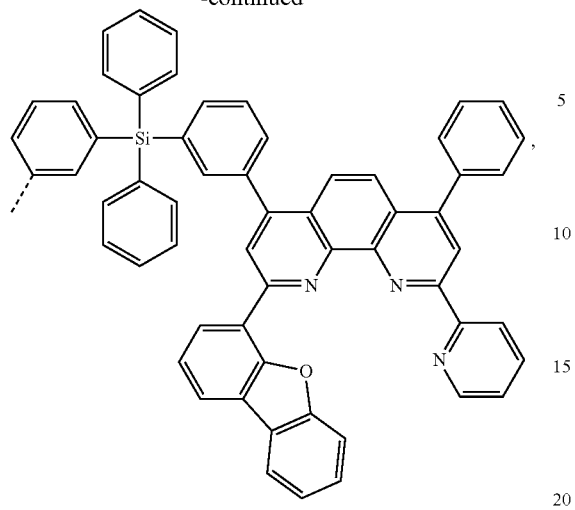
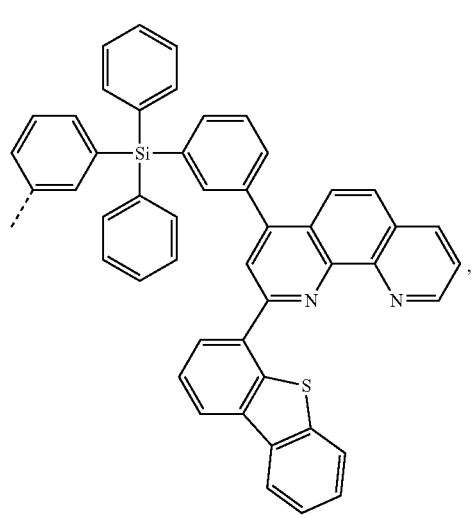
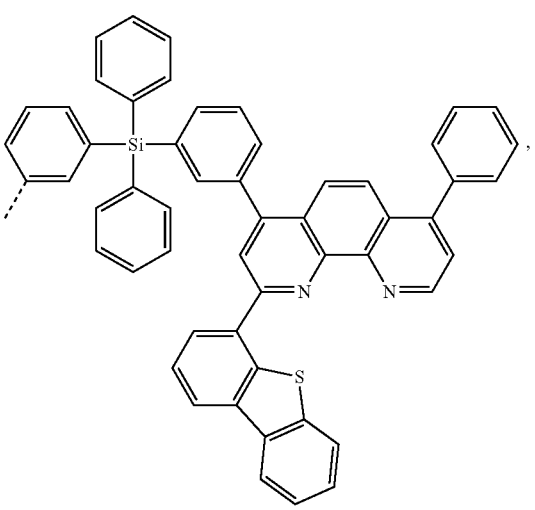
88
-continued
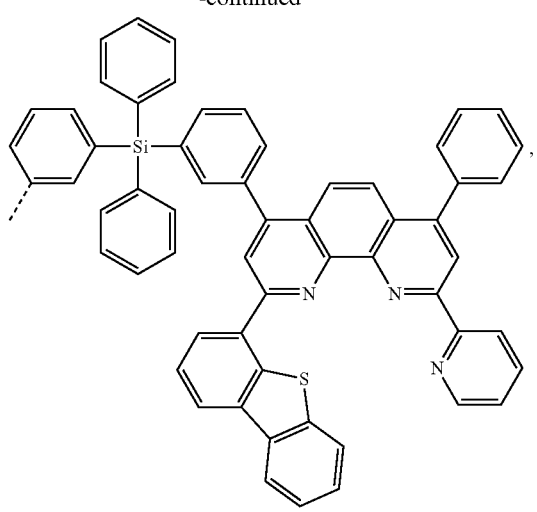
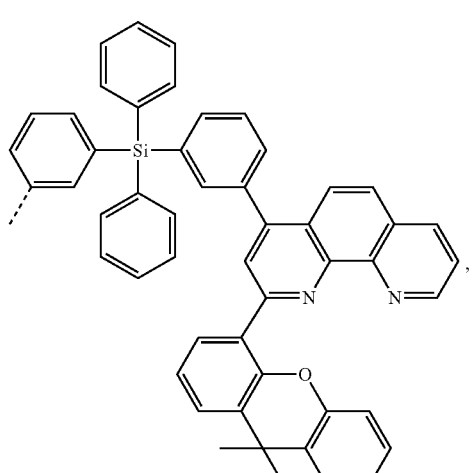
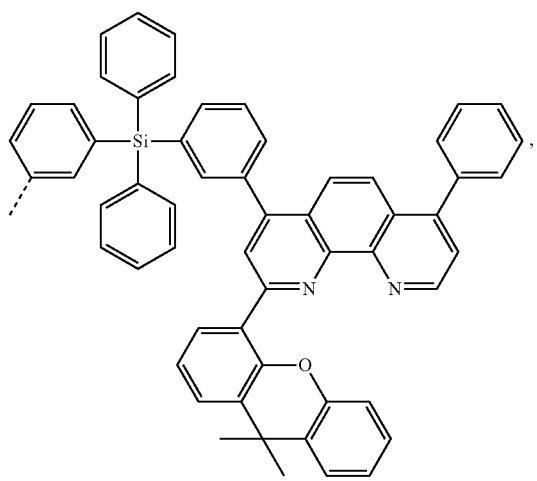

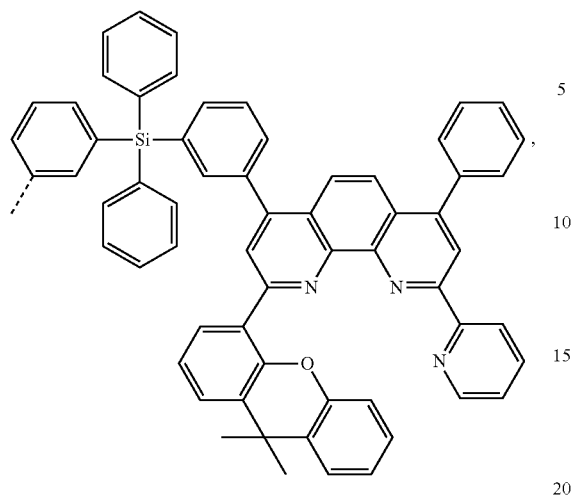
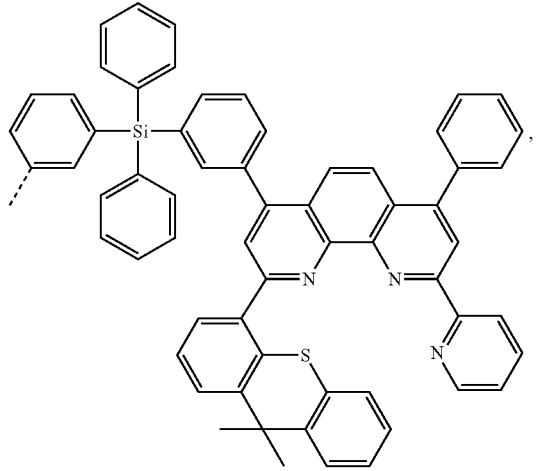
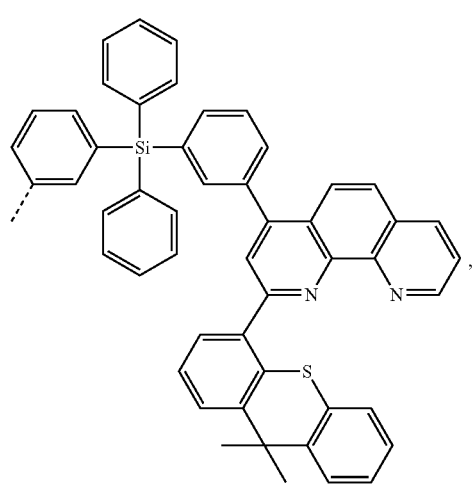
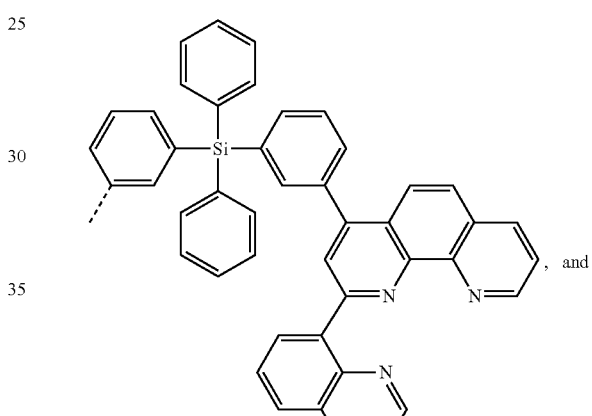
, and
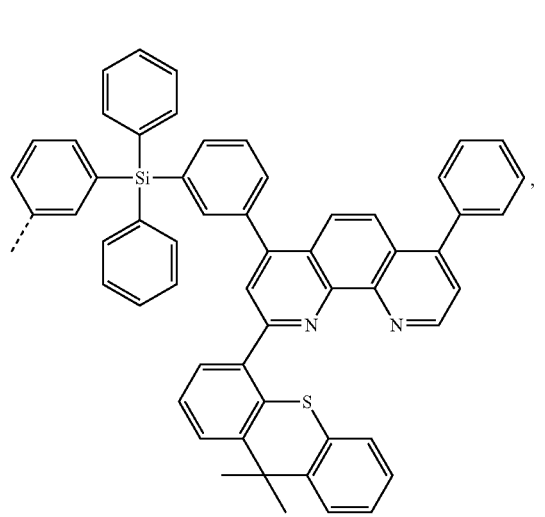
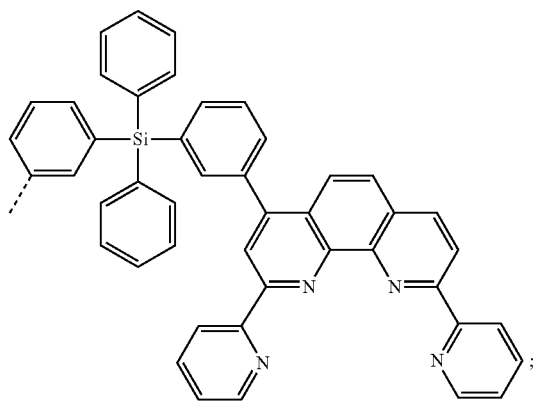
;
wherein, the dotted line represents linking position of a group.
13. The organic compound according to claim 1, wherein, the organic compound is selected from any one of the following compounds M1 to M41:

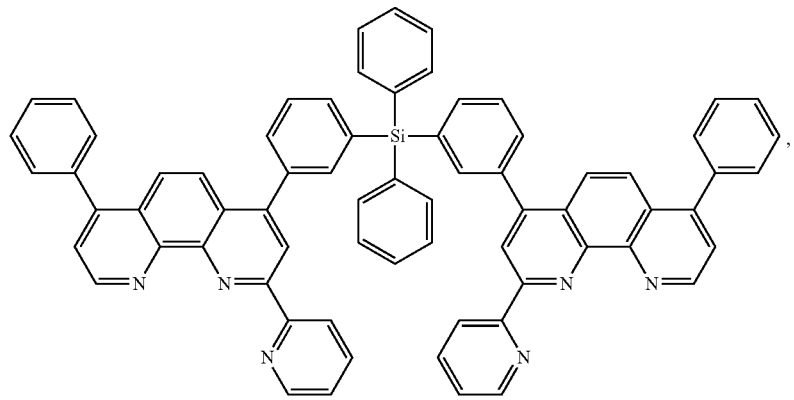
M1
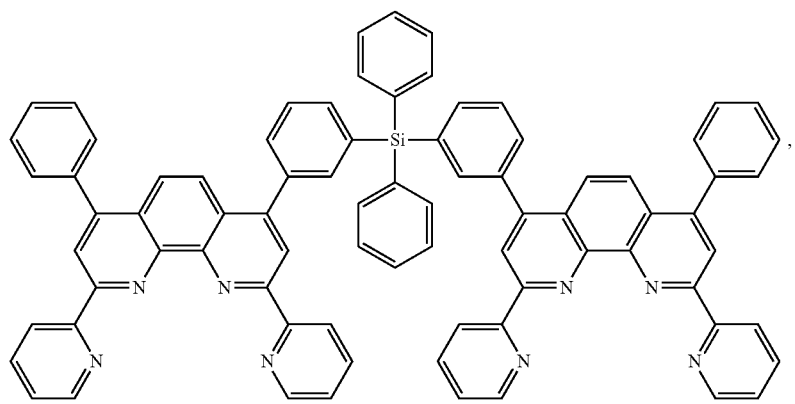
M2
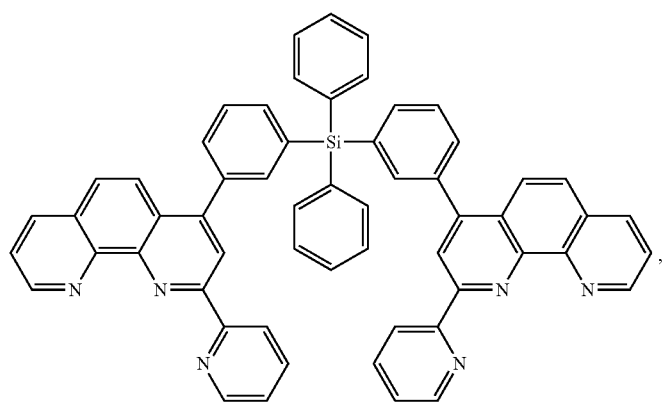
M3
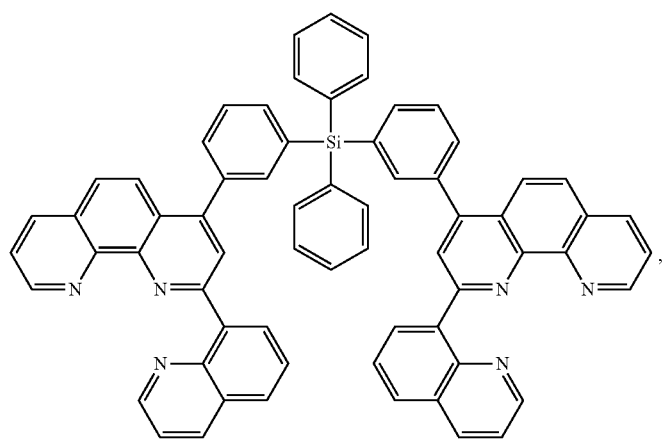
M4

M5
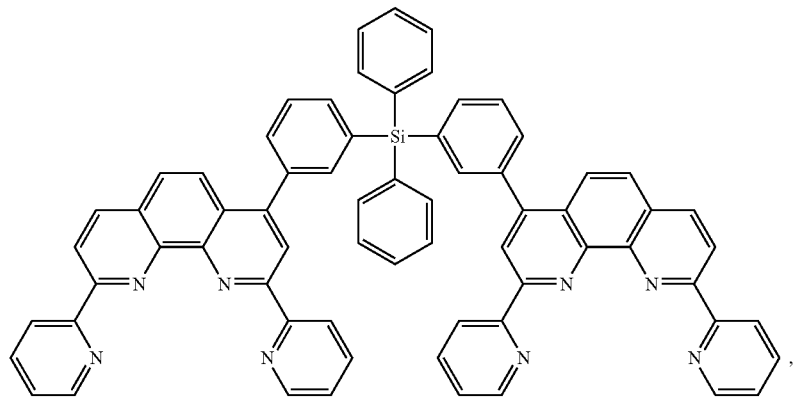
M6 M7
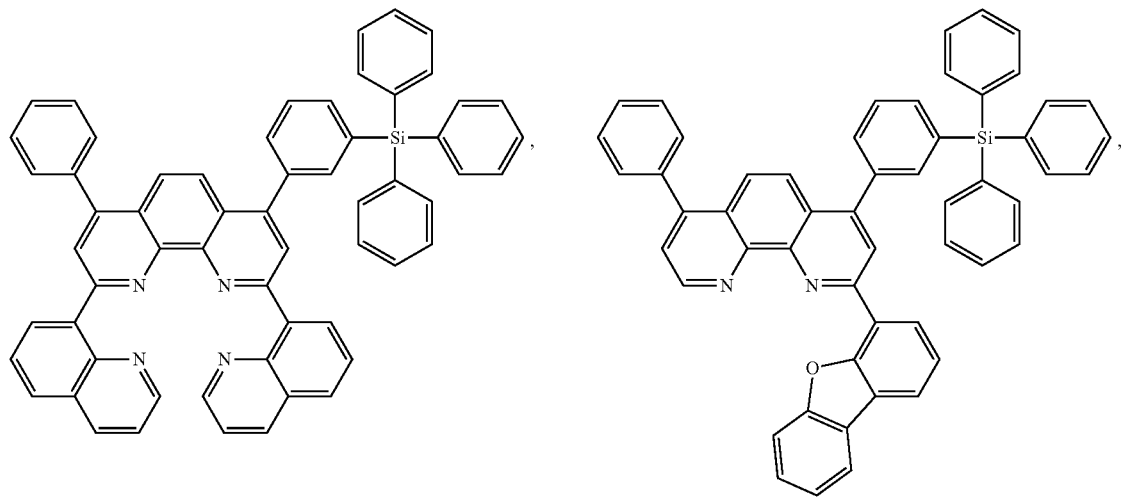
M8
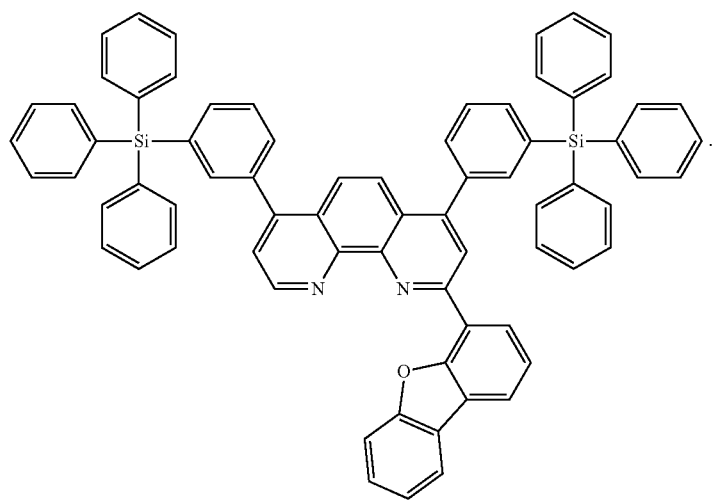

-continued
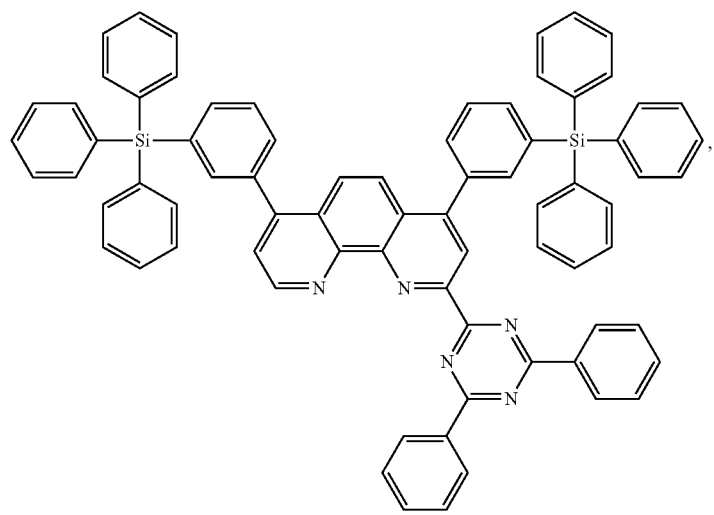
M9
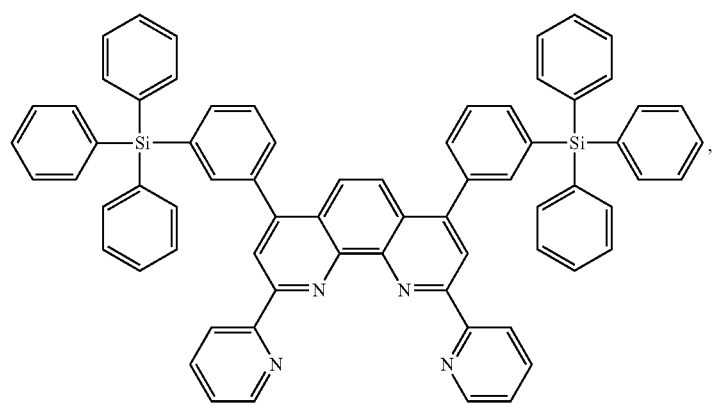
M10
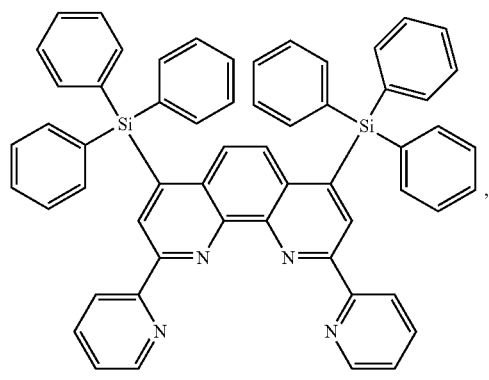
M11
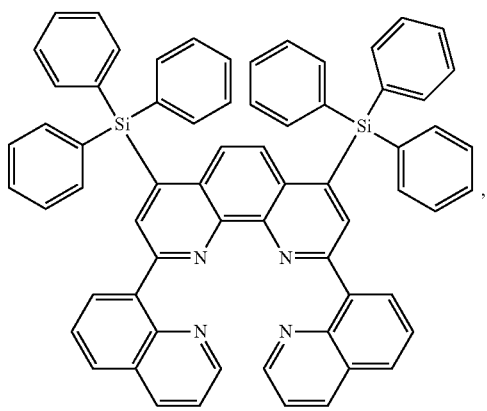
M12

-continued
M13
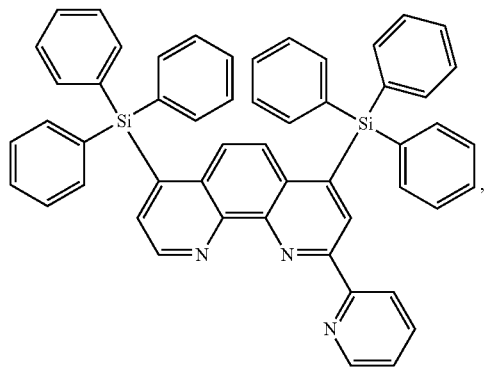
M14
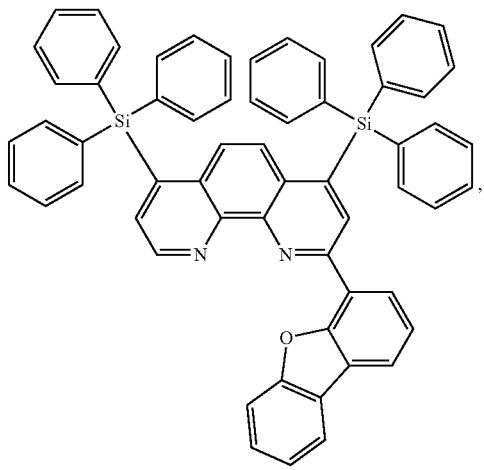
M15
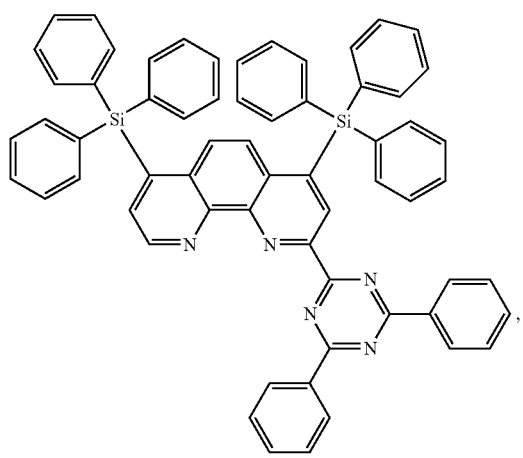
M16
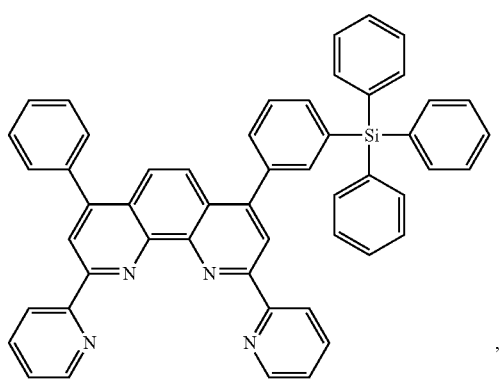
M17
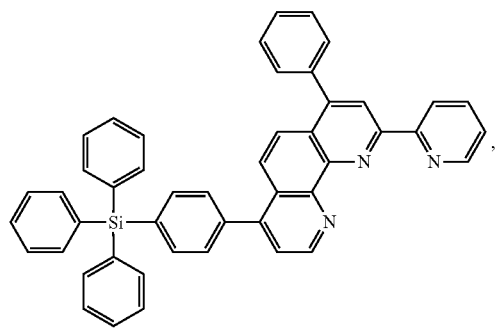
M18
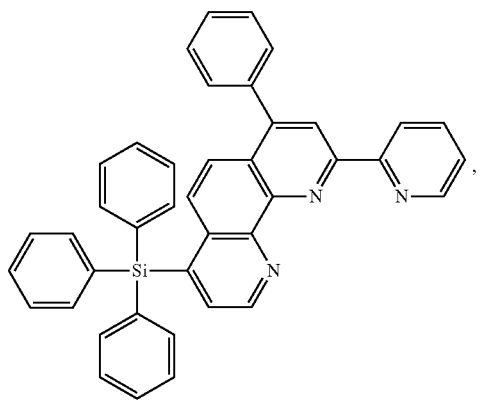

M19
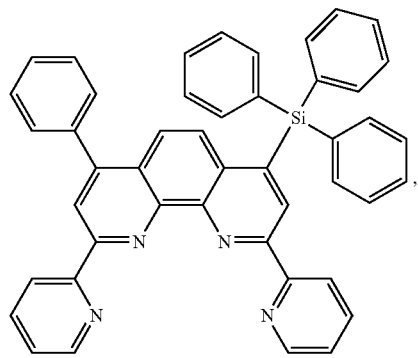
M20
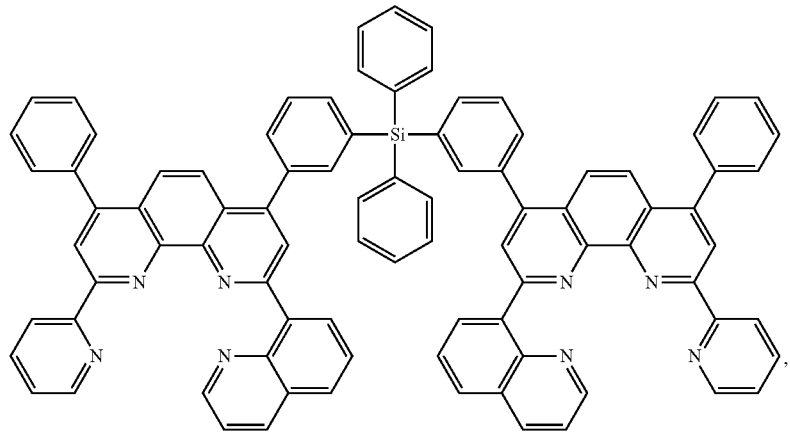
M21
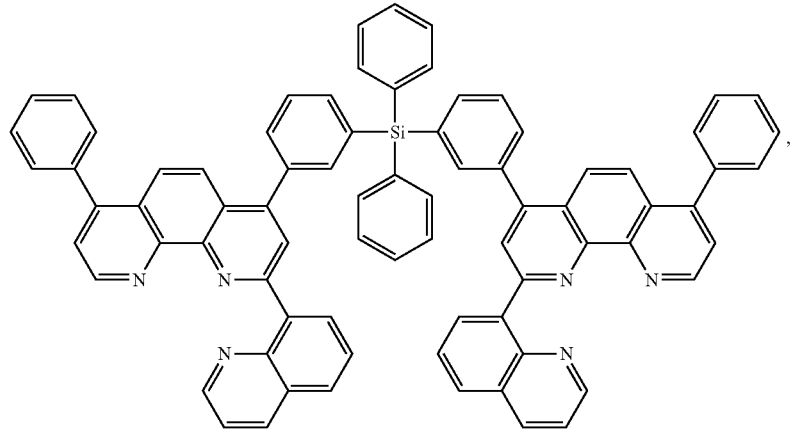

-continued
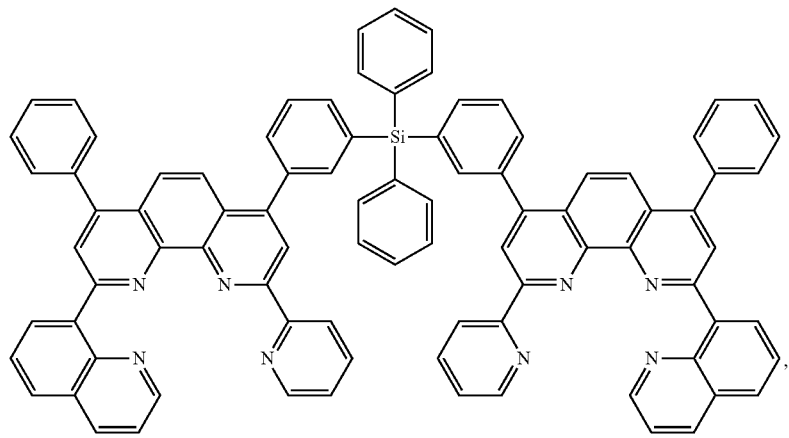
M22
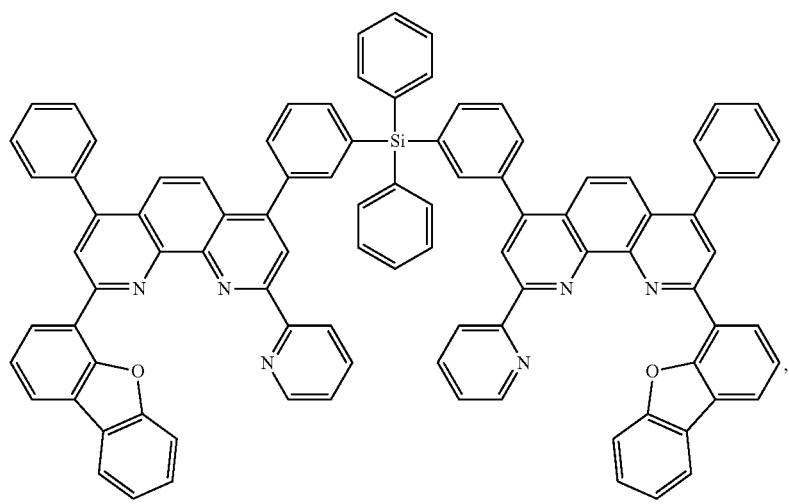
M23
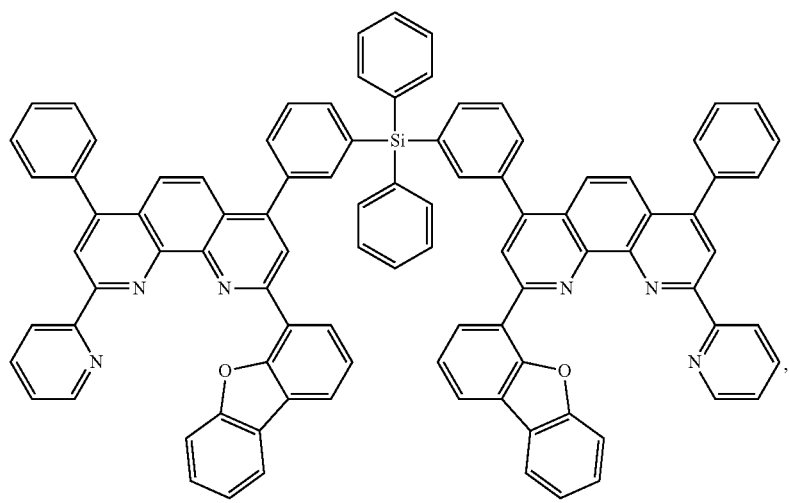
M24

-continued
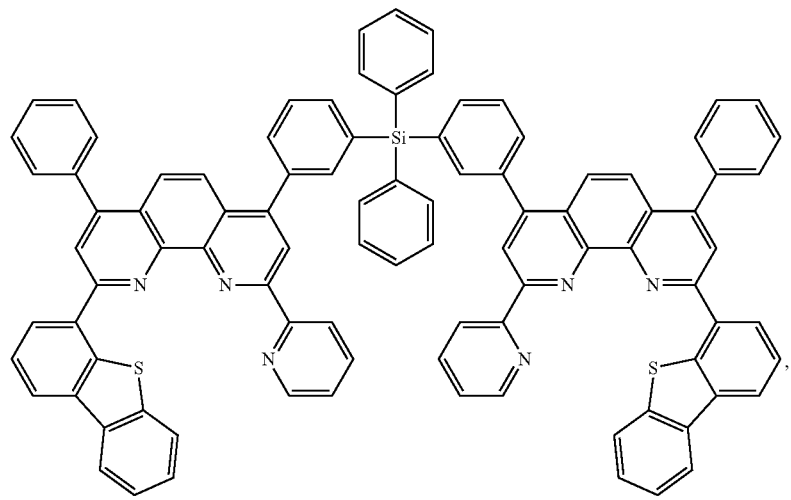
M25
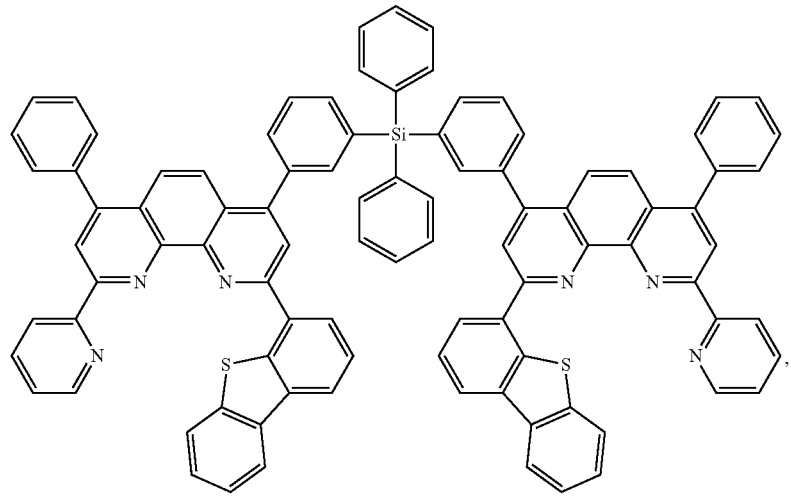
M26
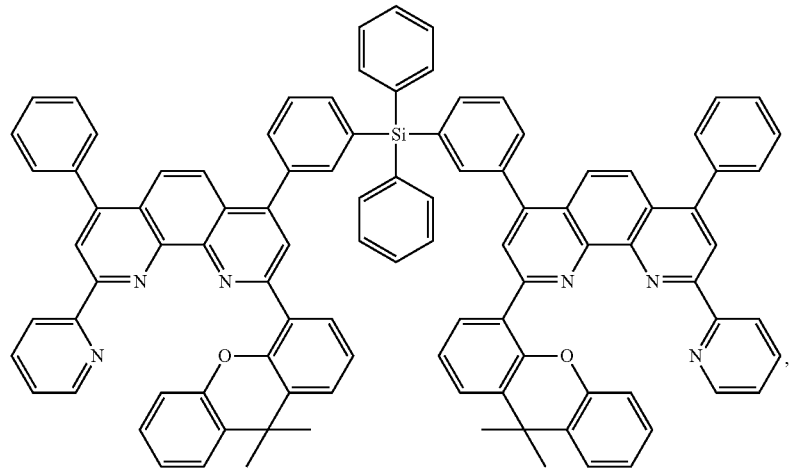
M27

-continued
M28
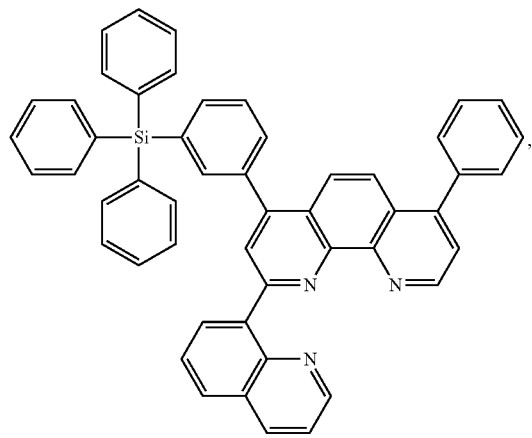
M29
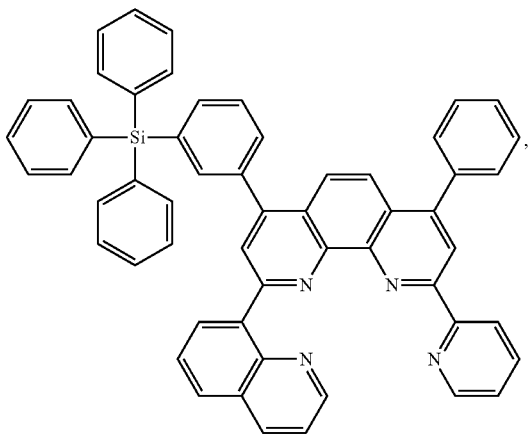
M30
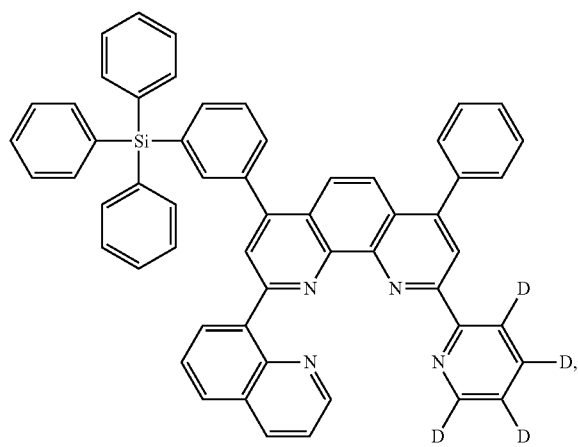
M31
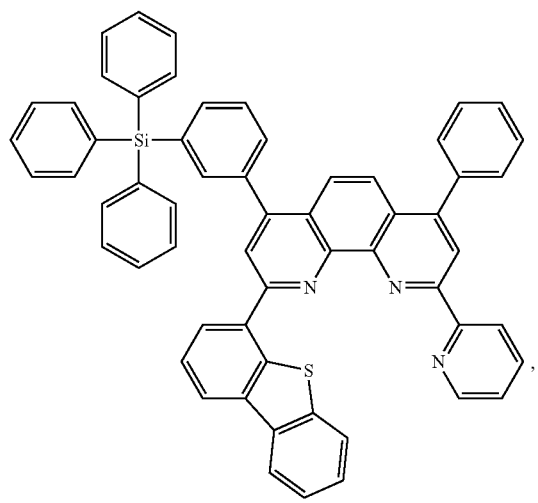
M32
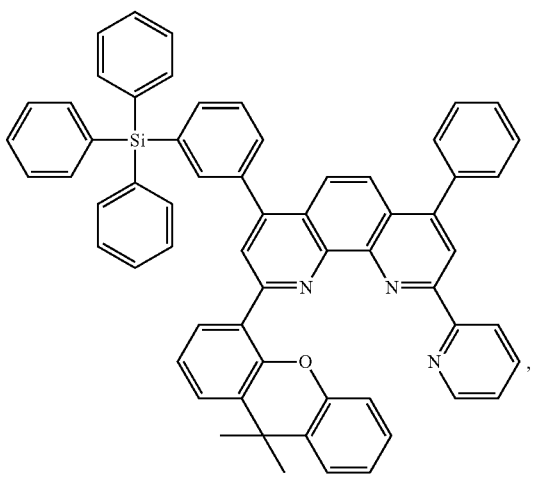

M33
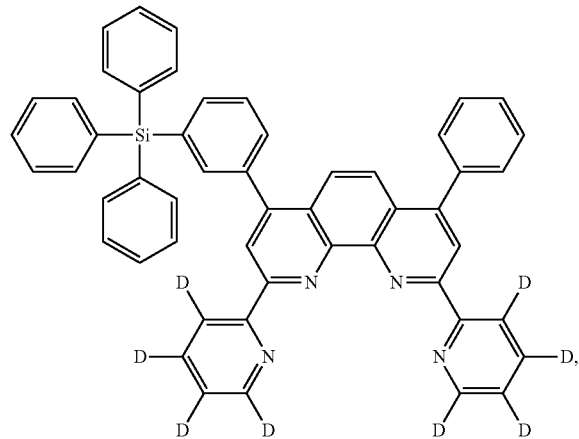
M34
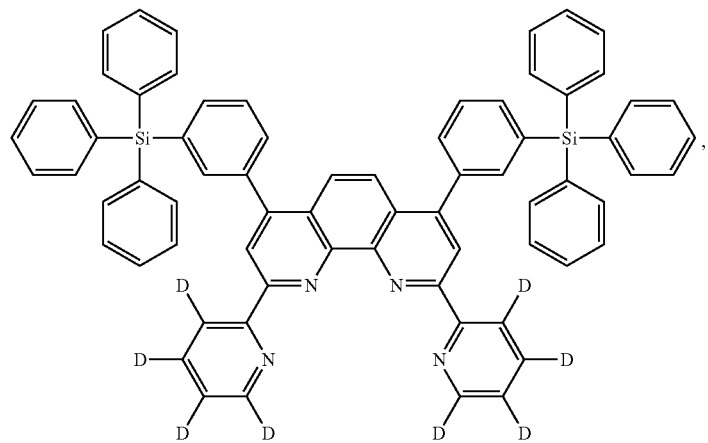
M35
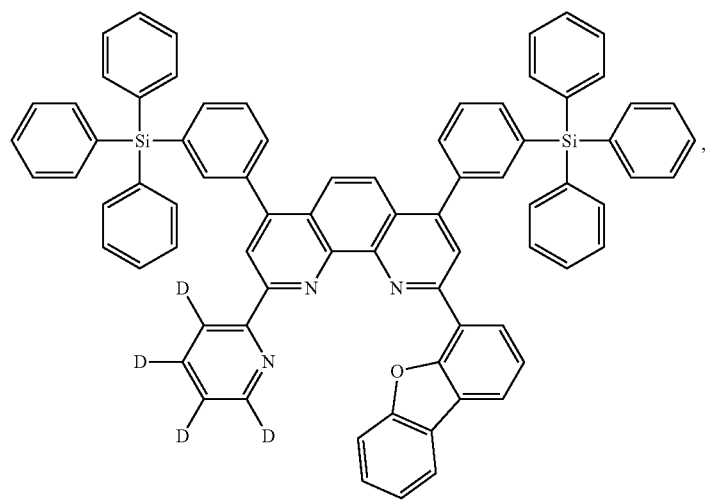

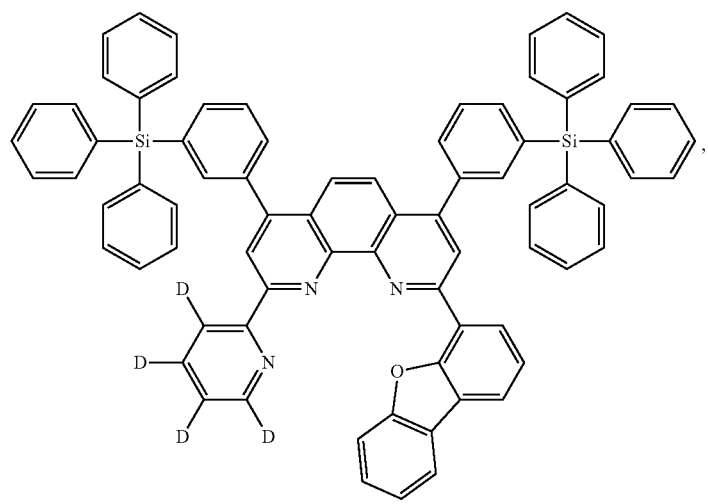
M36
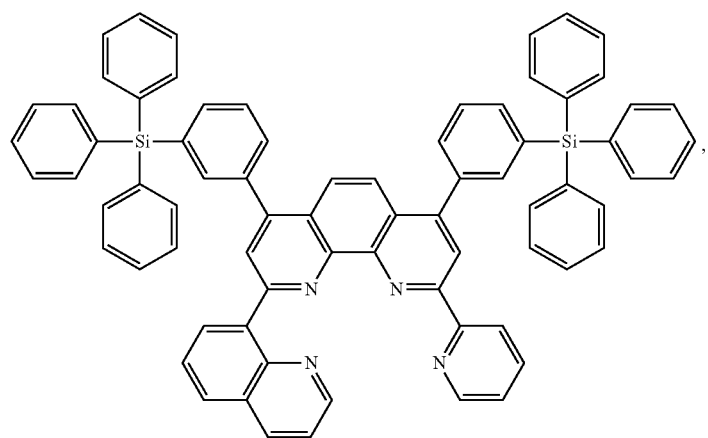
M37
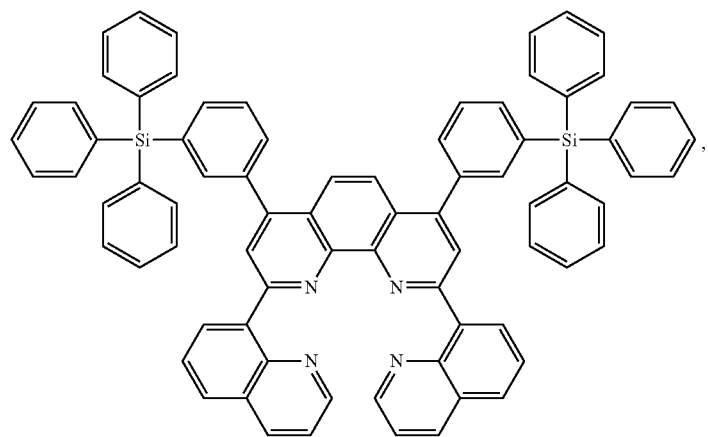
M38

M39

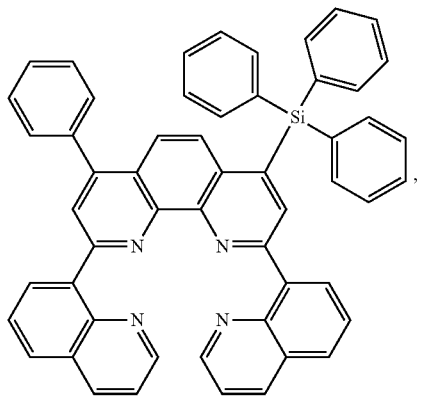

M40

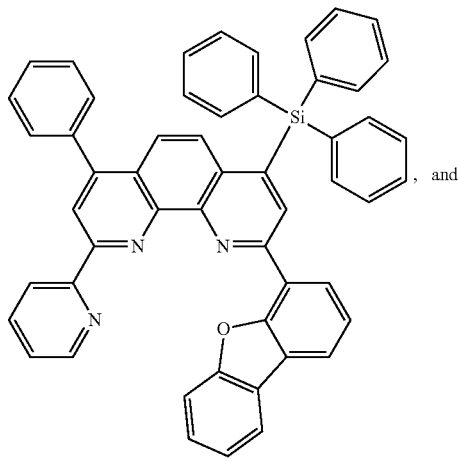
, and

M41

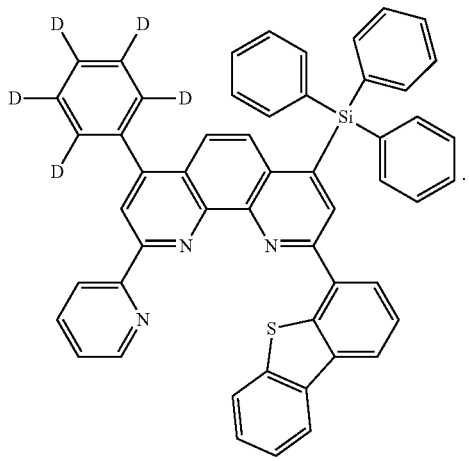
.

14. An electron transport material, wherein, the electron transport material comprises the organic compound according to claim 1.

15. The electron transport material according to claim 14, wherein, the electron transport material is an electron transport material containing a metal; and the metal is selected from any one or a combination of at least two of an alkali metal, an alkali metal compound, an alkaline earth metal, an alkaline earth metal compound, a transition metal, a transition metal compound, a rare earth metal, and a rare earth metal compound.

16. A display panel, the display panel may be used as a display device, wherein, the display panel comprises an OLED device, the OLED device comprises an anode, a cathode, and an organic thin film layer between the anode and the cathode, and the organic thin film layer comprises an electron transport layer;

the material of the electron transport layer includes the electron transport material according to claim 14.

17. The display panel according to claim 16, wherein, the organic thin film layer further comprises an electron injection layer; material of the electron injection layer includes the electron transport material according to claim 14.

* * * * *